US006861373B2

(12) United States Patent
Aoki et al.

(10) Patent No.: US 6,861,373 B2
(45) Date of Patent: Mar. 1, 2005

(54) VACUUM PROCESSING METHOD AND SEMICONDUCTOR DEVICE MANUFACTURING METHOD IN WHICH HIGH-FREQUENCY POWERS HAVING MUTUALLY DIFFERENT FREQUENCIES ARE APPLIED TO AT LEAST ONE ELECTRODE

(75) Inventors: Makoto Aoki, Shizuoka (JP);
Toshiyasu Shirasuna, Shizuoka (JP);
Hiroaki Niino, Shizuoka (JP);
Kazuyoshi Akiyama, Shizuoka (JP);
Hitoshi Murayama, Shizuoka (JP);
Shinji Tsuchida, Shizuoka (JP);
Daisuke Tazawa, Shizuoka (JP);
Yukihiro Abe, Shizuoka (JP)

(73) Assignee: Canon Kabushiki Kaisha, Tokyo (JP)

( * ) Notice: Subject to any disclaimer, the term of this patent is extended or adjusted under 35 U.S.C. 154(b) by 13 days.

(21) Appl. No.: 10/011,776

(22) Filed: Dec. 11, 2001

(65) Prior Publication Data

US 2003/0049558 A1 Mar. 13, 2003

(30) Foreign Application Priority Data

Dec. 12, 2000 (JP) .................................. 2000-377338
Jan. 25, 2001 (JP) .................................. 2001-017011
Jul. 11, 2001 (JP) .................................. 2001-210932
Nov. 27, 2001 (JP) .................................. 2001-360908

(51) Int. Cl.⁷ .............................. H05H 1/46; G03G 5/00
(52) U.S. Cl. ....................... 438/761; 427/569; 430/128
(58) Field of Search .............................. 438/680, 761, 438/763; 430/56, 128; 118/715; 427/569

(56) References Cited

U.S. PATENT DOCUMENTS 4,539,068 A    9/1985  Takagi et al. ............... 156/614
4,579,618 A    4/1986  Celestino et al. ........... 156/345
5,534,070 A    7/1996  Okamura et al. .......... 118/723 E
5,882,424 A *  3/1999  Taylor et al. ................. 134/1.1
5,891,252 A    4/1999  Yokogawa et al. ... 118/723 AN
6,089,181 A *  7/2000  Suemasa et al. ......... 118/723 E
6,642,149 B2 * 11/2003 Suemasa et al. ............ 438/710
6,696,108 B2 *  2/2004 Murayama et al. ......... 427/569

FOREIGN PATENT DOCUMENTS

| EP | 0 149 089 | 7/1985 | |
| JP | 56-45760 | 4/1981 | |
| JP | 60-160620 | 8/1985 | |
| JP | 62-188783 | 8/1987 | |
| JP | 6-287760 | 10/1994 | |
| JP | 7-74159 | 3/1995 | |
| JP | 7-321105 | 12/1995 | |
| JP | 9-321031 | 12/1997 | |
| JP | 2000223480 A * | 8/2000 | ....... H01L/21/3065 |

OTHER PUBLICATIONS

H. Curtins, et al.,"Influence of Plasma Excitation Frequency for α–Si:H Thin Film Deposition," *Plasma Chemistry and Plasma Processing*, vol. 7, No. 3, 1987. Pp. 267–273.

* cited by examiner

*Primary Examiner*—Carl Whitehead, Jr.
*Assistant Examiner*—Stephen W. Smoot
(74) *Attorney, Agent, or Firm*—Fitzpatrick, Cella, Harper & Scinto

(57) ABSTRACT

A vacuum processing method that includes placing an article to be processed in a reaction container and simultaneously supplying at least two high-frequency powers having mutually different frequencies to at least one high-frequency electrode to generate plasma in the reaction container by the high-frequency powers introduced into the reaction container from the high-frequency electrode(s), thereby processing the article. The frequencies and power values of the at least two high-frequency powers supplied satisfy required relationships.

21 Claims, 12 Drawing Sheets

VACUUM PROCESSING METHOD AND SEMICONDUCTOR DEVICE MANUFACTURING METHOD IN WHICH HIGH-FREQUENCY POWERS HAVING MUTUALLY DIFFERENT FREQUENCIES ARE APPLIED TO AT LEAST ONE ELECTRODE

BACKGROUND OF THE INVENTION

1. Field of the Invention

The present invention relates to a vacuum processing method, a vacuum processing apparatus, a semiconductor device, using a high frequency power, which is used for forming a deposited film, etching, and so on, in semiconductor device, electrophotographic photosensitive members, image input line sensors, photographic devices, photovoltaic devices, and so on.

2. Related Background Art

As for a vacuum processing method used when creating semiconductor devices, electrophotographic photosensitive members, image input line sensors, photographing devices, photovoltaic devices, other various electronic elements, optical elements, and so on, many methods such as a vacuum evaporation method, a sputtering method, an ion plating method, a thermal CVD method, a photo-chemical vapor deposition method and a plasma CVD method are known, and apparatuses therefor are put into practice. Among others, a plasma process using a high-frequency power has various advantages, that is, its discharge is highly stable, it can be used for formation of deposited films using various materials and etching, and it an also be used for formation of insulating materials of oxide films and nitrided films, for instance. As a suitable use of the plasma process, formation of hydrogenated amorphous silicon deposited films for electrophotography, and so on, can be named for instance, and commercialization of this plasma process is rapidly underway today with various apparatuses for that purpose also proposed.

In addition, various attempts to make a variety of improvements are further made by changing the method of supplying this high-frequency power.

For instance, Japanese Patent Application Laid-Open No. 56-45760 discloses a technology wherein a plurality of power supplies of different frequencies (13.56 MHz and 400 kHz just as an example) are applied as the power supplies for exciting a reaction gas to the same electrode to excite the reaction gas so as to form a deposited film on a substrate to be processed.

In addition, Japanese Patent Application Laid-Open No. 60-160620 (corresponding to EP 0149089) discloses a plasma reactor apparatus having a constitution for supplying the high-frequency power of 10 MHz or more and the high-frequency power of 1 MHz or less (13.56 MHz and 100 kHz just as an example) to the same electrode.

Furthermore, Japanese Patent Application Laid-Open No. 62-188783 discloses a method for manufacturing an electrostatic latent image holding member, whereby a modulation frequency power having a low-frequency AC power (20 Hz to 1 MHz) and a high-frequency AC power (1 MHz to 100 GHz) superimposed is supplied to the electrode so as to speed up film formation by no longer requiring a heater and superpose an amorphous semiconductor layer on the substrate.

On the other hand, in recent years, there is a report on the plasma CVD method using the high-frequency power supply of a higher frequency (Plasma Chemistry and Plasma Processing, Vol. 7, No. 3, (1987), pp. 267 to 273), which is receiving attention in showing a possibility of improving a deposition rate without reducing performance of the deposited film by rendering a discharge frequency higher than the conventional 13.56 MHz. It is expected that this method will allow cost reduction and higher quality of products to be simultaneously accomplished.

For instance, Japanese Patent Application Laid-Open No. 6-287760 (corresponding to U.S. Pat. No. 5,534,070) discloses an apparatus and a method for performing the plasma CVD using the frequency of a VHF band of which frequencies are from 30 MHz to 300 MHz or less, useable for formation of an amorphous silicon light-receiving member for electrophotography.

Moreover, as an example of a combination of the above-mentioned method of using the two types of the high-frequency powers and the method of applying the high-frequency power of a higher frequency, Japanese Patent Application Laid-Open No. 7-074159 discloses the technology wherein, in a plasma processing method for cleaning the substrate, the high-frequency power of a relatively high frequency and the high-frequency power of a relatively low frequency (high-frequency powers of 60 MHz and 400 kHz just as an example) are supplied to the electrode for mounting the substrate, and a power value of the power of the relatively low frequency is changed so as to control a self-bias voltage for determining collision energy of a plus ion.

In addition, Japanese Patent Application Laid-Open No. 7-321105 discloses the technology wherein, in the method for manufacturing a semiconductor device, the power supply for supplying the high-frequency power of a relatively high frequency in the range of 10 MHz to 1 GHz (high-frequency power of 13.56 MHz just as an example) and the power supply for supplying the high-frequency power of a relatively low frequency in the range of 300 kHz to 500 kHz (high-frequency power of 400 kHz just as an example) are used to form a layer insulation film.

Moreover, Japanese Patent Application Laid-Open No. 9-321031 (corresponding to U.S. Pat. No. 5,891,252) discloses a plasma processing apparatus having a constitution for simultaneously applying a first high-frequency power of a UHF band (300 MHz to 1 GHz) and a second high-frequency power that is different therefrom by twice or more.

The conventional methods and apparatuses as mentioned above allow good deposited film formation, that is, good vacuum processing to be performed. However, the level of the market demand for such products made using the vacuum processing is becoming higher day after day, and so the vacuum processing method, vacuum processing apparatus, semiconductor device and manufacturing method thereof capable of implementing higher quality and cost reduction are required in order to meet this demand.

For instance, in the case of an electrophotographic apparatus, the demands for an improved copying speed, a higher image quality and lower prices are very strong, and in order to implement these, it is essential to improve the characteristics of the photosensitive member, that is, to be more specific, chargeability, sensitivity, and so on, to suppress image defects appearing as white dots or black dots on the image that are caused by a faulty structure inside the photosensitive member and to reduce the production costs for the photosensitive member. In addition, as for digital electrophotographic apparatuses and color electrophotographic apparatuses that are remarkably widespread in recent years, it is required mores strongly than before, as they are often used to copy photos, pictures and design drawings in addition to writings, to form a film of a large area of which film thickness and film quality are both uniform in order to reduce a photomemory of the photosensitive member and also to reduce image density unevenness.

While optimization of a deposited film lamination constitution and so on are conducted aiming at improvement in such photosensitive member characteristics and reduction of photosensitive member production costs, improvement in the aspect of the vacuum processing method is also strongly desired at the same time.

In these circumstances, the present status is that there is still room left for improvement as to enhancement in vacuum processing characteristics and reduction of the vacuum processing costs in the aforementioned conventional vacuum processing method and semiconductor device manufacturing method.

As already mentioned, it is possible to accomplish improvement in the vacuum processing speed and improvement in the vacuum processing characteristics by using the high-frequency power of the frequency in the VHF band or in the vicinity thereof to generate plasma and to perform the vacuum processing, and earnest research is conducted for that purpose. In the case of using the high-frequency power in such a frequency band, however, a wavelength of the high-frequency power in a reaction container becomes as long as the reaction container, a high-frequency electrode, a substrate or a substrate holder, and so on, and so the high-frequency power is apt to form a standing wave in the reaction container. This standing wave causes the power to be strong or weak at each location in the reaction container, thus, leading to different plasma characteristics. Consequently, it was difficult to render the vacuum processing characteristics further uniform in a broad range.

In addition, in the case of the device having a thick film thickness such as the electrophotographic photosensitive member, there were cases where the state of the plasma changes as the film was deposited so that distribution of characteristics in an in-plane direction of the substrate became different in the film thickness direction resulting in nonuniformity of the film quality or change of the film quality itself in the thickness direction.

Such nonuniformity is a serious problem in the case of forming a crystalline or non-single crystalline functional deposited film used not only for the electrophotographic photosensitive member but also for the photovoltaic devices, image input line sensors, imaging devices and so on. In addition, the same processing unevenness will arise in plasma processing processes such as dry etching and sputtering in the case of rendering the discharge frequency higher, which will become a serious problem in practice if it remains as it is.

Although various improvements have been made in the electrode's shape, the form of applying the high-frequency power and so on in order to reduce such processing unevenness and render the uniformity higher, it has been by no means easy to maintain compatibility between the uniformity of the film thickness and that of the film quality and to acquire the deposited film having good film quality while maintaining the uniformity of the film thickness.

In particular, in the case of making an attempt to acquire the uniformity by a structural improvement in the electrode's shape and so on, as to a lamination device having a plurality of layer areas, a method that is effective in a specific layer area may not be sufficiently effective in another layer area, and so a handy and effective method for maintaining the uniformity in the case of the device having a plurality of layer areas made under different layer forming conditions has been sought.

As means for solving such problems, it is thinkable to simultaneously supply a plurality of the high-frequency powers of different frequencies in the reaction container. While a plurality of standing waves of different wavelengths according to the respective frequencies are thereby formed in the reaction container, the plurality of standing waves are synthesized since they are simultaneously supplied and no definite standing wave is formed as a consequence. Based on this idea, the effect of suppressing the standing waves can be obtained with different frequencies of a plurality of high-frequency powers irrespective of their values. For instance, it is thinkable that use of the technology disclosed by Japanese Patent Application Laid-Open No. 60-160620 will suppress the standing waves of the high-frequency powers in the reaction container so as to improve the uniformity of the vacuum processing.

However, as a result of conducting an experiment on the uniformity of the vacuum processing characteristics by using the technology disclosed by Japanese Patent Application Laid-Open No. 60-160620, the inventors hereof could certainly improve the uniformity to a certain level but could not acquire the uniformity level that is required in recent years. To be more specific, it became evident that, even by using a power supply method that is rendered uniform in terms of field strength, the nonuniformity remains to a certain extent in the actual vacuum processing.

SUMMARY OF THE INVENTION

An object of the present invention is to provide a vacuum processing method and a vacuum processing apparatus wherein improvement in a vacuum processing speed and improvement in vacuum processing characteristics are accomplished, and in addition, uniformity of the vacuum processing characteristics is rendered at a very high-level and vacuum processing costs can be reduced.

Another object of the present invention is to provide a semiconductor having good characteristics of which film thickness and film quality are both uniform on a surface of and in any direction of a substrate and also to provide a manufacturing method thereof.

According to an aspect of the present invention, there is provided a vacuum processing method comprising placing an article to be processed in a reaction container and simultaneously supplying at least two high-frequency powers having mutually different frequencies to the same high-frequency electrode to have plasma generated in said reaction container by the high-frequency powers introduced into said reaction container from the high-frequency electrode, thereby processing said article, wherein, when the frequency of one of the at least two high-frequency powers to be supplied to said high-frequency electrode is f1 and its power value is P1, and the frequency of the other high-frequency power is f2 and its power value is P2, said frequencies f1, f2 and said power values P1, P2 satisfy all the following three conditions (a) to (c):

(a) $250 \text{ MHz} \geq f1 > f2 \geq 10 \text{ MHz}$;

(b) said power values P1 and P2 are the highest and next highest power values of the power values held by the high-frequency powers within the above frequency range (a), of said high-frequency powers supplied to said high-frequency electrode; and (c) $0.9 \geq P2/(P1+P2) \geq 0.1$.

According to another aspect of the present invention, there is provided a method for manufacturing a semiconductor device comprising placing a substrate in a reaction container, and simultaneously supplying at least two high-frequency powers having mutually different frequencies to the same high-frequency electrode to have plasma generated in said reaction container by the high-frequency powers introduced into said reaction container from the high-frequency electrode, thereby forming a plurality of layers on the substrate, wherein, when a frequency of one of the at least two high-frequency powers to be supplied to said high-frequency electrode is f1 and its power value is P1, and the frequency of the other high-frequency power is f2 and its power value is P2, said frequencies f1, f2 and said power values P1, P2 satisfy all the following three conditions (a) to (c):

(a) $250 \text{ MHz} \geq f1 > f2 \geq 10 \text{ MHz}$;

(b) said power values P1 and P2 are the highest and next highest power values of the power values held by the high-frequency powers within the above frequency range (a), of said high-frequency powers supplied to said high-frequency electrode; and (c) $0.9 \geq P2/(P1+P2) \geq 0.1$.

According to a further aspect of the present invention, there is provided a semiconductor device comprising a plurality of layers on a substrate, said plurality of layers being formed by placing the substrate in a reaction container and simultaneously supplying at least two high-frequency powers having mutually different frequencies to the same high-frequency electrode to have plasma generated in said reaction container by the high-frequency powers introduced into said reaction container from the high-frequency electrode, wherein, when the frequency of one of the latest two high-frequency powers to be supplied to said high-frequency electrode is f1 and its power value is P1, and the frequency of the other high-frequency power is f2 and its power value is P2, said plurality of layers formed with said frequencies f1, f2 and said power values P1, P2 satisfy all the following three conditions (a) to (c):

(a) $250 \text{ MHz} \geq f1 > f2 \geq 10 \text{ MHz}$;

(b) said power values P1 and P2 are the highest and next highest power values of the power values held by the high-frequency powers within the above frequency range (a), of said high-frequency powers supplied to said high-frequency electrode; and (c) $0.9 \geq P2/(P1+P2) \geq 0.1$.

According to still another aspect of the present invention, there is provided a vacuum processing method comprising placing an article to be processed in a reaction container and simultaneously supplying at least two high-frequency powers having mutually different frequencies to the same high-frequency electrode to have plasma generated in said reaction container by the high-frequency powers introduced into said reaction container from the high-frequency electrode, thereby processing said article, wherein the method includes a step of synthesizing the high-frequency powers to be supplied to said electrode and a step of branching said synthesized high-frequency powers to apply them to a plurality of said electrodes, respectively.

According to a still further aspect of the present invention, there is provided a vacuum processing apparatus comprising a reaction container capable of being evacuated and a means for supporting an article to be processed disposed in said reaction container, said article being processed by making use of high-frequency powers to generate plasma in said reaction container, wherein the apparatus has:

at least one high-frequency power supplying means for supplying at least two high-frequency powers having mutually different frequencies;

an impedance matching means for adjusting impedances of transmission routes of said high-frequency powers;

a synthesis means for synthesizing said high-frequency powers having mutually different frequencies;

a branching means for branching the high-frequency powers synthesized by said synthesis means; and a plurality of high-frequency electrodes to which the high-frequency powers branched by said branching means are applied.

BRIEF DESCRIPTION OF THE DRAWINGS

FIG. 14B is a cross-sectional view of the apparatus taken along the line 14B—14B shown in FIG. 14A; FIG. 15B is a cross-sectional view of the apparatus taken along the line 15B—15B shown in FIG. 15A.

DETAILED DESCRIPTION OF THE EMBODIMENTS

Figure 1A:
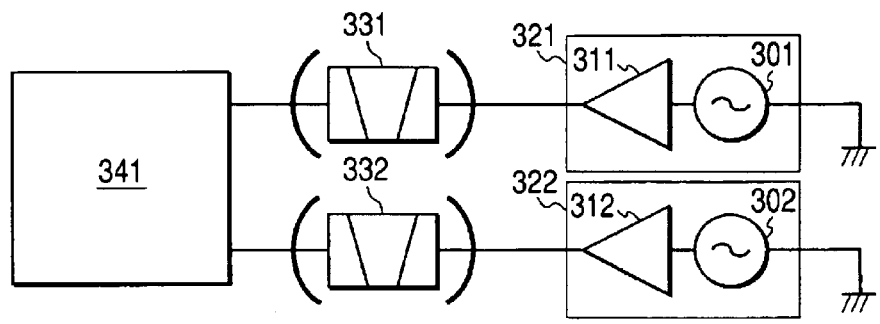
FIGS. 1A, 1B and 1C are block diagrams showing a high-frequency power supply applicable to a vacuum processing method of the present invention.

As a result of earnestly reviewing the aforementioned problems in the conventional apparatuses and methods, the inventors have found out that, in a VHF band and high frequencies in the neighborhood thereof, plasma distribution is sensitive to an electrode size and a discharge condition, and a wavelength of a high frequency power in a reaction container becomes approximately as long as the reaction container, a high-frequency electrode, a substrate or a substrate holder, and so influence of a standing wave appears and distribution of plasma characteristics is apt to become no longer uniform resulting in occurrence of processing unevenness.

Moreover, in the case of generating the plasma by using the high frequency of the VHF band, the problem of a surface impedance of the electrode arising from a skin effect also becomes conspicuous. To be more specific, if the frequency becomes high as in the VHF band, a high-frequency current only flows near a conductor surface so that the Joule loss on the electrode surface increases resulting in lower power efficiency and occurrence of the problem of nonuniformity of plasma density due to a difference in lengths of propagation routes. Furthermore, as the surface impedance of the electrode is sensitive to roughness and contamination of the electrode surface, it is difficult to attain the uniform surface impedance. And it was found out that the above nonuniformity of plasma density causes the non-uniformity of surface processing.

As a result of conducting further review to solve the aforementioned problems and to attain the above objects, the inventors hereof have found out that the effects of rendering vacuum processing uniform are remarkably changed by supplying a plurality of high-frequency powers of different frequencies to the same electrode and changing the relation between those frequencies and power values. And they have found out that, by making those frequencies and power values to have values within a predetermined range, it is possible to simultaneously implement improvement in a vacuum processing speed, improvement in vacuum processing characteristics, improvement in uniformity of the vacuum processing characteristics, improvement in stability of the vacuum processing characteristics and reduction of vacuum processing costs, which finding led to completion of the present invention.

According to the vacuum processing method constructed as in the present invention, it is possible, while keeping a high vacuum processing speed, to implement the improvement in the vacuum processing characteristics, the improvement in the stability of the vacuum processing characteristics and the reduction of the vacuum processing costs, and at the same time, to remarkably improve the uniformity of the vacuum processing characteristics.

Although a mechanism allowing the above effects to be remarkably obtained when the frequencies and the power values are within the range of the present invention is not clear at the current stage, it presumably has the following workings.

As previously mentioned, a deposited film of high quality can be formed at a high speed by using the high-frequency power of a higher frequency. In the case of using the high-frequency power of the higher frequency, however, there are the cases where "unevenness" occurs in the quality of the deposited film due to the influence of the standing wave generated thereby. As opposed to this, it is thinkable that occurrence of a "node" in the generated standing wave is suppressed because a portion equivalent to the "node" of the standing wave due to the high-frequency power of one frequency can have an amplitude of the standing wave due to the high-frequency power of the other frequency by superimposing on a first high-frequency power that is a reference a second high-frequency power of a different frequency therefrom.

However, this is applicable to the case of a very simple model, and it is needless to say that complicated phenomena occur in reality. For instance, there are factors such as a stage of plasma, attenuation of electromagnetic waves and reflection on various reflecting surfaces. For that reason, this suppressing effect cannot necessarily be obtained just by superimposing the high-frequency powers of arbitrary frequencies at an arbitrary ratio. To be more specific, the standing wave suppressing effect appears remarkably in the case where the first high-frequency power of a predetermined frequency is combined with the second high-frequency power of a fixed range of frequencies at a predetermined power value ratio. At that time, it is most desirable that the first and second high-frequency powers in particular have frequencies within a frequency range capable of expecting a high deposition rate and also within the frequency range in a relation capable of generating the same active species together, and a balance of those power values is adequately set.

And it is possible, by further superimposing further high-frequency powers having appropriate frequencies and power values, to further enhance the standing wave suppressing effect and to obtain other effects (a bias effect, for instance), as the case may be.

Here, the case of using two high-frequency powers having different frequencies will be described for the purpose of showing the basic idea and workings of the present invention.

It is desirable that the frequency of the high-frequency power should be 10 MHz or more, and preferably 30 MHz or more as the minimum from the viewpoint of improving a deposition rate. On the other hand, it is desirable that the frequency of the high-frequency power should be 250 MHz as the maximum from the viewpoint of effectively obtaining a mutual superimposing effect of the high-frequency powers because, if it is higher than 250 MHz, the attenuation of the power in the traveling direction becomes conspicuous so that a deviation of an attenuation rate from the high-frequency power of different frequency becomes remarkable and sufficient uniformity effects cannot be obtained.

To be more specific, it is desirable to have a constitution wherein the above described frequencies f1 and f2 satisfy the condition:

$$250 \text{ MHz} \geq f1 > f2 \geq 30 \text{ MHz}.$$

In addition, when the power value of the first high-frequency power having the frequency f1 is P1 and that of the second high-frequency power having the frequency f2 is P2, the standing wave suppressing effect becomes low, that is, close to the case of supplying only the first high-frequency power when the ratio of the power value P2 of the second high-frequency power to the total power value (P1+P2) is low. Inversely, if the ratio of the power value P2 becomes too high, the standing wave suppressing effect becomes low likewise, that is, close to the case of supplying only the second high-frequency power. It has been found out from an experimental fact that the standing wave suppressing effect can be remarkably obtained by making the ratio of the power value P2 of the high-frequency power in the total power (P1+P2) 10 percent to 90 percent. Furthermore, it has turned out as a result of the experiment that it is most desirable to make the ratio of the power value P2 in the total power (P1+P2) 20 percent to 70 percent.

To be more specific, it is preferable to have a constitution wherein the above described power values P1 and P2 satisfy the condition:

$$0.7 \geq P2/(P1+P2) \geq 0.2.$$

In addition, as for the ratio between the power values of these two high-frequency powers, it has been found out that, seen from another viewpoint, that is, a viewpoint of stability of the discharge over time, there is a desirable range to be determined by the relation between the frequencies of the two high-frequency powers, which more specifically means that a power ratio, P2/(P1+P2) has an upper limit of its desirable range determined by the value of the frequency ratio (f2/f1). It is possible to obtain a uniform discharge quite stably by setting the power ratio within this range.

The reason for this is presumably as follows.

In the case of the discharge caused by the high-frequency power, a spatial area in which the stable discharge is generated may be different according to the frequency. In the case of suppressing the standing wave by using two high-frequency powers as with the present invention, it is presumably possible to obtain desirable discharge distribution stably in a wide range of power values since the closer the mutual frequencies are, the more similar the entire discharge distribution is. Thus, it is thinkable that the uniform discharge distribution is stably obtained by making the power ratio of the power value P2 of the high-frequency power in the total power (P1+P2), that is, P2/(P1+P2) within the range equal to or lower than the value "f2/f1" determined by the relation between the two frequencies f1 and f2.

To be more specific, it is preferable to have a constitution wherein the above described frequencies f1, f2 and the above described power values P1, P2 satisfy the condition:

$$f2/f1 \geq P2/(P1+P2).$$

Moreover, if the frequencies f1 and f2 are largely different by one digit or more, the method of decomposing material gases may change as the case may be, resulting in different types and ratios of the generated active species. For this reason, there are the cases where, even though uniformity in terms of field strength is implemented, an antinode portion of the standing wave of the first high-frequency power generates active species of the type and ratio according to its frequency generated and the antinode portion of the standing wave of the second high-frequency power generates the active species of the different type and ratio from those of the antinode portion of the standing wave of the first high-frequency power. Consequently, it is thinkable that there are the cases where spatial distribution arises as to the types and ratios of the active species so that nonuniformity in the vacuum processing characteristics occurs in the worst case. As opposed to this, it is presumably possible to decrease such differences in the types and ratios of the generated active species due to frequency differences by maintaining the frequencies f1 and f2 in the relation of f2/f1>0.5. On the other hand, if f1 and f2 are too close, the node and antinode positions of the respective standing waves become close, and so a sufficient electric field standing wave suppressing effect can no longer be obtained. For that reason, it is presumably required to maintain the frequencies f1 and f2 in the relation of $0.9 \geq f2/f1$.

To be more specific, it is desirable to have the constitution wherein the above-described frequencies f1 and f2 satisfy the condition:

$$0.9 \geq f2/f1 > 0.5.$$

In the present invention, it is necessary to perform such introduction of the high-frequency power into a vacuum processing container from the same electrode. In the case of supplying the high-frequency powers of different frequencies from different electrodes respectively, there will arise on each electrode the standing wave of the wavelength dependent on the frequency of the high-frequency power supplied to each electrode. Consequently, the characteristics of the plasma generated in the neighborhood of the electrode have a shape according to this standing wave so that the structure of the film adhered onto the electrode becomes different depending on the position on the electrode since the types and ratios of the generated active species and energy of ions incident on the electrode are different depending on the locations. For this reason, there arises an easily peeled-off portion of the film structure on the electrode, or an area where the film structure locationally changes arises and differences in internal stresses in the area arise so that there will be the easily peeled-off portion of the adhered film and the peeled film will adhere on the article to be processed resulting in formation of defects. To avoid such problems, the present invention is required to supply a plurality of the high-frequency powers of different frequencies to the same electrode. Thus, the standing wave is also suppressed on the electrode, and the above-mentioned problem is effectively suppressed.

While the effects of the present invention are sufficiently obtained by combining the two high-frequency powers as above, it is possible to further combine a third high-frequency power. As for the range of the third high-frequency power, there is no limitation as far as the first and second high-frequency powers are set within the appropriate ranges.

When the frequency of the third high-frequency power is f3 and its power value is P3, the same workings and effects as in the case of combining the first high-frequency power (f1, P1) and the second high-frequency power (f2, P2) can be expected if f3 is within the range of 10 MHz to 250 MHz. At this time, if the one with the highest power value among P1 to P3 is P1 and the one with the next highest value is P2, then P3 is the one with the lowest power value. In this case, mismatching due to the third high-frequency power hardly occurs and the standing wave suppressing effect by the third high-frequency power is added, and so there are the cases where the "unevenness" is suppressed further than the case of combining the first and second high-frequency powers. For that reason, it is desirable to combine the further high-frequency power as described above.

In addition, for instance, it is also feasible to simultaneously supply the power of frequency in several tens of kHz to several hundreds of kHz or so in addition to the high-frequency power within the range of the present invention in order to enhance the bias effect during the vacuum processing. Thus, when supplying the further power, it should be the power to the extent of not spoiling the uniformity of the vacuum processing characteristics when added.

Furthermore, in the present invention, the above-described electrode may be formed in a rod-like shape. In the case wherein the shape of the electrode is the rod-like shape capable of being handled substantially as one dimension, it is possible to acquire the effects of the present invention more remarkably since the power is not substantially diffracted laterally to the direction of travel so that no secondary standing wave occurs due to the lateral diffraction of the power.

Moreover, in the present invention, the above-described article to be processed may be formed in a cylindrical or columnar shape. In the case wherein the article to be processed is formed in a cylindrical or columnar shape, reflection ends of the high-frequency power on the article to be processed are limited to both ends thereof. For that reason, the distribution of the standing waves becomes relatively simple compared with the case where many standing waves occur due to many reflection ends, so that it is possible to acquire the effects of the present invention further remarkably.

Furthermore, according to the present invention, it is possible to acquire remarkable effects especially in the case of forming a deposited film on the surface of the above-described article to be processed. According to the present invention, as the electrical field distribution in the entire areas in the reaction container including those on the electrodes is rendered uniform, local changes of the film structure is effectively suppressed in the entire areas of the parts where film adhesion is caused. For instance, if there is electrical field unevenness, it may happen that the film structure changes in the uneven portion and the internal stresses in the portion change to induce peeling. However, it becomes possible, by the method of the present invention, to effectively suppress the film peeling and reduce a structural fault on the article to be processed caused by adhesion of the peeled dust thereon. Accordingly, the yield is improved and cost reduction becomes possible. The effect of suppressing the structural fault is especially significant in a deposited film application field that requires a large area.

Moreover, the present invention is more effective in the case of forming a deposited film for electrophotographic photosensitive members on the surface of the above-described article to be processed. To form the electrophotographic photosensitive members, it is necessary to form a deposited film of a large area, and it is further necessary that no structural fault exists in the entire area thereof. On the other hand, as formation of the deposited film having a thickness of several tens of $\mu$m is generally performed in formation of the electrophotographic photosensitive members, the film adhesion on the wall the reaction container occurs in a large amount and the film adhered to the wall is apt to be peeled. Furthermore, it is not possible for the electrophotographic photosensitive members, in the case wherein the structural fault occurs, to handle only the portion in which the fault exists as faulty and handle other areas as conforming as other devices do, so that the whole of the deposited film formed over the large area becomes faulty. For this reason, an occurrence of the structural fault influences the costs very significantly in the formation of the deposited film for the electrophotographic photosensitive members, and so it is very effective for reducing the production costs to effectively suppress the structural fault by applying the present invention.

Furthermore, in the case of the device wherein the deposited film of which the film thickness is thick is formed such as the electrophotographic photosensitive member, an optimum condition for keeping the uniformity of the plasma changes as the processing processes due to the factors such as formation of a deposited film on the substrate and deposition of the film on inner walls of the reaction container and on the surface of the electrode, so that state of the distribution of the characteristics in the in-plane direction of the substrate may be different according to the direction of thickness thereof as the film is deposited.

And in the case of the lamination device having a plurality of layer areas formed, as a function required for each layer area is different, each layer area has a different composition so that the optimum condition of the power ratio of high-frequency power to achieve both the uniformity and good film quality may be different in each layer area.

Therefore, it is possible to deal with the change of the optimum power ratio due to the progress of the plasma processing and to obtain the uniformity of the film quality in the film thickness direction by, as in the present invention, changing the power ratio of the high-frequency powers to be supplied and adjusting the distribution of the high-frequency power propagating on the electrode surface. In addition, it is possible to attain the uniform film quality since the present invention can deal with even the case where the films to be deposited have different compositions.

In addition, while the constitution of the present invention has a remarkable effect not only on the electrophotographic photosensitive member but also on a large-size substrate such as the one for a photovoltaic element, it has a remarkable effect in the case where, even if the substrate is not large, a high frequency of the wavelength that is relatively short compared to the size of the high-frequency electrode is used.

The present invention is also applicable to formation of the thin film comprised of a-Si or a-SiC materials and other materials, etching of polysilicon and so on, and surface modification such as surface oxidation and surface nitriding and so on. For instance, in the case of applying the method of the present invention to the etching, uniform etching processing progresses with the uniform plasma, and so the etching of good quality without shaving the foundation material or leaving the material to be etched becomes possible.

Moreover, in order to form the deposited film uniformly and efficiently, it is thinkable to increase a flow rate of the material gases and increase the high-frequency power to be supplied to the high-frequency electrode. In such cases, however, the normal discharge may not be maintained depending on the frequency. Therefore, it is possible, by synthesizing once a plurality of high-frequency powers of different frequencies and then branching them to apply them to a plurality of plasma generation electrodes as in the present invention, to increase the total power value introduced into the reaction container even if the power value applied to each plasma generation electrode is approximately the value for maintaining the normal discharge. It becomes thereby possible, to further improve the deposited film formation speed and the film quality in a state of maintaining the sufficient standing wave suppressing effect.

In addition, the present invention is desirable since it is possible to obtain a more remarkable standing wave suppressing effect by branching the high-frequency powers and then applying them to a plurality of plasma generation high-frequency electrodes via an auxiliary matching circuit for adjusting the impedance of the transmission route of each high-frequency power disposed on a feeding side of each of the plurality of plasma generation high-frequency electrodes. While the cause thereof is not certain, it is presumably for the following reason on the whole.

In the case of synthesizing once the plurality of high-frequency powers of different frequencies and then dividing and applying them to the plurality of electrodes, it is thinkable that the transmission route between a junction of the high-frequency powers and each electrode inevitably becomes longer and the attenuation of the high-frequency power due to an L component during that time becomes more significant. Consequently, it is thinkable that there are the cases where the influence of the deviation of the attenuation rate becomes remarkable since the attenuation rate of the high-frequency power is different according to the frequency, not allowing a sufficient standing wave suppressing effect to be obtained. It is presumably possible, however, to cancel the L component by disposing the auxiliary matching circuit on each feeding point side of the high-frequency power, so that a more remarkable standing wave suppressing effect can be obtained.

Moreover, as for the auxiliary matching circuit to be used for the present invention, an impedance-variable LC circuit can be used while performing phase adjustment as appropriate, or a capacitor of a fixed capacity can also be used. It is desirable, however, to use the constitution wherein only the capacitor of a fixed capacity is disposed considering it from the viewpoint of the apparatus operability and costs.

In addition, according to the present invention, it is possible to obtain a more remarkable effect by disposing the plurality of plasma generation high-frequency electrodes on the same circumference. The reason is presumably that, as a distance from the junction of the high-frequency powers to each high-frequency electrode can be rendered as equal as possible by disposing the plasma generation high-frequency electrodes on the same circumference, the effect of the present invention such as branching the powers not by leaning to a specific electrode and increasing the total power without generating an abnormal discharge can be rendered remarkable.

Moreover, it is preferable, with a view to rendering contribution of each electrode to plasma uniform, that the reaction container is cylindrical and each of the plasma generation high-frequency electrodes is equidistantly disposed on the same circumference with the same central axis as the reaction container.

In addition, according to the present invention, it is possible to obtain a more remarkable effect by placing the plurality of plasma generation high-frequency electrodes outside the reaction container at least a part of which is comprised of a dielectric material. While the cause thereof is not certain, it is presumably for the following reason.

In the case where there are the plurality of plasma generation high-frequency electrodes in the reaction container, there inevitably exist conductive members, in a vacuum processing space of a certain electrode, such as other electrodes and the reaction container outer walls to be earth shields in addition to the substrate. For that reason, it is thinkable that, in the case of applying the plurality of high-frequency powers of different frequencies to the electrode, the plasma spreads differently in the reaction container due to the different frequencies of the high-frequency powers so that spatial unevenness may arise to the plasma. Thus, it is thinkable that the sufficient standing wave suppressing effect cannot be obtained. It is presumably possible, however, to decrease the conductive members in the vacuum processing space by as many as possible by placing the high-frequency electrodes outside the reaction container, and consequently to obtain the remarkable effect without causing any spatial unevenness of the plasma.

Moreover, according to the present invention, it is possible to place a plurality of substrate supporting means in the aspect of productivity. In the case of placing the plurality of substrate supporting means, however, it is possible to obtain a more remarkable effect by rendering the reaction container cylindrical and having each plasma generation high-frequency electrode and each substrate supporting means equidistantly disposed on the same circumference with the same central axis as the reaction container respectively. This is presumably because the same standing wave suppressing effect can be obtained on each substrate supporting means by rendering a positional relation among the substrate supporting means, the reaction container and the plasma generation high-frequency electrode as symmetrical as possible.

In addition, according to the present invention, as the electric field distribution in the entire areas in the reaction container including those on the electrodes is rendered uniform, it is no longer necessary to adopt an approach of having the material gases distributed to compensate for the nonuniformity of the electric field distribution in the reaction container as in the conventional techniques, so that it is possible to decrease the number of material gas introducing means to a minimum. Accordingly, it is preferable that the number of the means for introducing the gases into the reaction container should be one in consideration of the apparatus costs and operability. In the case of having just one gas introducing means, however, it is preferable to dispose the gas introducing means at the center of the reaction container since a more remarkable effect of the present invention can be obtained by rendering the positional relation among the gas distribution in the reaction container, the substrate supporting means, the reaction container and the plasma generation high-frequency electrode as symmetrical as possible.

Next, embodiments of the present invention will be described by referring to the drawings.

Figure 1B:
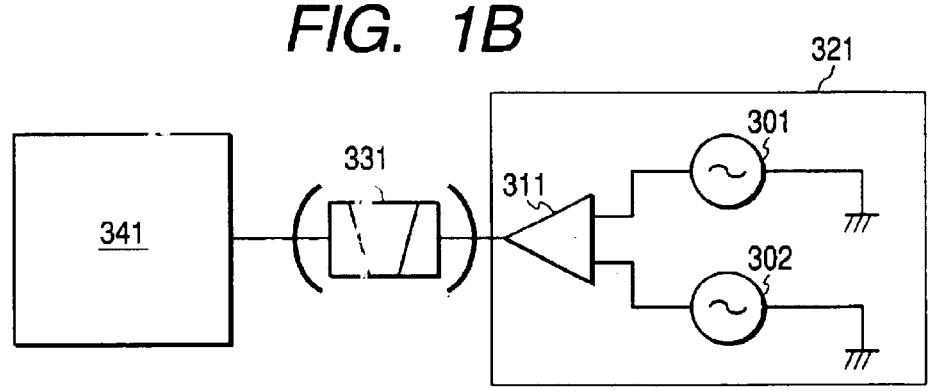
Figure 1C:
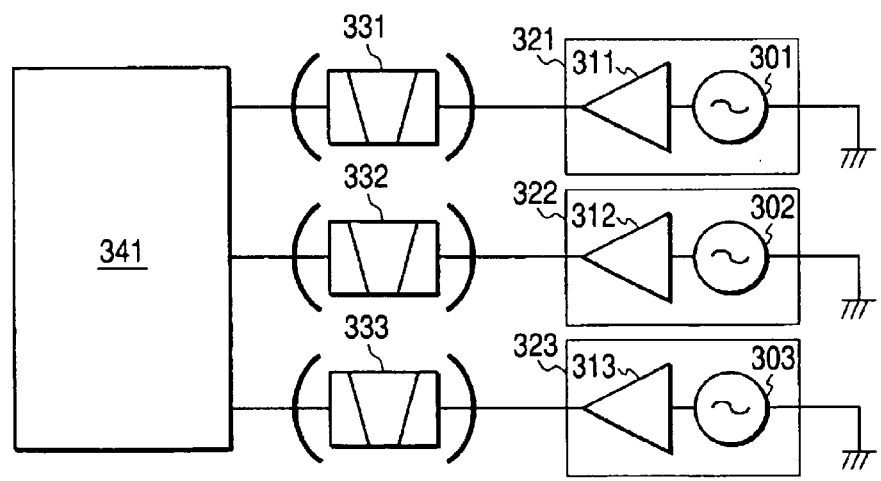

FIGS. 1A, 1B and 1C are block diagrams showing the high-frequency power supply applicable to the vacuum processing method of the present invention.

The high-frequency power supply used in the present invention supplies two high-frequency powers of different frequencies, and it can have the constitution shown in FIG. 1A for instance.

In the example shown in FIG. 1A, a first high-frequency power supply 321 is comprised of a signal generator 301 and an amplifier 311. In addition, a second high-frequency power supply 322 is comprised of a signal generator 302 and an amplifier 312 likewise. These high-frequency power supplies 321 and 322 are connected to a matching box 341. The matching box 341 may have the constitution having different matching circuits to individually match the high-frequency powers supplied from these high-frequency power supplies, or the matching circuit may be placed after synthesizing them. It is also feasible to place filters 331 and 332 between the high-frequency power supplies 321, 322 and the matching box 341 respectively in order to prevent diffraction of the high-frequency power from the other power supply to each power supply. Low-pass filters, high-pass filters or band-pass filters may be used for filters 331 and 332 according to the relation of the power supply frequencies.

Moreover, it may have the constitution shown in FIG. 1B as another constitution.

In the example shown in FIG. 1B, the high-frequency power supply 321 has the constitution wherein it is possible to obtain a synthetic wave having superimposed two high-frequency powers in advance by synthesizing and amplifying the signal generator 301 for generating the first high-frequency power and the signal generator 302 for generating the second high-frequency power in the broad band-capable amplifier 311. Here, it is possible to obtain a desired power ratio by adjusting output amplitude of the signal generators 301 and 302. The synthetic wave of the two high-frequency powers having the desired power ratio is generated thereafter by synthesizing these high-frequency powers in the amplifier 311. At this time, it is desirable that the amplifier 311 can amplify the two high-frequency powers without distortion, and thus it needs to be the amplifier capable of a broad band. In addition, as the generated high-frequency powers are those having two different frequencies synthesized, the matching box 341 needs to have its matching circuit adjusted accordingly. Moreover, it is also feasible to place the filter 331 between the high-frequency power supply 321 and the matching box 341.

Moreover, in the case of using three high-frequency powers of mutually different frequencies, it can have the constitution as shown in FIG. 1C.

In the example shown in FIG. 1C, the high-frequency power supply 323 comprised of the signal generator 303 and the amplifier 313 is further added to the constitution shown in FIG. 1A. It is feasible, as in the constitution shown in FIG. 1A, to insert a filter 333 between the high-frequency power supply 323 and the matching box 341 as appropriate.

In addition, in the case of further synthesizing a plurality of the high-frequency powers, it is feasible to extend it at any time in the constitution as shown in FIG. 1C, or have the constitution shown in FIG. 1B or have the constitution that is a combination of them. Moreover, while FIGS. 1A to 1C do not show an internal structure of the matching box 341, the matching box 341 may be placed in a single shield case, or it may be divided to be independent by the high-frequency power of each frequency.

Figure 2:
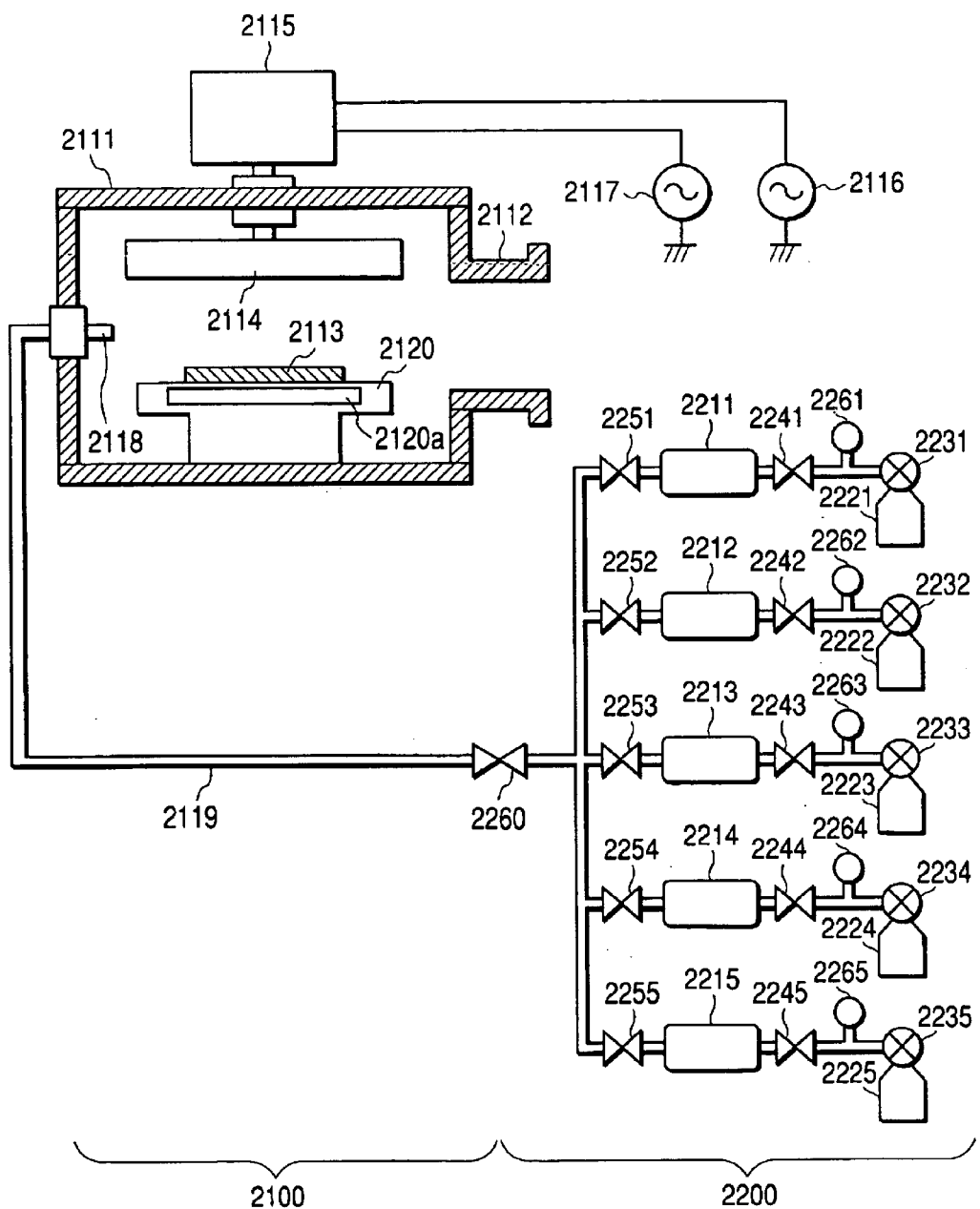
FIG. 2 is a schematic diagram showing an embodiment of a plasma processing apparatus capable of performing the vacuum processing method of the present invention.

FIG. 2 is a schematic diagram showing an embodiment of the plasma processing apparatus capable of performing the vacuum processing method of the present invention.

The plasma processing apparatus shown in FIG. 2 is an apparatus for forming a deposited film on a flat substrate 2113, and is comprised of, if roughly divided, a deposition apparatus 2100, a material gas supply apparatus 2200 and the exhauster (not shown) for reducing pressure in a reaction container 2111.

An exhaust pipe 2112 is integrally formed on a side of the reaction container 2111, and the other end of the exhaust pipe 2112 is connected to the exhauster that is not shown. The flat substrate 2113 on which top face the deposited film is to be formed is disposed in the reaction container 2111. The flat substrate 2113 is held by a substrate stage 2120 and heated by a heating element 2120a provided in the substrate stage 2120.

The material gas supplying apparatus 2200 is comprised of gas cylinders 2221 to 2225 of the material gases required for desired vacuum processing of $SiH_4$, $H_2$, $CH_4$, $B_2H_6$ and $PH_3$ and so on, header valves 2231 to 2235, gas inflow valves 2241 to 2245, gas outflow valves 2251 to 2255, pressure regulators 2261 to 2265 and massflow controllers 2211 to 2215, where each material gas cylinder is connected to a material gas supply means 2118 for introducing the gases into the reaction container 2111 via a material gas piping 2119 having a supplementary valve 2260.

The apparatus shown in FIG. 2 uses two high-frequency power supplies 2116 and 2117 in order to supply high-frequency powers of mutually different frequencies. The high-frequency powers supplied from the high-frequency power supplies 2116 and 2117 are synthesized in the matching box 2115 by passing the respective matching circuits, and are supplied into the reaction container 2111 from a high-frequency power electrode 2114. In the constitution shown in FIG. 2, the substrate 2113 maintained at an earth potential through a substrate stage 2120 acts as the other high-frequency power electrode. Moreover, the constitution from the high-frequency power supply to the matching box may use another constitution as shown in FIGS. 1A to 1C, or it may have the constitution connected to even more high-frequency power supplies.

For instance, when the high-frequency power supply 2116 is the first high-frequency power supply for supplying the first high-frequency power (frequency f1, power value P1) and the high-frequency power supply 2117 is the second high-frequency power supply for supplying the second high-frequency power (frequency f2, power value P2), the power supplies capable of rendering the relation of the respective oscillation frequencies as follows are used for the high-frequency power supplies 2116 and 2117:

$$10 \text{ MHz} \leq f2 < f1 \leq 250 \text{ MHz}$$

$$0.1 \leq P2/(P1+P2) \leq 0.9.$$

The sum P (=P1+P2) of the power values of the two high-frequency power supplies may be any value. In the normal vacuum processing, however, when the total flow rate of the gases supplied into the reaction container 1111 is F, the power value per unit flow rate, P/F should preferably be 6 to 6,000 J/ml (normal), and more preferably 12 to 3,000 J/ml (normal), and optimally 60 to 1,800 J/ml (normal). If this P/F is too low, it is thinkable that the electric power per unit gas flow rate is too low for decomposition to proceed well. Therefore, there is a possibility that the desired vacuum processing is not performed unless the P/F is higher than a certain level. On the other hand, if the P/F is excessively high beyond that level, the electric power per unit gas flow rate is too high and the decomposition proceeds overly further than desired active species so that the desired active species decreases inversely or the substrate is damaged by rendering electron temperature and gas temperature excessive.

In addition, it is possible to provide to the first high-frequency power supply 2116 the high-pass filter having a cut-off frequency characteristic that is lower than the frequency f1 and higher than the frequency f2. Also, it is possible likewise to provide to the second high-frequency power supply 2117 the low-pass filter having a cut-off frequency characteristic that is higher than the frequency f2 and lower than the frequency f1. As for such frequency selectivity, the higher it is, the more desirable it is, since it becomes possible to render the other power that diffracts to each high-frequency power supply low.

In addition, it is possible, with the constitution shown in FIG. 1B, to generate the high-frequency power satisfying the conditions of the present invention by amplifying the output of a plurality of signal generators with the broad band amplifier.

In addition, it is preferable that the frequencies f1 and f2 should satisfy the following range since, for instance, the deposition rate becomes remarkably fast in the case of forming the deposited film:

$$30 \text{ MHz} \leq f2 < f1 \leq 250 \text{ MHz}.$$

In addition, it is desirable that the power values P1 and P2 should satisfy the following range:

$$0.2 \leq P2/(P1+P2) \leq 0.7.$$

Furthermore, it is possible to improve stability of the discharge by setting the upper limit of the power ratio at f2/f1.

In addition, it is possible to obtain a higher standing wave suppressing effect by setting the frequencies f1 and f2 within the following range:

$$0.5 < f2/f1 \leq 0.9.$$

There is no particular limitation on the shape of the high-frequency power electrode 2114, and either a flat or rod-like shape that is square or circular is applicable. In particular, in the case wherein the high-frequency electrode is rod-like, it is not necessary to consider a horizontal two-dimensional standing wave of the high-frequency power in the reaction container 2111, and so the effects of the present invention can be efficiently obtained.

It is desirable that the surface of the high-frequency power electrode 2114 is roughened for the purposes of improving adhesiveness of the film, preventing film peeling and suppressing the dust in the formed film. As for the concrete degree of roughening, it should desirably be in the range from 5 μm to 200 μm in 10-point average roughness (Rz) with reference to 2.5 mm.

Furthermore, it is effective to have the surface of the high-frequency electrode 2114 covered or coated with the ceramic material from the viewpoint of improving the film adhesiveness. While there is no particular limitation as to the concrete means of coating, the surface of the high-frequency electrode 2114 may be coated by a surface coating method such as the CVD method or thermal spraying, for instance. Of the coating methods, the thermal spraying is preferable in terms of the costs and since it is hardly limited as to the size and shape of the object to be coated. As for concrete ceramic materials, alumina, titanium dioxide, aluminum nitride, boron nitride, zircon, cordierite, zircon cordierite, silicon oxide, beryllium oxide mica ceramics, and so on, can be named. While there is no particular limitation on the thickness of the ceramic material for coating the surface of the high-frequency electrode 2114, the thickness of 1 μm to 10 mm is preferable, and 10 μm to 5 mm is more preferable for the sake of increasing durability and uniformity and from the aspects of high-frequency power absorption volume and production costs.

To form the deposited film for a photovoltaic element, for instance, on the flat substrate as the plasma processing by using the apparatus thus configured, the following procedure can generally be used.

First, the flat substrate 2113 is placed on the substrate stage 2120 in the reaction container 2111, and the air is exhausted from inside the reaction container 2111 through the exhaust pipe 2112 by an exhauster that is not shown. Subsequently, inert gases such as an Ar gas and an He gas are introduced into the reaction container 2111 via the material gas supply means 2118, and the gas supply amount and exhaust speed are adjusted so as to be set at a fixed pressure. Next, flat substrate 2113 is heated and controlled by the heating element 2120a at a predetermined temperature of 200 to 300° C. or so and maintained until the temperature becomes stable.

When the substrate 2113 reaches the predetermined temperature, the material gases are introduced into the reaction container 2111 via the material gas supply means 2118 after sufficiently exhausting the inert gas used for heating. After checking that the flow rate of the material gases becomes the set flow rate and the pressure in the reaction container 2111 becomes stable by adjusting the exhaust speed, the predetermined high-frequency power is supplied to the high-frequency electrode 2114 from the two high-frequency power supplies 2116 and 2117 having mutually different frequencies via the matching box 2115. Thus, a glow discharge is generated in the reaction container 2111, and the material gases are dissociated by excitation to form the deposited film on the substrate 2113.

After forming the layer areas of desired film thickness, the types of material gases and the respective flow rates thereof are changed to predetermined values so as to perform the next deposited film formation by changing the ratio of the high-frequency powers to the predetermined values.

When the desired layer constitution is formed, the supply of the high-frequency powers is stopped, and the supply of the material gases is subsequently stopped so that the semiconductor device of a multi-layer structure is formed.

While an example of forming the deposited film is described above, the above apparatus is applicable not only to the deposited film formation but also to the plasma processing such as etching.

In addition, while it is effective, apart from the device of the multi-layer structure, to change the ratio of the high-frequency powers during formation of a single layer area or during the plasma processing such as etching, even in that case, it is important to set it to satisfy the above relation between the frequency and the power ratio.

Figure 3:
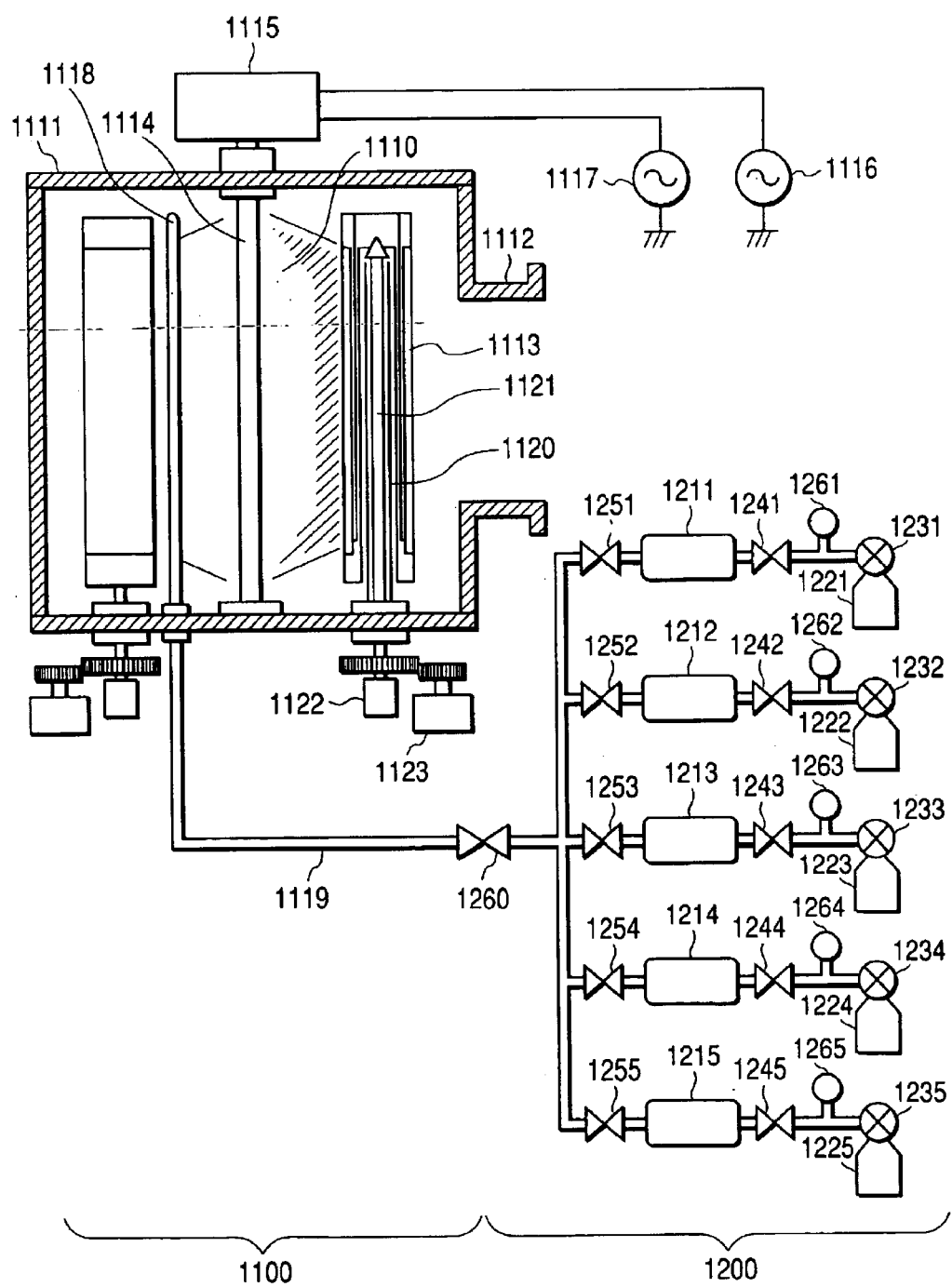
FIG. 3 is a schematic diagram showing another embodiment of the plasma processing apparatus capable of performing the vacuum processing method of the present invention.

FIG. 3 is a schematic diagram showing another embodiment of the plasma processing apparatus capable of performing the vacuum processing method of the present invention.

The plasma processing apparatus shown in FIG. 3 is an apparatus for forming the deposited film on a cylindrical substrate, and is comprised of, if roughly divided, a deposition apparatus 1100, a material gas supply apparatus 1200 and the exhauster (not shown) for reducing pressure in a reaction container 1111.

An exhaust pipe 1112 is integrally formed on a side of the reaction container 1111, and the other end of the exhaust pipe 1112 is connected to the exhauster that is not shown. In the reaction container 1111, a plurality of cylindrical substrates 1113 on which the deposited films are to be formed are disposed as if surrounding the central portion 1110 of the reaction container 1111. Each of the cylindrical substrates 1113 is held by a rotation axis 1121 rotated by a motor 1123 and a reduction gear 1122 and heated by a heating element 1120. If the motor 1123 is driven, the rotation axis 1121 rotates via the reduction gear 1122 and the cylindrical substrate 1113 revolves around its generatrix-direction central axis accordingly.

The material gas supplying apparatus 1200 is comprised of gas cylinders 1221 to 1225 of the material gases required for the vacuum processing such as $SiH_4$, $H_2$, $CH_4$, $B_2H_6$ and $PH_3$, header valves 1231 to 1235, pressure regulators 1261 to 1265, gas inflow valves 1241 to 1245, gas outflow valves 1251 to 1255 and massflow controllers 1211 to 1215, where each material gas cylinder is connected to a material gas supply means 1118 for introducing the gases into the reaction container 1111 via a material gas piping 1119 having a supplementary valve 1260.

In the apparatus shown in FIG. 3, two high-frequency power supplies 1116 and 1117 are used in order to supply the high-frequency powers of mutually different frequencies. The high-frequency powers supplied from the high-frequency power supplies 1116 and 1117 are synthesized in the matching box 1115 by passing the respective matching circuits, and are supplied into the reaction container 1111 from a high-frequency power electrode 1114. In the constitution shown in FIG. 3, the cylindrical substrate 1113 maintained at the earth potential through a rotation axis 1121 acts as the other high-frequency power electrode. Moreover, the constitution from the high-frequency power supply to the matching box may use another constitution as shown in FIGS. 1A to 1C, or it may have the constitution connected to even more high-frequency power supplies.

In the apparatus of the constitution shown in FIG. 3, processing can be uniformly performed all around the surface of the cylindrical substrate 1113 by rotating the cylindrical substrate 1113 by the motor 1123 and the reduction gear 1122 via the rotation axis 1121 at the predetermined speed during the vacuum processing.

For instance, when the high-frequency power supply 1116 is made the first high-frequency power supply for supplying the first high-frequency power (frequency f1, power value P1), and the high-frequency power supply 117 is made the second high-frequency power supply for supplying the second high-frequency power (frequency f2, power value P2), the power supplies capable of rendering the relation of the respective oscillation frequencies as follows are used as the high-frequency power supplies 1116 and 1117:

$$10 \text{ MHz} \leq f2 < f1 \leq 250 \text{ MHz};$$

and $$0.1 \leq P2/(P1+P2) \leq 0.9.$$

The sum P (=P1+P2) of the power values of the two high-frequency power supplies may be any value. In the normal vacuum processing, however, when the total flow rate of the gases supplied into the reaction container 1111 is F, the power value per unit flow rate, P/F should desirably be 6 to 6,000 J/ml (normal), and preferably 12 to 3,000 J/ml (normal), and optimally 60 to 1,800 J/ml (normal). If this P/F is too low, it is thinkable that the electric power per unit gas flow rate is too low for decomposition to proceed well. Therefore, there is a possibility that the desired vacuum processing is not performed unless the P/F is higher than a certain level. On the other hand, if the P/F is excessively high beyond that level, the electric power per unit gas flow rate is too high and the decomposition proceeds overly further than desired active species so that the desired active species decreases inversely or the substrate is damaged by rendering electron temperature and gas temperature excessive.

In addition, it is possible to provide to the first high-frequency power supply 1116 the high-pass filter having the cut-off frequency characteristic that is lower than the frequency f1 and higher than the frequency f2. Also, it is possible likewise to provide to the second high-frequency power supply 1117 the low-pass filter having a cut-off frequency characteristic that is higher than the frequency f2 and lower than the frequency f1. As for such frequency selectivity, the higher it is, the more desirable it is, since it becomes possible to render the other power that diffracts to each high-frequency power supply low.

In addition, it is possible, with the constitution shown in FIG. 1B, to generate the high-frequency power satisfying the conditions of the present invention by amplifying the output of a plurality of signal generators with the broad band amplifier.

In addition, it is preferable that the frequencies f1 and f2 should satisfy the following range since, for instance, the deposition rate becomes remarkably fast in the case of forming the deposited film:

$$30 \text{ MHz} \leq f2 < f1 \leq 250 \text{ MHz}.$$

In addition, it is desirable that the power values P1 and P2 should satisfy the following range:

$$0.2 \leq P2/(P1+P2) \leq 0.7.$$

Furthermore, it is possible to improve stability of the discharge by setting the upper limit of the power ratio at f2/f1.

In addition, it is possible to obtain a higher standing wave suppressing effect by setting the frequencies f1 and f2 within the following range:

$$0.5 < f2/f1 \leq 0.9$$

While there is no particular limitation on the shape of the high-frequency power electrode 1114, it should desirably have the rod-like or linear shape as shown in FIG. 3 in order to obtain a more remarkable effect of making uniform the vacuum processing characteristics. In addition, the high-frequency power electrode 1114 should desirably be comprised of curved surfaces as much as possible, and preferably have the columnar or cylindrical shape from the viewpoint of preventing peeling of the film adhered to the high-frequency power electrode 1114 when forming the deposited film.

It is desirable that the surface of the high-frequency power electrode 1114 is roughened for the purposes of improving adhesiveness of the film, preventing film peeling and suppressing the dust in the formed film. As for the concrete degree of roughening, it should desirably be in the range from 5 $\mu$m to 200 $\mu$m in 10-point average roughness (Rz) with reference to 2.5 mm.

Furthermore, it is effective to have the surface of the high-frequency electrode 1114 covered or coated with the ceramic material from the viewpoint of improving the film adhesiveness. While there is no particular limitation as to the concrete means of coating, the surface of the high-frequency electrode 1114 may be coated by a surface coating method such as the CVD method or thermal spraying, for instance. Of the coating methods, the thermal spraying is preferable in terms of the costs and since it is hardly limited as to the size and shape of the object to be coated. As for the concrete ceramic materials, alumina, titanium dioxide, aluminum nitride, boron nitride, zircon, cordierite, zircon cordierite, silicon oxide, beryllium oxide mica ceramics, and so on, can be named. While there is no particular limitation on the thickness of the ceramic material for coating the surface of the high-frequency electrode 1114, the thickness of 1 $\mu$m to 10 mm is preferable, and 10 $\mu$m to 5 mm is more preferable for the sake of increasing durability and uniformity and from the aspects of high-frequency power absorption volume and production costs.

Moreover, it is possible to further enhance the adhesion of film on the surface of the high-frequency electrode 1114 and to prevent the film peeling more effectively by providing heating or cooling means to the high-frequency electrode 1114. In this case, it is determined whether to heat or to cool the high-frequency electrode 1114 as appropriate according to the deposited film material and deposition conditions. As for the concrete heating means, there is no particular limitation as far as it is a heating element. To be more specific, electrical resistance heating elements such as a winding heater of a sheath-like heater, a plate-like heater and a ceramic heater, and a thermal radiation lamp heating element such as a halogen lamp and an infrared ray lamp, heating elements by heat exchange means having media such as liquids and gases can be named. On the other hand, as for concrete cooling means, there is no particular limitation as far as it is a heat absorbing element. For instance, a cooling coil, a cooling plate, a cooling dome, and so on, capable of shedding liquids, gases, and so on, as cooling media can be named.

The formation of the deposited film for the cylindrical electrophotographic photosensitive member, for instance, by using the apparatus thus configured can be performed by generally using the following procedure.

First, the cylindrical substrate 1113 is installed in the reaction container 1111, and the air is exhausted from inside the reaction container 1111 through the exhaust pipe 1112 by the exhauster that is not shown. Subsequently, the inert gases such as the Ar gas and He gas and so on are introduced into the reaction container 1111 via the material gas supply means 1118, and the gas supply amount and exhaust speed are adjusted so as to be set at the fixed pressure. Next, the heating element 1120 heats and controls the cylindrical substrate 1113 to be at a predetermined temperature between 200° C. and 300° C. or so, maintaining it until the temperature becomes stable.

When the cylindrical substrate 1113 reaches the predetermined temperature, the inert gases and so on used for heating are sufficiently exhausted, and then the material gases are introduced into the reaction container 1111 via the material gas supply means 1118. After checking that the flow rate of the material gases becomes the set flow rate and the pressure in the reaction container 1111 becomes stable, the predetermined high-frequency power is supplied to the high-frequency electrode 1114 from the two high-frequency power supplies 1116 and 1117 of mutually different oscillation frequencies via the matching box 1115. Thus, the glow discharge is generated in the reaction container 1111, and the material gases are dissociated by excitation to form the deposited film on the cylindrical substrate 1113.

To obtain a deposited film having a further multi-layer form, the layer area of the desired film thickness is formed, and then the types of the material gases and the respective flow rates thereof are changed to the predetermined values to form a next layer area.

Figure 8A:
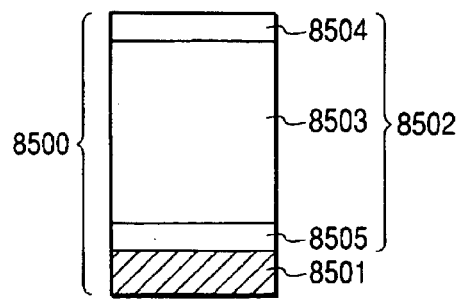
FIGS. 8A, 8B and 8C are schematic diagrams for describing the layer constitution of an electrophotographic photosensitive member created by the present invention.
Figure 8B:
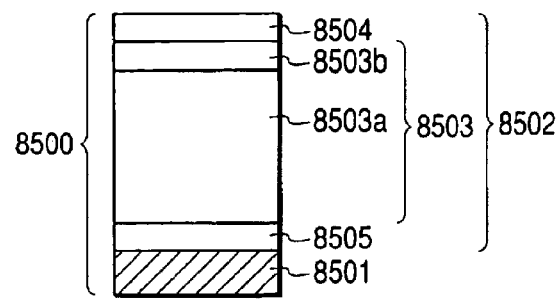
Figure 8C:
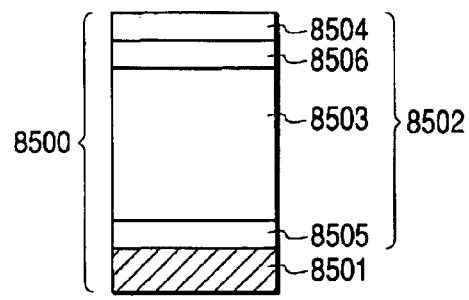

FIGS. 8A, 8B and 8C are schematic block diagrams for describing the layer constitution of the electrophotographic photosensitive member produced by the present invention.

A photosensitive member 8500 shown in FIG. 8A has a light-receiving layer 8502 provided on a substrate 8501. The light-receiving layer 8502 is comprised of an a-Si charge injection blocking layer 8505, a photoconductive layer 8503 having photoconductivity and consisting of amorphous silicon (a-Si: H, X) containing hydrogen atoms (H) and/or halogen atoms (X), and an a-SiC surface layer 8504 in order from the side of substrate 8501.

The photosensitive member 8500 shown in FIG. 8B has the light-receiving layer 8502 provided on the substrate 8501. The light-receiving layer 8502 is comprised of the a-Si charge injection blocking layer 8505, the photoconductive layer 8503 consisting of a-Si: H, X and having photoconductivity and the a-SiC surface layer 8504 in order from the substrate 8501 side, where the photoconductive layer 8503 consists of a first layer area 8503a and a second layer area 8503b.

The photosensitive member 8500 shown in FIG. 8C has the light-receiving layer 8502 provided on the substrate 8501. The light-receiving layer 8502 is comprised of the a-Si charge injection blocking layer 8505, the photoconductive layer 8503 consisting of a-Si: H, X and having photoconductivity, the a-SiC intermediate layer 8506 and the a-SiC surface layer 8504 in order from the substrate 8501 side.

(Substrate)

The substrates to be used in the present invention may be either conductive or electrically insulating. As for conductive substrates, metals such as Al, Cr, Mo, Au, In, Nb, Te, V, Ti, Pt, Pd and Fe, and their alloys such as stainless steel can be named. In addition, substrates having rendered conductive at least the surface of the side on which the light-receiving layer is formed may also be used, including films or sheets of synthetic resins such as polyester, polyethylene, polycarbonate, cellulose acetate, polypropylene, polyvinyl chloride, polystyrene and polyamide, and electrically insulated substrates such as glass and ceramics.

While the shape of the substrates to be used in the present invention may be cylindrical or flat with a smooth surface or uneven surface and its thickness is determined as appropriate to form a desired semiconductor device, it may be rendered as thin as possible within the range capable of sufficiently showing functions as the substrate in the case where flexibility is required. However, it should usually be 10 $\mu$m or more from the viewpoint of manufacturing, handling and mechanical strength of the substrate.

(Photoconductive Layer)

In the present invention, the photoconductive layer formed on the substrate to effectively attain its objects and constituting a part of the light-receiving layer is formed by the plasma CVD method in which numerical conditions of film formation parameters are set as appropriate to obtain the desired characteristics.

To form the photoconductive layer, basically, the material gas for supplying Si capable of supplying the silicon atoms (Si), the material gas for supplying H capable of supplying the hydrogen atoms (H) and/or and the material gas for supplying X capable of supplying the halogen atoms (X) should be introduced in a gaseous state into the reaction container capable of reducing the pressure therein to generate the glow discharge therein, so that a layer consisting of a-Si:H, X may be formed on a predetermined substrate placed at a predetermined position in advance.

Moreover, while it is necessary in the present invention that the hydrogen atoms and/or the halogen atoms should be contained in the photoconductive layer, it is because they are essential for the sake of compensating for unbonded hands of the silicon atoms and improving the layer quality, in particular, the photoconductivity and charge holding characteristic.

Accordingly, it is desirable that the content of the hydrogen atoms or the halogen atoms, or the sum of the hydrogen atoms and the halogen atoms should be 10 to 40 atom percent to the sum of the silicon atoms and the hydrogen atoms and/or the halogen atoms.

As for the substance capable of being the gas for supplying Si used in the present invention, gaseous or gasifiable silicon hydrides (silanes) such as $SiH_4$, $Si_2H_6$, $Si_3H_8$ and $Si_4H_{10}$ can be named as the ones to be effectively used, and furthermore, $SiH_4$ and $Si_2H_6$ can be named as the preferable ones from the viewpoints of easy handling when forming the layer and high efficiency in the supply of Si.

Also it is preferable to form the layer by further mixing these gases with gases of $H_2$ and/or He or silicon compounds containing hydrogen atoms by a desired amount in order to structurally introduce hydrogen atoms into the photoconductive layer to be formed, render control over an introduction ratio of the hydrogen atoms still easier and obtain the film characteristics for attaining the objects of the present invention. Moreover, the gases may be not only a single species but a plurality of species mixed at a predetermined mixing ratio.

In addition, as for the material gases effective as the ones for supplying the halogen atoms to be used in the present invention, a gaseous or gasifiable halogen compound such as a halogen gas, a halogenide, an interhalogen compound containing a halogen, and a silane derivative substituted with a halogen, for instance, can be named as the preferable ones. In addition, a gaseous or gasifiable, hydrogenated silicon compound containing a halogen atom, having silicon atoms and the halogen atoms as the constituting elements can further be named as the effective one. As for the halogen compound preferably useable in the present invention, to be specific, interhalogen compounds such as a fluorine gas ($F_2$), BrF, ClF, $ClF_3$, $BrF_3$, $BrF_5$, $IF_3$ and $IF_7$ can be named. As for the silicon compound containing the halogen atoms, that is, so-called a silane derivative substituted with a halogen atom, to be specific, a silicon fluoride such as $SiF_4$ and $Si_2F_6$ can be named for instance as the preferable ones.

To control the amount of the hydrogen atoms and/or the halogen atoms contained in the photoconductive layer, the temperature of the substrate, the amount introduced into the reaction container of the material substance used for incorporating the hydrogen atoms and/or the halogen atoms, the discharge power, and so on, should be controlled, for instance.

In the present invention, it is preferable that the photoconductive layer should contain atoms for controlling the conductivity.

As for the atoms for controlling the conductivity contained in the photoconductive layer, so called impurities in the semiconductor field can be named, and the atoms for providing p-type conductivity characteristics belonging to the group 13 of the periodic table (hereinafter, abbreviated as the "group 13 atoms") or the atoms for providing n-type conductivity characteristics belonging to the group 15 of the periodic table (hereinafter, abbreviated as the "group 15 atoms") may be used.

As for such group 13 atoms, to be specific, there are boron (B), aluminum (Al), gallium (Ga), indium (In), thallium (Tl), and so on, and B, Al and Ga are especially preferable.

As for the group 15 atoms, to be specific, there are P (phosphorus), As (arsenic), Sb (antimony), Bi (bismuth) and so on, and P and As are especially preferable.

As for the content of the atom for controlling the conductivity contained in the photoconductive layer, it should preferably be $1\times10^{-2}$ to $1\times10^4$ atom ppm, more preferably $5\times10^{-2}$ to $5\times10^3$ atom ppm, and optimally $1\times10^{-1}$ to $1\times10^3$ atom ppm.

For structurally introducing the atoms for controlling the conductivity into the photoconductive layer, the material substance thereof should be introduced in a gaseous state into the reaction container together with other gases for forming the photoconductive layer when forming the layer.

As for material substances for introducing the atoms for controlling the conductivity, it is desirable that those gaseous at normal temperature and normal pressure or at least those that can easily be gasified under the layer forming conditions should be adopted.

As for the material substances for introducing such group 13 atoms, to be specific, boron hydrides such as $B_2H_6$, $B_4H_{10}$, $B_5H_9$, $B_5H_{11}$, $B_6H_{10}$, $B_6H_{12}$ and $B_6H_{14}$, and boron halides such as $BF_3$, $BCl_3$ and $BBr_3$ can be named for introduction of boron atoms. In addition, $AlCl_3$, $GaCl_3$, $Ga(CH_3)_3$, $InCl_3$, $TlCl_3$ and so on can be named.

As for the material substances for introducing the group 15 atoms, phosphorous hydrides such as $PH_3$ and $P_2H_4$, and phosphorous halides such as $PH_4I$, $PF_3$, $PF5$, $PCl_3$, $PCl_5$, $PBr_3$, $PBr_5$ and $PI_3$ can be named as those used effectively for introduction of phosphorous atoms. In addition, $AsH_3$, $AsF_3$, $AsCl_3$, $AsBr_3$, $AsF5$, $SbH_3$, $SbF_3$, $SbF_5$, $SbCl_3$, $SbCl_5$, $BiH_3$, $BiCl_3$, $BiBr_3$ and so on can be named as effective starting substances for introducing the group 15 atoms.

Moreover, these material substances for introducing the atoms for controlling the conductivity can be used, as necessary, by diluting them with gases such as $H_2$, He, Ar and Ne.

Furthermore, it is effective to have carbon atoms and/or oxygen atoms and/or nitrogen atoms contained in the photoconductive layer. The content of the carbon atoms and/or the oxygen atoms and/or the nitrogen atoms should preferably be $1\times10^{-5}$ to 10 atom percent, more preferably $1\times10^{-4}$ to 8 atom percent, and optimally $1\times10^{-3}$ to 5 atom percent to the sum of the silicon atoms, carbon atoms, oxygen atoms and nitrogen atoms. The carbon atoms and/or the oxygen atoms and/or the nitrogen atoms may equally and uniformly be contained in the photoconductive layer, or there may also be a portion of nonuniform distribution wherein the content changes in the layer thickness direction of the photoconductive layer.

In the present invention, it is desirable that the layer thickness of the photoconductive layer should be determined from the viewpoints of obtaining desired electrophotographic characteristics, economic effects and so on, and it should preferably be 10 to 50 $\mu$m, more preferably be 15 to 45 $\mu$m, and optimally 20 to 40 $\mu$m. If the layer thickness becomes thinner than 20 $\mu$m, the electrophotographic characteristics such as chargeability and sensitivity become insufficient in practice, and if it is thicker than 50 $\mu$m, the time for forming the photoconductive layer becomes longer, resulting in higher production costs.

To attain the objects of the present invention and form the photoconductive layer having the desired film characteristics, it is necessary to set the mixing ratio between the gas for supplying Si and the diluting gas, the gas pressure in the reaction container, the discharge power and the substrate temperature as appropriate.

While the optimum range as to the pressure in the reaction container is also selected as appropriate according to the layer design, in a usual case, it should preferably be set at $1\times10^{-2}$ to $1\times10^3$ Pa, more preferably $5\times10^{-2}$ to $5\times10^2$ Pa, and optimally $1\times10^{-1}$ to $1\times10^2$ Pa.

Moreover, while the optimum range as to the substrate temperature is selected as appropriate according to the layer design, in a usual case, it should preferably be set at 150 to 350° C., more preferably 180 to 330° C., and optimally 200 to 300° C.

In the present invention, while the above-described ranges can be designated as being preferable numerical ranges of the substrate temperature and the gas pressure for the purpose of forming the photoconductive layer, the conditions should not determined independently and separately under normal circumstances, and so it is desirable to determine the optimum values based on a mutual and an organic relationship in order to form the photosensitive member having the desired characteristics.

(Charge Injection Blocking Layer)

In the photosensitive member of the present invention, it is more effective to provide a charge injection blocking layer having the function of blocking charge injection from the conductive substrate side between the conductive substrate and the photoconductive layer. To be more specific, the charge injection blocking layer has so-called polarity dependency wherein it has the function of blocking the charge to be injected from the substrate side to the photoconductive layer side when the light-receiving layer receives charging treatment of a predetermined polarity on its free surface, and such a function is not performed when it receives charging treatment of an opposite polarity. In order to provide such a function, it is also effective to have many atoms for controlling the conductivity contained in the charge injection blocking layer.

The atoms for controlling the conductivity contained in the charge injection blocking layer may be uniformly distributed therein, or there may be the portions where they are contained in a state of nonuniform distribution while they are equally contained in the layer thickness direction. In the case where the distribution density is nonuniform, it is suitable to have many of them distributed on the substrate side. In either case, however, it is necessary to have them uniformly distributed and equally contained in the in-plane direction parallel to the surface of the substrate also from the viewpoint of making uniform the characteristics in the in-plane direction.

As for the atoms for controlling the conductivity contained in the charge injection blocking layer, so-called impurities in the semiconductor field can be named, and in the photosensitive member for positive charging,the atoms for providing p-type conductivity characteristics belonging to the group 13 of the periodic table (hereinafter, abbreviated as the "group 13 atoms") may used.

As for such group 13 atoms, to be specific, there are boron (B), aluminum (Al), gallium (Ga), indium (In), thallium (Tl), and so on, and B, Al and Ga are especially preferable.

Moreover, in the photosensitive member for negative charging, the atoms for providing n-type conductivity characteristics belonging to the group 15 of the periodic table (hereinafter, abbreviated as the "group 15 atoms") may be used.

As for the group 15 atoms, to be specific, there are P (phosphorus), As (arsenic), Sb (antimony), Bi (bismuth), and so on, and P and As are especially preferable.

As for the content of the atoms for controlling the conductivity contained in the charge injection blocking layer in the present invention, while it is determined as appropriate as desired in order to attain the objects thereof, it should preferably be 10 to $1 \times 10^4$ atom ppm, more preferably 50 to $5 \times 10^3$ atom ppm, and optimally $1 \times 10^2$ to $3 \times 10^3$ atom ppm.

Furthermore, it is possible to further improve adhesiveness between the charge injection blocking layer and other layers provided directly in contact with it by having at least one type of the carbon atoms, nitrogen atoms and oxygen atoms contained in the charge injection blocking layer.

The carbon atoms or nitrogen atoms or oxygen atoms contained in the charge injection blocking layer may be equally and uniformly distributed therein, or there may be the portions where they are contained in a state of nonuniform distribution while they are equally contained in the layer thickness direction. In either case, however, it is necessary to have them uniformly distributed and equally contained in the in-plane direction parallel to the surface of the substrate also from the view of making uniform the characteristics in the in-plane direction.

As for the content of the carbon atoms and/or nitrogen atoms and/or oxygen atoms contained in the entire layer areas of the charge injection blocking layer in the present invention, while it is determined as appropriate as desired in order to attain the objects thereof, it should preferably be, in the case of one type as its amount, and in the case of two or more types as the sum thereof, $1 \times 10^{-3}$ to 30 atom percent, more preferably $5 \times 10^{-3}$ to 20 atom percent, and optimally $1 \times 10^{-2}$ to 10 atom percent.

In addition, the hydrogen atoms and/or the halogen atoms contained in the charge injection blocking layer in the present invention have the effects of compensating for unbonded hands existing in the layer and improving the layer quality. The content of the hydrogen atoms or the halogen atoms or the sum thereof in the charge injection blocking layer should preferably be 1 to 50 atom percent, more preferably 5 to 40 atom percent, and optimally 10 to 30 atom percent.

In the present invention, the layer thickness of the charge injection blocking layer should preferably be 0.1 to 5 μm, more preferably be 0.3 to 4 μm, and optimally 0.5 to 3 μm from the viewpoints of desired electrophotographic characteristics, economic effects and so on. If the layer thickness becomes thinner than 0.1 μm, the power of blocking the charge from the substrate becomes insufficient so that sufficient chargeability cannot be obtained, and if it is thicker than 5 μm, improvement in electrophotographic characteristics cannot be expected, and extended time for the layer formation results in higher production costs.

To form the charge injection blocking layer having the characteristics capable of attaining the objects of the present invention, it is necessary, as in the case of the photoconductive layer, to set the mixing ratio between the gas for supplying Si and the diluting gas, the gas pressure in the reaction container, the discharge power and the substrate temperature as appropriate.

While the optimum range as to the pressure in the reaction container is selected as appropriate likewise according to the layer design, in a usual case, it should preferably be set at $1 \times 10^{-2}$ to $1 \times 10^3$ Pa, more preferably $5 \times 10^{-2}$ to $5 \times 10^2$ Pa, and optimally $1 \times 10^{-1}$ to $1 \times 10^2$ Pa.

Moreover, while the optimum range as to the substrate temperature is selected as appropriate according to the layer design, in a usual case, it should preferably be set at 150 to 350° C., more preferably 180 to 330° C., and optimally 200 to 300° C.

In the present invention, while the above-described ranges can be designated as preferable numerical ranges of the mixing ratio of the diluted gases, the gas pressure, the discharge power and the substrate temperature for the purpose of forming the charge injection blocking layer, these layer formation factors should not be determined independently and separately under normal circumstances, and so it is desirable to determine the optimum value of the layer formation factors based on a mutual and an organic relationship in order to form the surface layer having the desired characteristics.

(Surface Layer)

In the present invention, it is preferable to further form an amorphous silicon surface layer on the photoconductive layer formed on the substrate as mentioned above. This surface layer has a free surface, and is provided for the purpose of attaining the objects of the present invention mainly in terms of moisture resistance, repeated use characteristics, electrical voltage proof, use environment characteristics and durability.

Moreover, in the present invention, the amorphous materials forming the photoconductive layer and the surface layer, constituting the light-receiving layer have the silicon atoms as their common constituting element, respectively, and the chemical stability is insufficiently secured on their lamination interface.

While it is possible to use any material in forming the surface layer as far as it is the amorphous silicon material, the materials to be suitably used are, for instance, amorphous silicon containing hydrogen atoms (H) and/or halogen atoms (X) and further containing carbon atoms (hereinafter, represented as "a-SiC:H, X"), amorphous silicon containing hydrogen atoms (H) and/or halogen atoms (X) and further containing oxygen atoms (hereinafter, represented as "a-SiO:H, X"), amorphous silicon containing hydrogen atoms (H) and/or halogen atoms (X) and further containing nitrogen atoms (hereinafter, represented as "a-SiN:H, X"), amorphous silicon containing hydrogen atoms (H) and/or halogen atoms (X) and further containing at least one of carbon atoms, oxygen atoms and nitrogen atoms (hereinafter, represented as "a-SiCON:H, X") and so on.

In the present invention, in order to effectively attain its objects, the surface layer is formed by a vacuum deposited film formation method in which the numerical conditions of the film formation parameters are set as appropriate to obtain the desired characteristics. To be more specific, it can be formed by a number of film deposition methods such as a glow discharge method (AC discharge CVD methods or DC discharge CVD methods and so on, such as a low-frequency CVD method, a high-frequency CVD method or a microwave CVD method), a sputtering method, a vacuum evaporation method, an ion plating method, a photo-chemical vapor deposition method and a thermal CVD method for instance. While these film deposition methods are adopted by selecting them as appropriate by the factors such as manufacturing conditions, a degree of load under plant and equipment investment, a manufacturing scale and the characteristics desired about the photosensitive members to be produced, it is desirable to adopt the same deposition method as that for forming the photoconductive layer from the viewpoint of the productivity of the photosensitive members.

For instance, to form the surface layer composed of a-SiC:H, X by the glow discharge method, basically, the material gas for supplying Si capable of supplying the silicon atoms (Si), the material gas for supplying C capable of supplying the carbon atoms (C), the material gas for supplying H capable of supplying the hydrogen atoms (H) and/or and the material gas for supplying X capable of supplying the halogen atoms (X) should be introduced in a gaseous state into the reaction container capable of reducing the pressure therein to generate the glow discharge therein, so that a layer consisting of "a-SiC:H, X" may be formed on the substrate having the photoconductive layer formed thereon at a predetermined position in advance.

While any material may be used in forming the surface layer in the present invention as far as it is the amorphous silicon material containing the silicon, it should preferably be a compound with the silicon atoms containing at least one element selected from carbon, nitrogen and oxygen, and preferably, the one having a-SiC as its main component.

The carbon content in the case of forming the surface layer with a-SiC as its main component should preferably be within the range of 30 to 90 percent to the sum of the silicon atoms and the carbon atoms.

Moreover, while it is necessary in the present invention that the hydrogen atoms and/or the halogen atoms should be contained in the surface layer, it is because they are essential for the sake of compensating for unbonded hands of the silicon atoms and improving the layer quality, in particular, the photoconductivity and charge holding characteristics. The hydrogen content should preferably be 30 to 70 atom percent under normal circumstances, more preferably 35 to 65 atom percent, and optimally 40 to 60 atom percent to the sum of the constituting atoms. In addition, as for the fluorine content, it should preferably be 0.01 to 15 atom percent under normal circumstances, more preferably 0.1 to 10 atom percent, and optimally 0.5 to 5 atom percent.

These photosensitive members produced within the ranges of the hydrogen content and/or the fluorine content are sufficiently applicable in practice as remarkably excellent ones that have not existed so far. To be more specific, it is known that the defect (mainly dangling bonds of the silicon atoms and the carbon atoms) existing in the surface layer exerts a bad influence upon the characteristics as the electrophotographic member. For instance, those that are named as the bad influence include deterioration of the chargeability characteristics due to charge injection from the free surface, change in the chargeability characteristics due to change of the surface structure under the use environment such as at a high humidity, and furthermore, occurrence of an after-image phenomenon when repeatedly used, which is caused in such a manner that charges are injected into the surface layer from the photoconductive layer at the time of corona electrical charging and at the time of light irradiation and trapped on the above-described defect in the surface layer, and so on.

However, the defect in the surface layer is significantly reduced by controlling the hydrogen content in the surface layer to be 30 atom percent or more, and consequently, a great improvement can be made in the aspect of electrical characteristics and high-speed successive usability compared to the past.

On the other hand, if the hydrogen content in the surface layer exceeds 70 atom percent, it can no longer withstand the repeated use because the hardness of the surface layer is reduced. Accordingly, it is one of the very important factors to control the hydrogen content in the surface layer to be within the above-described range in order to obtain the desired electrophotographic characteristics that are remarkably good. The hydrogen content in the surface layer can be controlled by the material gas flow rate (ratio), substrate temperature, discharge power, gas pressures, and so on.

In addition, it becomes possible, by controlling the fluorine content in the surface layer to be in the range 0.01 atom percent or more, to more effectively accomplish the occurrence of bonding of the silicon atoms and the carbon atoms in the surface layer. Furthermore, as the workings of the fluorine atoms in the surface layer, it is possible to effectively prevent the bonding of the silicon atoms and the carbon atoms from breaking due to damage of the corona and so on.

On the other hand, if the fluorine content in the surface layer exceeds 15 atom percent, the desired effects of the occurrence of bonding of the silicon atoms and the carbon atoms in the surface layer and the prevention of the bonding of the silicon atoms and the carbon atoms from breaking due to damage of corona, and so on, can hardly be recognized any longer. Furthermore, as the excessive fluorine atoms obstruct travelability of a carrier in the surface layer, a residual potential and an image memory come to be remarkably recognized. Accordingly, it is one of the very important factors to control the fluorine content in the surface layer to be within the above-described range in order to obtain the desired electrophotographic characteristics. It is possible to control the fluorine content in the surface layer by the material gas flow rate (ratio), substrate temperature, discharge power, gas pressure, and so on, as in the case of the hydrogen content.

As for the substances capable of becoming the gas for supplying silicon (Si) used in the formation of the surface layer of the present invention, gaseous or gasifiable silicon hydrides (silanes) such as $SiH_4$, $Si_2H_6$, $Si_3H_8$ and $Si_4H_{10}$ can be named as the ones to be effectively used, and furthermore, $SiH_4$ and $Si_2H6$ can be named as the desirable ones from the viewpoints of easy handling when forming the layer and high efficiency in the supply of Si. Moreover, these material gases for supplying Si can be used, as necessary, by diluting them with gases such as $H_2$, He, Ar and Ne.

As for the substances capable of becoming the gas for supplying the carbon, gaseous or gasifiable hydrocarbons such as $CH_4$, $C_2H_2$, $C_2H_6$, $C_3H_8$ and $C_4H_{10}$ can be named as the ones to be effectively used, and furthermore, $CH_4$, $C_2H_2$ and $C_2H_6$ can be named as the desirable ones from the viewpoints of easy handling when forming the layer and high efficiency in the supply of Si. Moreover, these material gases for supplying C can be used, as necessary, by diluting them with gases such as $H_2$, He, Ar and Ne.

As for the substances capable of becoming the gas for supplying the nitrogen or oxygen, gaseous or gasifiable compounds such as $NH_3$, NO, $N_2O$, $NO_2$, $O_2$, CO, $CO_2$ and $N_2$ can be named as the ones to be effectively used. Moreover, these material gases for supplying the nitrogen or oxygen can be used, as necessary, by diluting them with gases such as $H_2$, He, Ar and Ne.

In addition, in order to render it still easier to control the introduction ratio of the hydrogen atoms to be introduced into the surface layer to be formed, it is preferable to form the layer by further mixing these gases with a desired amount of hydrogen gas or a gas of silicon compounds containing hydrogen atoms. In addition, the gases may be not only a single species but a plurality of species mixed at a predetermined mixing ratio.

As for the material gases effective as the ones for supplying the halogen atoms, a gaseous or gasifiable halogen compound such as a halogen gas, a halogenide, an interhalogen compound containing a halogen, and a silane derivative substituted with a halogen, for instance, can be named as the preferable ones. In addition, a gaseous or gasifiable, silicon hydride compound containing a halogen atom, having the silicon atoms and the halogen atoms as the constituting elements can further be named as the effective one. As for the halogen compounds preferably useable in the present invention, to be specific, interhalogen compounds such as the fluorine gas (F2), BrF, ClF, $ClF_3$, $BrF_3$, $BrF_5$, $IF_3$ and $IF_7$ can be named. As for the silicon compound containing halogen atoms, that is, so-called the silane derivative substituted with a halogen atom, to be specific, the silicon fluorides such as $SiF_4$ and $Si_2F_6$ can be named as the preferable ones.

To control the amount of the hydrogen atoms and/or the halogen atom contained in the surface layer, the temperature of the substrate, the amount introduced into the reaction container of the material substance used for incorporating the hydrogen atoms and/or the halogen atoms, the discharge power, and so on, thereof should be controlled, for instance.

The carbon atoms and/or the oxygen atoms and/or the nitrogen atoms may equally and uniformly be contained in the surface layer, or there may also be a portion of nonuniform distribution wherein the content changes in the layer thickness direction of the surface layer.

As for the layer thickness of the surface layer of the present invention, it should preferably be 0.01 to 3 $\mu$m under normal circumstances, more preferably be 0.05 to 2 $\mu$m, and optimally 0.1 to 1 $\mu$m. If the layer thickness becomes thinner than 0.01 $\mu$m, the surface layer is lost due to wear, and so on, while using the photosensitive member, and if it exceeds 3 $\mu$m, there is a reduction in the electrophotographic characteristics such as an increase in the residual potential.

The surface layer according to the present invention is carefully formed so as to provide the desired characteristics as they are desired. To be more specific, as the substance containing as the constituting element Si, C and/or N and/or O, H and/or X structurally takes the crystal to amorphous forms depending on its forming conditions and shows properties from conductivity, semiconductivity to insulation in terms of electric properties, and photoconductive to non-photoconductive properties respectively, its forming conditions are strictly selected as desired in the present invention so that the compounds having the desired characteristics according to the objects will be formed.

For instance, in the case of providing the surface layer for the main purpose of improving the voltage proof, it is formed as a non-single crystal material whose electrical insulating behavior is remarkable in the use environment.

In addition, in the case of providing the surface layer for the main purpose of improving the successive repeated use characteristics or the use environment characteristics, the degree of the above electrical insulation is alleviated to an extent, and it is formed as the non-single crystal material having sensitivity to a degree to the irradiated light.

To form the surface layer having the characteristics capable of attaining the objects of the present invention, it is necessary to set as appropriate the substrate temperature and the gas pressure in the reaction container as desired.

While the optimum range as to the substrate temperature (Ts) is selected as appropriate according to the layer design, in a usual case, it should preferably be set at 150 to 350° C., more preferably 180 to 330° C., and optimally 200 to 300° C.

While the optimum range as to the pressure in the reaction container is also selected as appropriate according to the layer design, in a usual case, it should preferably be set at $1 \times 10^{-2}$ to $1 \times 10^3$ Pa, more preferably $5 \times 10^{-2}$ to $5 \times 10^2$ Pa, and optimally $1 \times 10^{-1}$ to $1 \times 10^2$ Pa.

In the present invention, while the above-described ranges can be designated as preferable numerical ranges of the substrate temperature and the gas pressure for the purpose of forming the surface layer, the conditions should not be determined independently and separately under normal circumstances, and so it is desirable to determine the optimum values based on a mutual and an organic relationship in order to form the photosensitive member having the desired characteristics.

It is also feasible to provide an area between the surface layer and the photoconductive layer where the content of the carbon atoms and/or the oxygen atoms and/or the nitrogen atoms changes by decreasing toward the photoconductive layer. Thus, the adhesiveness of the surface layer and the photoconductive layer is improved, and movement of a light carrier to the surface becomes smooth, and besides, the influence of interference due to reflection of the light on the interface between the photoconductive layer and the surface layer can be reduced.

(Intermediate Layer)

In the photosensitive member of the present invention, it is effective to form between the photoconductive layer and the surface layer an intermediate layer (upper blocking layer) having the function of blocking injection of the charges from the surface layer side in the case of the negative charging.

To be more specific, the intermediate layer has so-called polarity dependency wherein it has the function of blocking the charge to be injected from the surface layer side to the photoconductive layer side when the light-receiving layer receives charging treatment of a predetermined polarity on its free surface, and such a function is not performed when it receives charging treatment of the opposite polarity. In order to provide such a function, it is effective to have many atoms for controlling the conductivity contained in the intermediate layer.

The atoms for controlling the conductivity contained in the intermediate layer may be equally and uniformly distributed therein, or there may be the portions where they are contained in a state of nonuniform distribution while they are equally contained in the layer thickness direction.

In either case, however, it is necessary to have them uniformly distributed and equally contained in the in-plane direction parallel to the surface of the substrate also from the viewpoint of making uniform the characteristics in the in-plane direction.

As for the atoms for controlling the conductivity contained in the intermediate layer, so called impurities in the semiconductor field can be named, and the atoms for providing p-type conductivity characteristics belonging to the group 13 of the periodic table (hereinafter, abbreviated as the "group 13 atoms") may be used.

As for such group 13 atoms, to be specific, there are boron (B), aluminum (Al), gallium (Ga), indium (In), thallium (Tl), and so on, and B, Al and Ga are especially preferably.

As for the content of the atoms or controlling the conductivity contained in the intermediate layer in the present invention, while it is determined as being appropriate as desired in order to attain the objects thereof, it should preferably by 10 to $1\times10^4$ atom ppm, more preferably 50 to $5\times10^3$ atom ppm, and optimally $1\times10^2$ to $3\times10^3$ atom ppm.

While it is possible to use any material for the intermediate layer as far as it is the amorphous silicon material, it should preferably be composed of the same material as the surface layer.

To be more specific, the materials such as "a-SiC: H, X," "a-SiO: H, X," "a-SiN: H, X" and "a-SiCON: H, X" are suitably used.

The carbon atoms or the nitrogen atoms or the oxygen atoms contained in the intermediate layer may be equally and uniformly distributed therein, or there may be the portions where they are contained in a state of nonuniform distribution while they are equally contained in the layer thickness direction. In either case, however, it is necessary to have them uniformly distributed and equally contained in the in-plane direction parallel to the surface of the substrate also from the viewpoint of making uniform the characteristics in the in-plane direction.

While the content of the carbon atoms and/or the nitrogen atoms and/or the oxygen atoms contained in the entire area of the intermediate layer in the present invention is determined as appropriate to effectively attain the objects thereof, it should preferably be, in the case of one type as its amount, and in the case of two or more types as the sum thereof, within the range of 10 to 70 percent.

Moreover, while it is necessary in the present invention that the hydrogen atoms and/or the halogen atoms should be contained in the intermediate layer, it is because they are essential for the sake of compensating for unbonded hands of the silicon atoms and improving the layer quality, in particular, the photoconductivity and charge holding characteristics. The hydrogen content should preferably be 30 to 70 atom percent under normal circumstances, more preferably 35 to 65 atom percent, and optimally 40 to 60 atom percent to the sum of the constituting atoms. In addition, as for the halogen content, it should preferably be 0.01 to 15 atom percent under normal circumstances, more preferably 0.1 to 10 atom percent, and optimally 0.5 to 5 atom percent.

As for the layer thickness of the intermediate layer of the present invention, it should preferably be 0.01 to 3 μm, more preferably be 0.03 to 2 μm, and optimally 0.05 to 1 μm from the viewpoints of obtaining the desired electrophotographic characteristics, economic effects and so on. If the layer thickness becomes thinner than 0.01 μm, the force of blocking the charge from the surface side becomes insufficient so that sufficient chargeability cannot be obtained, and if it is thicker than 3 μm, improvement in electrophotographic characteristics cannot be expected, which may rather lead to reduction in sensitivity and so on.

To form the intermediate layer having the characteristics capable of attaining the objects of the present invention, it is necessary, as in the case of the surface layer, to set the mixing ratio between the gas for supplying Si and the gases for supplying C and/or N and/or O, the gas pressure in the reaction container, the discharge power and the substrate temperature as appropriate.

While the optimum range as to the pressure in the reaction container is selected as appropriate according to the layer design, in a normal case, it should preferably be set at $1\times10^{-2}$ to $1\times10^3$ Pa, more preferably $5\times10^{-2}$ to $5\times10^2$ Pa, and optimally $1\times10^{-1}$ to $1\times10^2$ Pa.

Moreover, while the optimum range as to the substrate temperature is selected as appropriate according to the layer design, in a normal case, it should preferably be set at 150 to 350° C., more preferably 180 to 330° C., and optimally 200 to 300° C.

In the present invention, while the above-described ranges can be designated as being desirable numerical ranges of the mixing ratio of the diluting gases, the gas pressure, the discharge power and the substrate temperature for the purpose of forming the intermediate layer, these layer formation factors should not be determined independently and separately under normal circumstances, and so it is desirable to determine the optimum values of the layer formation factors based on the mutual and organic relationship in order to form the surface layer having the desired characteristics.

Figure 9:
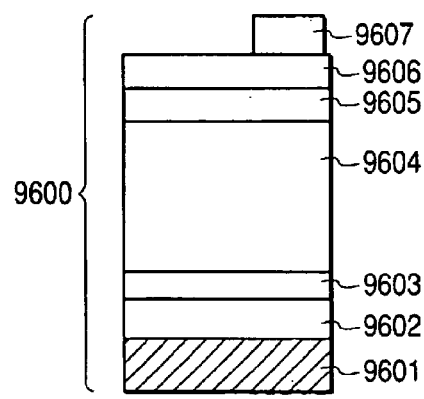
FIG. 9 is a schematic diagram for describing the layer constitution of a photovoltaic element created by the present invention.

FIG. 9 is a schematic diagram for describing the layer constitution of a photovoltaic element produced by the present invention. A photovoltaic element 9600 shown in FIG. 9 has the constitution wherein a light reflection layer 9602, an n-type layer 9603, an i-type layer 9604, a p-type layer 9605 and a clear or transparent electrode layer 9606 are laminated on a substrate 9601 in this order and a collecting electrode 9607 is formed on the clear electrode layer 9606. The light is irradiated to the photovoltaic element 9600 from the clear electrode layer 9606 side.

(Substrate)

The substrate may be comprised of a single conductive material, or it may be a substrate comprised of insulating materials or conductive materials having a conductive layer formed thereon. As for the conductive materials, for instance, metals such as a plated steel sheet, NiCr, stainless steel, Al, Cr, Mo, Au, Nb, Ta, V, Ti, Pt, Pb and Sn, or their alloys can be named.

As for the insulating materials, the synthetic resins such as polyester, polyethylene, polycarbonate, cellulose acetate, polypropylene, polyvinyl chloride, polyvinylidene chloride, polystyrene and polyamide, or glass and ceramics and so on can be named. These insulating substrates may have the conductive layer at least on one of the surfaces thereof, and the semiconductor layer of the present invention is formed on the surface having the conductive layer formed.

For instance, in the case of the glass, a conductive layer comprised of the materials such as NiCr, Al, Ag, Cr, Mo, Ir, Nb, Ta, V, Ti, Pt, Pb, $In_2O_3$, ITO and ZnO or their alloys is formed on the surface, and in the case of a synthetic resin sheet such as a polyester film, a conductive layer comprised of the materials such as NiCr, Al, Cr, Ag, Pb, Mo, Au, Nb, Ta, V, Ti and Pt or their alloys is formed on the surface, and in the case of the stainless steel, a conductive layer comprised of the materials such as NiCr, Al, Ag, Cr, Mo, Ir, Nb, Ta, V, Ti, Pt, Pb, $In_2O_3$, ITO and ZnO or their alloys is formed. As for the formation method, the vacuum evaporation method, sputtering method and screen printing method can be named.

It is desirable that the surface shape of the substrate should be smooth or uneven (texture) with a maximum mountain height of 0.1 to 1.0 $\mu$m. For instance, as one method of texturizing the surface of the stainless steel substrate, there is the method of performing an etching process on the substrate to be processed by using an acid solution. As for the substrate thickness, while it is determined as appropriate to form the desired photovoltaic element, it may be rendered as thin as possible within the range capable of sufficiently showing functions as the substrate in the case where flexibility as the photovoltaic element is required. However, it should usually be 10 $\mu$m from the viewpoint of the mechanical strength in terms of the manufacturing and handling.

(Light Reflection Layer)

A desirable form of the substrate in the photovoltaic element of the present invention may have on the substrate a conductive layer (light reflection layer) comprised of a metal of a high reflection factor with near infrared radiation from visible rays of Ag, Al, Cu, AlSi, CuMg and so on. It is suitable to form the light reflection layer by a method of electrolytic deposition from an aqueous solution such as the vacuum evaporation method and sputtering method. As for the layer thickness of these metals as the light reflection layer, it is preferably 10 nm to 5,000 nm.

A further desirable form of the substrate in the photovoltaic element of the present invention may have on the light reflection layer a clear or transparent conductive layer comprised of ZnO, $SnO_2$, $In_2O_3$, ITO, $TiO_2$, CdO, $Cd_2SnO_4$, $Bi_2O_3$, $MoO_3$, $Na_xWO_3$ and so on. As for the method of forming a clear conductive film, the suitable methods are the vacuum evaporation method, sputtering method, electrolytic deposition method, CVD method, spray method, spin-on method, dipping method and so on. In addition, while the optimum layer thickness is different according to a refractive index of the clear conductive layer, the preferable range of the layer thickness is 50 nm to 10 $\mu$m. Furthermore, to texturize the clear conductive layer, the temperature for forming the clear conductive layer may be made 200 degrees or more in the case of the sputtering method for instance. Moreover, it is effective, in any formation method, to perform the etching on the surface with a weak acid after forming the film from the viewpoint of improving the effects of texturizing.

(Doping Layer (n-type Layer, p-type Layer))

A doping layer is comprised of amorphous silicon or microcrystal silicon semiconductors. As for the amorphous silicon semiconductors, there are a-Si: H, a-SiC: H, a-SiO: H, a-SiN: H, a-SiCO: H, a-SiON: H, a-SiNC: H, a-SiCON: H and so on, and as for the microcrystal silicon semiconductors, there are $\mu$c-Si: H, $\mu$-SiC: H, $\mu$c-SiO: H, $\mu$c-SiN: H, $\mu$c-SiCO: H, $\mu$c-SiON: H, $\mu$c-SiNC: H, $\mu$c-SiCON: H and so on.

The hydrogen atoms (H, D) and the halogen atoms (X) contained in the doping layer compensate for unbonded hands and improve doping efficiency, and the optimum value of the content thereof is 0.1 to 30 atom percent. In particular, in the case where the doping layer contains the microcrystal silicon, the optimum value is 0.01 to 10 atom percent.

On the other hand, in the case where the doping layer contains the carbon, oxygen and nitrogen atoms, the preferable range as to the content thereof is 0.1 atom ppm to 20 atom percent.

It is necessary for the doping layer to contain the atoms for controlling the conductivity for the sake of rendering the conductivity type as the p-type or n-type, and an amount thereof introduced should preferably be within the range of 1,000 atom ppm to 10 atom percent.

In the case of forming a p-type or n-type layer suited to the photovoltaic element, it is suitable to set the substrate temperature at 100 to 400° C. and the pressure at 0.05 to 15Pa in a deposition chamber.

As for the material gases, there are compounds containing the silicon atoms and gasifiable, such as $SiH_4$, $Si_2H_6$, $SiF_4$, $SiFH_3$, $SiF_2H_2$, $SiF_3H$, $SiH_3D$, $SiFD_3$, $SiF_2D_2$, $SiD_3H$ and $Si_2D_3H_3$, and they can be used by adding the impurities for controlling valence electrons, that is, boron compounds such as $B_2H_6$ and $BF_3$ for the n-type and phosphorous compounds such as $PH_3$ for the p-type. In addition, it is feasible to introduce the above-described gasifiable compounds by diluting them as appropriate with gases such as $H_2$, He, Ne, Ar, Xe and Kr. In particular, in the case of depositing the layer whose optical absorption is little or band gas is wide, such as the microcrystal silicon semiconductor or a-SiC: H, it is desirable to dilute the material gases with hydrogen gas by 2 to 100 times so as to introduce the relatively high power.

(i-type Layer)

In the photovoltaic element, the i-type layer is an important layer for generating and transporting the carriers when exposed to irradiation, and is comprised of the amorphous silicon or microcrystal silicon semiconductors. As for the amorphous silicon semiconductors, there are a-Si: H, a-SiC: H, a-SiO: H, a-SiN: H, a-SiCO: H, a-SiON: H, a-SiNC: H, a-SiCON: H and so on, and as for the microcrystal silicon semiconductors, there are $\mu$c-Si: H, $\mu$c-SiC: H, $\mu$c-SiO: H, $\mu$c-SiN: H, $\mu$c-SiCO: H, $\mu$c-SiON: H, $\mu$c-SiNC: H, $\mu$c-SiCON: H and so on. As for the i-type layer, those that are slightly the p-type or slightly the n-type may also be used.

In addition, it is preferable that a valence electron control material to be a donor and a valence electron control material to be an acceptor should simultaneously be doped into the i-type layer.

The hydrogen atoms (H, D) or the halogen atoms (X) contained in the i-type layer compensate for unbonded hands in the i-type layer and improve the product of a degree of carrier movement and life in the i-type. Moreover, they have the effects of compensating for an interface level of each interface of the p-type and i-type layers and improving a photovoltaic force, a photoelectric current and optical responsiveness of the photovoltaic element. The optimum content of the hydrogen atoms and/or the halogen atoms contained in the i-type layer is 1 to 40 atom percent. In particular, a preferable distribution state is one in which much of the content of the hydrogen atoms and/or the halogen atoms is distributed on each interface side of the p-type and i-type layers, and the preferable range of the content of the hydrogen atoms and/or the halogen atoms in the neighborhood of the interface is 1.1 to 2 times that in a bulk. Furthermore, it is preferable that the content of the hydrogen atoms and/or the halogen atoms changes according to the content of the silicon atoms. The preferable range of the content of the hydrogen atoms and/or the halogen atoms is 1 to 10 percent in the area of the minimum content of the silicon atoms, which is 0.3 to 0.8 times that in the area of the maximum content of the hydrogen atoms and/or the halogen atoms.

Although the layer thickness of the i-type layer significantly depends on the structure of the photovoltaic element and the band gap of the i-type layer, the optimum layer thickness is 0.05 to 1.0 μm.

In the case of forming the i-type layer suitable for the photovoltaic element, it is preferable to set the substrate temperature at 100 to 400° C. and the pressure at 0.05 to 15 Pa in the reaction container.

As for the material gases, the compounds containing the silicon atoms and being gasifiable, such as $SiH_4$, $Si_2H_6$, $SiF_4$, $SiFH_3$, $SiF_2H_2$, $SiF_3H$, $SiH_3D$, $SiFD_3$, $SiF_2D_2$, $SiD_3H$ and $Si_2D_3H_3$ can be named. They can be used by adding the impurities for controlling valence electrons, that is, boron compounds such as $B_2H_6$ and $BF_3$ and phosphorous compounds such as $PH_3$. In addition, it is feasible to introduce the above-described gasifiable compounds to the deposition chamber by diluting them as appropriate with gases such as $H_2$, He, Ne, Ar, Xe and Kr. In particular, in the case of depositing the layer whose optical absorption is little or band gap is wide, such as the microcrystal silicon semiconductor or a-SiC: H, it is preferable to dilute the material gases with hydrogen gas by 2 to 100 times so as to introduce the relatively high power.

(Clear Electrode Layer)

As for the materials of the clear or transparent electrode layer, an indium oxide ($In_2O_3$) a tin oxide ($SnO_2$) and an ITO ($In_2O_3$—$SnO_3$) are suitable materials, and fluorine may also be contained therein. As for the method of depositing the clear electrode layer, the sputtering method or the vacuum evaporation method is optimum.

For instance, in the case of deposition by the sputtering method, it is used by combining the targets such as a metal target or an oxide target, and the preferable range of the substrate temperature is 20 to 600° C. Moreover, the gas for sputtering in the case of depositing the clear electrode by the sputtering method, the inert gases such as the Ar gas can be named. The rate of depositing the clear electrode depends on the pressure and discharge pressure in discharge space, and the optimum deposition rate is within the range of 0.01 to 10 nm/sec.

It is preferable that the clear electrode should be deposited so as to have a layer with a thickness enough to satisfy requirements of a reflection reducing film. As for the concrete layer thickness of the clear electrode, it is preferably 50 to 500 nm.

(Collecting Electrode)

In order to have more light incident on the i-type layer that is a photovoltaic layer and efficiently collect generated carriers on the electrode, the shape (one seen from an incident direction of the light) and the material of the collecting electrode is important. Under normal circumstances, a comb shape is used as the shape of the collecting electrode, and its line breadth and number of lines are determined by the shape and size of the photovoltaic element seen from the light incidence direction and the material of the collecting electrode and so on. The line breadth is normally 0.1 to 5 mm or so. As for the material of the collecting electrode, Fe, Cr, Ni, Au, Ti, Pd, Ag, Al, Cu, AlSi, C (graphite) and so on are used, and the metals of little resistivity such as Ag, Cu, Al, Cr and C or their alloys are suitable under normal circumstances. As for the layer structure of the collecting electrode, it may be either comprised of a single layer or comprised of a plurality of layers. These metals should preferably be formed by the vacuum evaporation method, sputtering method, plating method, printing method and so on. As for the layer thickness, 10 nm to 0.5 mm is suitable.

Figure 10A:
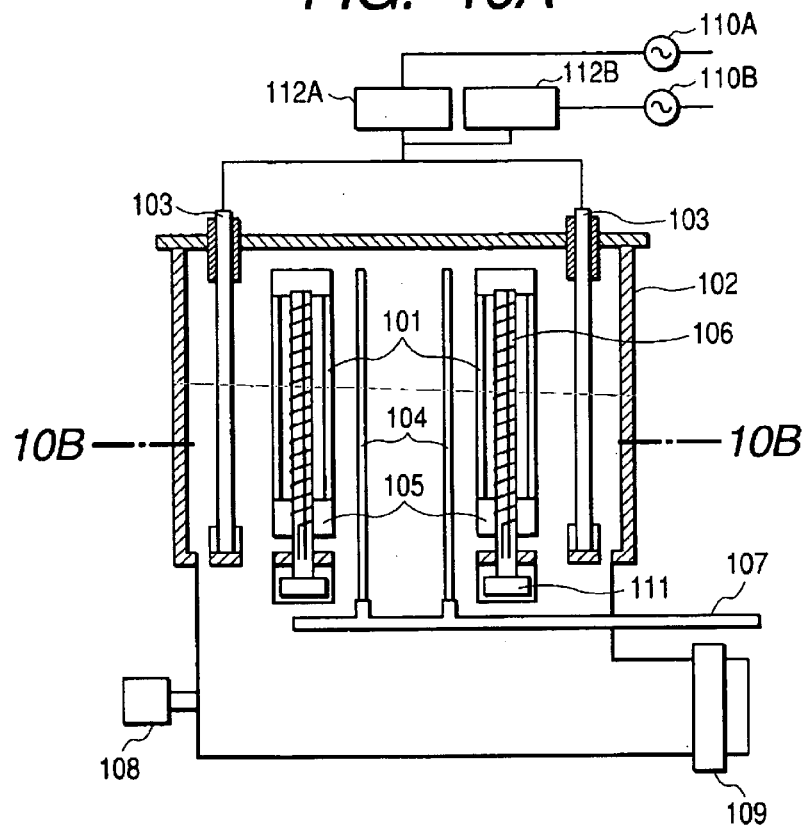
FIGS. 10A and 10B are schematic diagrams describing an apparatus of manufacturing electrophotographic light-receiving members using a plasma CVD method that is an example of a vacuum processing apparatus of the present invention.
Figure 10B:
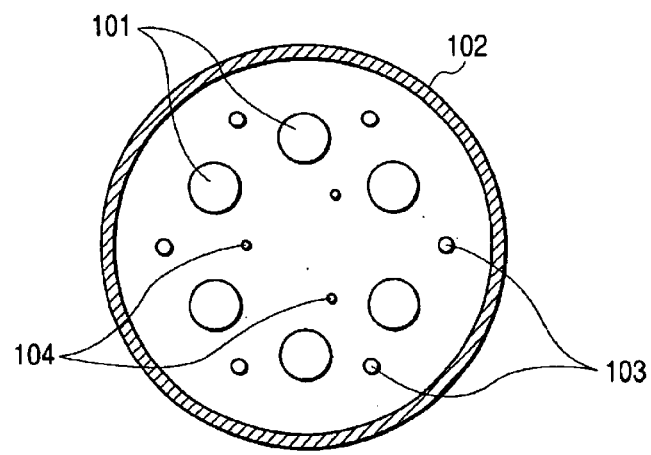

FIG. 10A is an example of the schematic diagram of a manufacturing apparatus of electrophotographic photosensitive members by a plasma CVD method that is used in the present invention, wherein FIG. 10A is a side view of a reaction container 102 for accommodating substrates 101 that are articles to be processed and forming the deposited film thereon, and FIG. 10B is a cross-sectional view of the apparatus taken along the line 10B—10B. On the same circumference having the same central axis as the reaction container 102, a plurality of material gas introduction means 104 and substrates 101 are disposed also serving as discharge electrodes to be placed as if surrounding substrate heaters 106, and a plurality of substrate supporting means 105 rotatable by a rolling mechanism 111 and a plurality of plasma generation high-frequency electrodes 103 are disposed in the reaction container 102.

An example of the deposited film formation method according to the present invention implemented by using the apparatus shown in FIGS. 10A and 10B will be described below.

After placing the substrates 101 in the reaction container 102, evacuation in the reaction container 102 is performed by using the exhauster (such as a vacuum pump). After sufficiently exhausting the air from inside the reaction container 102, the required gases for heating out of those supplied from the gas cylinders of He, $N_2$, Ar, $H_2$ and so on in the gas supply apparatus (not shown) are adjusted to an appropriate flow rate via the pressure regulators and the massflow controllers, and are fed into the reaction container 102 via gas piping 107 and the material gas introduction means 104. The pressure inside the reaction container 102 after admission of the gases for heating is monitored by pressure measurement means 108, and is controlled to have the predetermined value by adjusting opening of a throttle valve 109 and so on. If a predetermined substrate heating environment is ready, the substrates 101 are indirectly heated by the substrate heaters 106 to a predetermined temperature.

After completing the predetermined heating, the required gases for deposited film formation out of those supplied from the gas cylinders of $SiH_4$, $H_2$, $CH_4$, $B_2H_6$, $PH_3$ and so on in the gas supply apparatus (not shown) are adjusted to the appropriate flow rate via the pressure regulators and the massflow controllers and so on, and are sent into the reaction container 102 via the gas piping 107 and the material gas introduction means 104. The pressure in the reaction container 102 after admission of the gases for deposited film formation is monitored by the pressure measurement means 108, and is controlled to be the predetermined value by adjusting the opening of the throttle valve 109 and so on. If a predetermined deposited film formation environment is ready, a first high-frequency power supply 110A and a second high-frequency power supply 110B of different frequencies are connected, and are once synthesized after going through a first matching circuit 112A and a second matching circuit 112B respectively, and then are branched and applied to a plurality of the plasma generation high-frequency electrodes 103 so as to generate the plasma. The gases for deposited film formation is decomposed by the plasma so as to form deposited films on the substrates 101.

Moreover, while two power supplies capable of outputting two high-frequency powers of different frequencies are used in FIG. 10A, there may be three or more power supplies in the case of using three or more frequencies. In addition, in the case of using the power supply capable of outputting the high-frequency power having a plurality of frequencies synthesized in advance, there may be just one power supply. In consideration of output stability of the high-frequency power and so on, however, it is desirable to synthesize the high-frequency powers after the plurality of high-frequency powers went through the first and second matching circuit 112A and 112B respectively, and as shown in FIG. 10A, the constitution is desirable, wherein the high-frequency powers are supplied from the first and second high-frequency electrodes 110A and 110B capable of outputting the high-frequency powers of the respective frequencies that are used, and the high-frequency powers are synthesized after going through the first and second matching circuit 112A and 112B respectively.

In addition, as for the means for branching the high-frequency powers used in the present invention, any means may be used as long as it is capable of dividing the powers uniformly, but it is desirable to render the distance from a branch point of the high-frequency powers to each plasma generation high-frequency power supply equal.

Figure 11A:
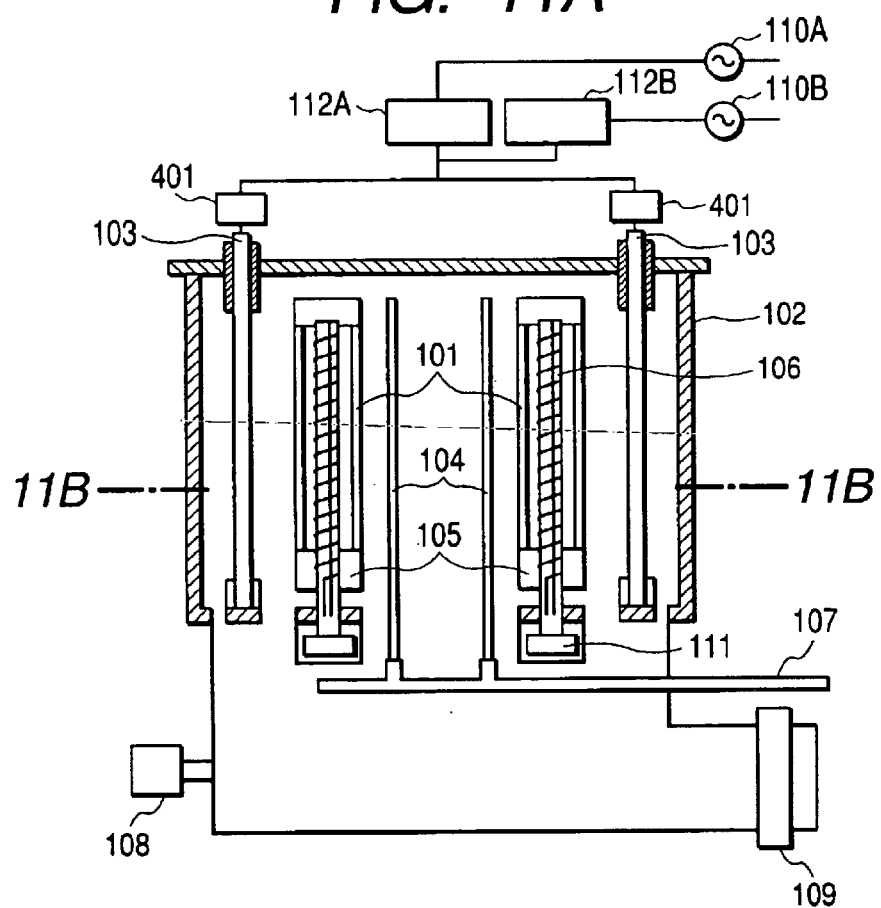
FIGS. 11A and 11B are schematic diagrams describing an apparatus of manufacturing the electrophotographic light-receiving members using the plasma CVD method that is another example of the vacuum processing apparatus of the present invention.
Figure 11B:
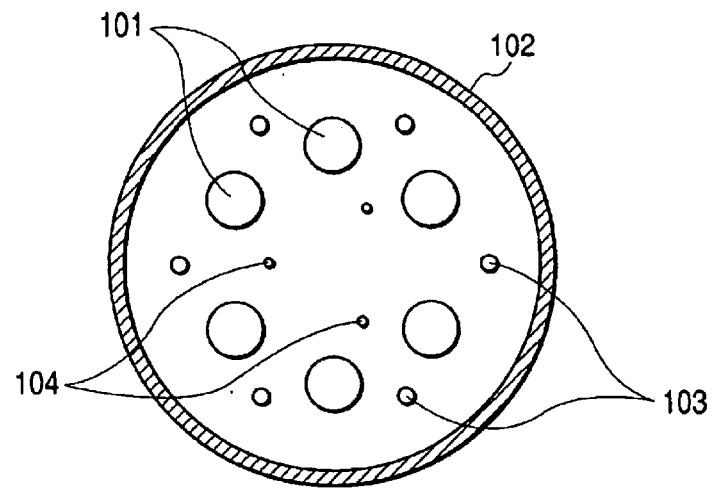

Moreover, as shown in FIG. 11A, it is possible in the present invention to render the effects of the present invention more remarkable by disposing an auxiliary matching circuit 401 on the feeding side of each of the plasma generation high-frequency electrodes, and while a generally available capacitor such as a ceramic capacitor may be used in the case of using the capacitor of the fixed capacity as the auxiliary matching circuit 401, it may also have the constitution wherein the capacity is provided by putting an insulating member in the transmission routes after branching the high-frequency powers. FIG. 11B is the cross-sectional view of the apparatus taken along the line 11B—11B in FIG. 11A.

While there is no particular limitation on the surface quality of the plasma generation high-frequency electrode used in the present invention, it is desirable, in the constitution wherein the plasma generation high-frequency electrodes 103 are disposed inside the reaction container 102, that the surface thereof is roughened from the viewpoint of preventing film peeling, and to be more specific, it should preferably be within the range from 5 $\mu$m to 200 $\mu$m in 10-point average roughness (Rz) with reference to 2.5 mm. Furthermore, it is effective to have the surface of the plasma generation high-frequency electrode 103 covered with the ceramic material from the viewpoint of improving the adhesiveness of the deposited film. While there is no particular limitation as to the concrete means of coating, the surface may be coated by the CVD method or the thermal spraying, for instance, or it is also feasible to have the constitution of covering the plasma generation high-frequency electrode 103 with a nonadhesive ceramic member. As for concrete ceramic materials, alumina, zirconia, mullite, cordierite, silicon carbide, boron nitride, aluminum nitride and so on can be named, and among them, alumina, boron nitride and aluminum nitride are preferable since they are good as to the electric characteristics such as dielectric dissipation and insulation resistance and absorb little high-frequency power.

Figure 12A:
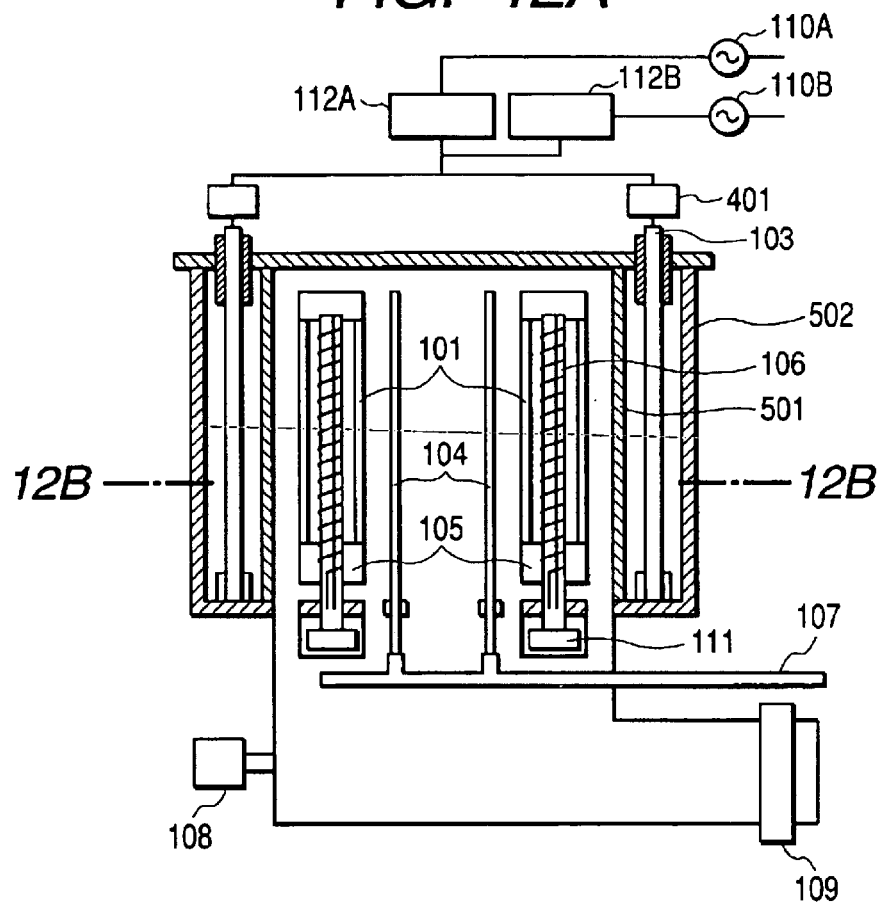
FIGS. 12A and 12B are schematic diagrams describing an apparatus of manufacturing the electrophotographic light-receiving members using the plasma CVD method that is a further example of the vacuum processing apparatus of the present invention.
Figure 12B:
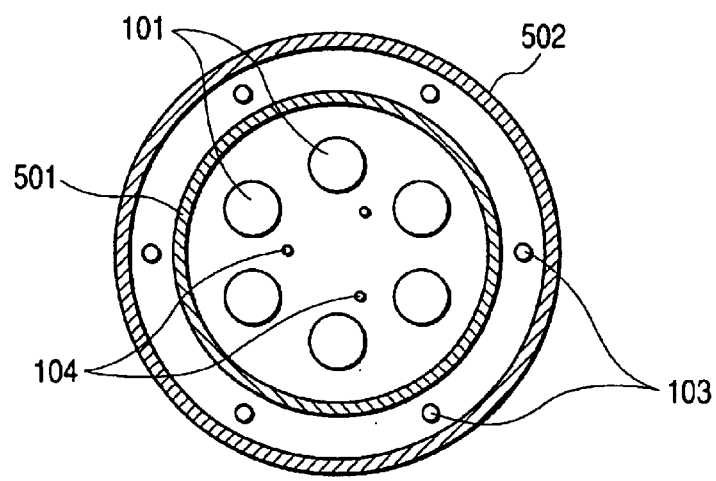

In addition, as shown in FIG. 12A, according to the present invention, it is possible to obtain a more remarkable effect by placing the plasma generation high-frequency electrodes 103 outside the reaction container partially comprised of a dielectric member 501. FIG. 12A is an example of the schematic diagram of the apparatus of manufacturing the electrophotographic photosensitive members by the plasma CVD method in the case of placing the plasma generation high-frequency electrodes 103 outside the reaction container 102 partially comprised of the dielectric member 501 having the same central axis as the dielectric member 501, a plurality of material gas introduction means 104 and substrates 101 are disposed also serving as discharge electrodes as if to surround the substrate heaters 106, and a plurality of substrate supporting means 105 rotatable by a rolling mechanism 111 are disposed and furthermore, a plurality of the plasma generation high-frequency electrodes 103 are disposed on the circumference outside the dielectric member 501 having the same central axis as the dielectric member 501. Moreover, an earth shield 502 is disposed outside the plasma generation high-frequency electrodes 103 for the purpose of preventing leakage of the high-frequency powers to the outside. FIG. 12B is the cross-sectional view of the apparatus taken along the line 12B—12B in FIG. 12A.

While there is no particular limitation on the surface quality of the side on which the dielectric member used in the present invention is exposed to the plasma, it is desirable that it should be roughened from the viewpoint of preventing film peeling, and to be more specific, it should preferably be within the range from 5 $\mu$m to 200 $\mu$m in 10-point average roughness (Rz) with reference to 2.5 mm. In addition, it is preferable that the dielectric member 501 should be made of the ceramic material, and to be more specific, alumina, zirconia, mullite, cordierite, silicon carbide, boron nitride, aluminum nitride and so on can be named, and among them, alumina, boron nitride and aluminum nitride are preferable since they are good as to the electric characteristics such as dielectric dissipation and insulation resistance and absorb little high-frequency power.

Figure 13A:
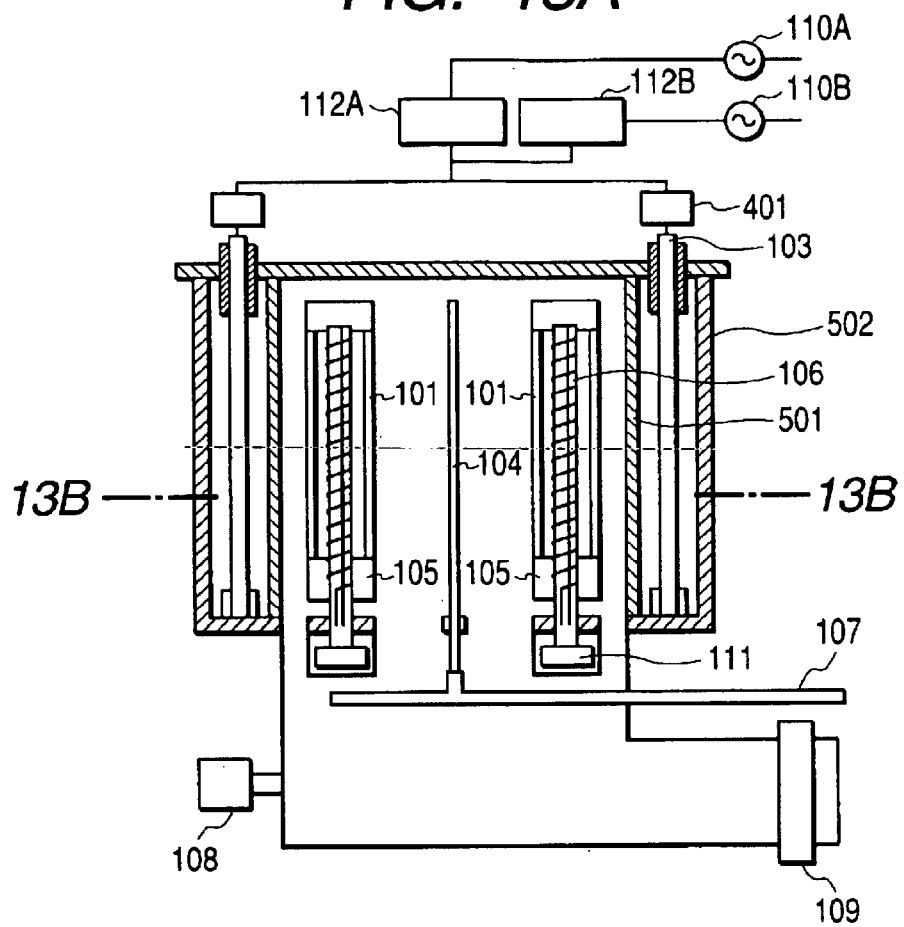
FIGS. 13A and 13B are schematic diagrams describing an apparatus of manufacturing electrophotographic photosensitive members using the plasma CVD method that is a still further example of the vacuum processing apparatus of the present invention.
Figure 13B:
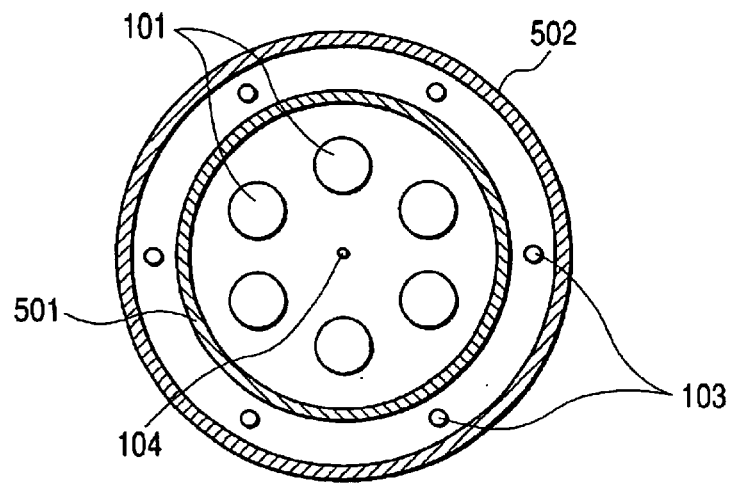

Moreover, it is possible in the present invention to use a single material gas introduction means 104 due to the effects of the present invention as shown in FIG. 13A. FIGS. 13A and 13B are examples of the schematic diagram describing the apparatus of manufacturing the electrophotographic photosensitive members by the plasma CVD method in the case where the material gas introduction means 104 are made one, where one material gas introduction means 104 is disposed at the center of the dielectric member 501 also serving as the reaction container, and on the circumference in the dielectric member 501 whose central axis is the material gas introduction means 104, substrates 101 are disposed also serving as discharge electrodes as if surrounding the substrate heaters 106, and a plurality of the substrate supporting means 104 rotatable by a rolling mechanism 111 are disposed and furthermore, a plurality of the plasma generation high-frequency electrodes 103 are disposed on the circumference outside the dielectric member having the same central axis as the dielectric member 501. Moreover, an earth shield 501 is disposed outside the plasma generation high-frequency electrodes 103 for the purpose of preventing the leakage of the high-frequency powers to the outside. FIG. 13B is the cross-sectional view of the apparatus taken along the line 13B—13B in FIG. 13A.

In addition, it is preferable that the material gas introduction means used in the present invention should be placed in parallel with the substrate from the viewpoint of preventing film thickness from becoming uneven. Furthermore, it is preferable that the surface of the material gas introduction means should be roughened from the viewpoint of preventing film peeling, and to be more specific, it should preferably be within the range from 5 $\mu$m to 200 $\mu$m in 10-point average roughness (Rz) with reference to 2.5 mm.

Embodiments

The vacuum processing method of the present invention will be described further in detail hereafter by showing its embodiments. However, the scope of the present invention will by no means be restricted by these embodiments.

First, the following first to fifth exemplary experiments conducted to verify the effects obtainable from the present invention will be described.

(Exemplary Experiment 1)

In this exemplary experiment, the apparatus shown in FIG. 2 was used to form the amorphous silicon deposited film on the conditions shown in Table 1. Polished glass (Corning #7059) of 1×1.5 inches (25×38 mm) was used as the substrate to be processed 2113, and this was installed as the 10 substrates of 1×1.5 inches (25×380 mm) arranged in the lengthwise direction at the center of the substrate stage 2120 of which length in the longer direction is 450 mm. The high-frequency power electrode 2114 is an alumina-sprayed stainless bar of which diameter is 10 mm and length is 500 mm, which was placed in parallel with the substrate 2113 at a distance of 60 mm therefrom.

The high-frequency power supplies 2116 and 2117 are comprised of a signal generator and amplifier respectively, and have a constitution capable of changing the oscillation frequencies. The amplifier of a first high-frequency power supply 2116 was adjusted to be capable of amplifying 50 MHz, and that of a second high-frequency power supply 2117 was adjusted to be capable of amplifying 30 MHz.

The apparatuses thus configured were used to form a deposited film as outlined below.

First, the reaction container 2111 was evacuated through an exhaust pipe 2112 by an evacuation system not shown. Subsequently, the substrate 2113 was heated and controlled to reach 250° C. by a heating element 2120a while supplying Ar gas of which flow rate is 500 ml/min (normal) into a reaction container 2111 from a material gas supply means 2118.

Figure 4:
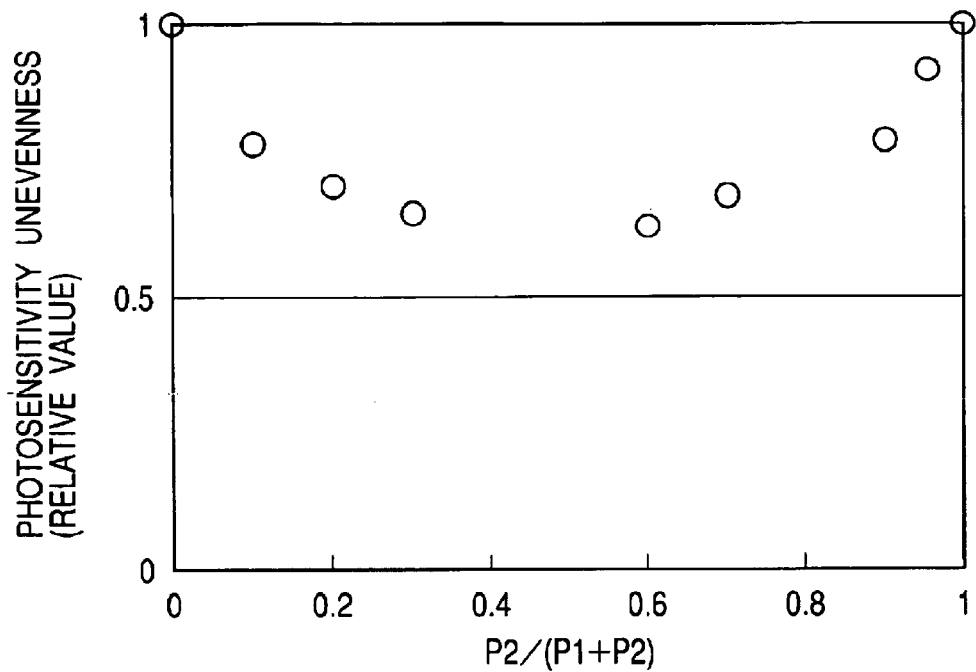
FIG. 4 is a graph showing a degree of unevenness of a deposited film in the long length direction according to the exemplary experiment 1 of the present invention.

Next, after the supply of the Ar gas was stopped and the reaction container 2111 was evacuated by the evacuation system not shown, the deposited film composed of hydrogenated amorphous silicon was deposited on the substrate 2113 by 1 μm or so on the deposited film formation conditions shown in Table 1. At this time, the deposited film was formed at nine different power ratios by setting the total power of the two high-frequency power supplies 2116 and 2117 to be 500 W and changing the ratio of the power (power ratio) supplied from the second high-frequency power supply 2117 to the total power to be 0 to 1 as shown in FIG. 4.

After forming the deposited film, the reaction container 2111 was purged with Ar gas, and then the deposited film was taken out by leaking $N_2$ gas, and a comb-shaped mask having a gap of 250 μm was put on the deposited film so as to form a comb-shaped electrode on the surface of this deposited film by depositing Cr of 1,000 Å in the normal vacuum evaporation method.

TABLE 1

| Gas type and flow rate | |
| --- | --- |
| $SiH_4$ (ml/min (normal)) | 120 |
| $H_2$ (ml/min (normal)) | 50 |
| Substrate temperature (° C.) | 250 |
| Internal pressure (Pa) | 0.7 |
| 1st high-frequency power f1 (MHz) | 50 |
| 2nd high-frequency power f2 (MHz) | 30 |
| Total power (W) | 500 |

TABLE 1-continued

| Power ratio P2/(P1 + P2) | 0 to 1 (*1) |
| --- | --- |
| Film thickness (μm) | 1 |

(*1) See FIG. 4.

Next, the photosensitivity of the deposited film was evaluated. Here, the photosensitivity is defined by using light conductivity σp and dark conductivity σd.

The light conductivity σp is the conductivity when an He—Ne laser (wavelength 632.8 nm) of 1 mW/cm² strength is irradiated, and the dark conductivity σd is the conductivity when no light is irradiated. At this time, the photosensitivity is represented by the ratio between them, but the comparison is not simple because the conductivity value may change in a few digits, so that it is defined as follows.

Photosensitivity=log (σp/σd)

It shows that the higher this photosensitivity value is, the better the deposited film characteristics are.

It is possible to evaluate the uniformity of the deposited film in the longer direction by performing such measurement on the ten substrates 2113. Of the ten substrates, the ratio between the portion of the best photosensitivity and the portion of the worst photosensitivity was evaluated as the unevenness of the photosensitivity in the longer direction.

The obtained evaluation results are shown in FIG. 4. FIG. 4 represents the degree of the "unevenness" in the case of taking as an abscissa axis P2/(P1+P2)=0, i.e., the ratio of the second high frequency power based on the value of the unevenness in the longer direction of the deposited film formed by only using the high-frequency power of 50 MHz. FIG. 4 shows that the degree of the "unevenness" is good in the case where the value of the photosensitivity unevenness is lower than 1, and the degree of the "unevenness" is bad in the case where the value is higher than 1.

From the results shown in FIG. 4, it was found out that the "unevenness" is a little in such a range that the ratio of the high-frequency power (30 MHz) supplied from the second high-frequency power 2117 to the total power is 0.1 to 0.9, and in particular, the "unevenness" is less in such a range that the ratio is 0.2 to 0.7 so that the effects of the present invention can be exhibited to the maximum.

In addition, although almost no influence appeared on the results with the apparatus and processing conditions used in this exemplary experiment, a matching adjustment had to be made several times in the case where the ratio of the high-frequency power supplied from the second high-frequency power 2117 was 0.7 or higher. This is considered to be sign that the discharge situation may become unstable. On the other hand, in the case where the above ratio is 0.6 or lower, almost no adjustment was required after making the matching adjustment once. As a result of this experiment, it was verified that there are desirable ratios of the high frequency powers of different frequencies and the range is "f2/f1" or lower.

As mentioned above, it was verified by the present invention that it is possible to reduce the characteristic unevenness of the deposited film.

(Exemplary Experiment 2)

In this exemplary experiment, the apparatus shown in FIG. 2 was used to form a hydrogenated amorphous silicon carbide film. The placement of the substrates 2113, the high-frequency power electrode 2114, and so on, was the same as the exemplary experiment 1.

For the high-frequency power supplies 2116 and 2117, those comprised of the signal generator and the amplifier capable of changing the frequencies were used just as in the exemplary experiment 1, and the oscillation frequencies thereof were variously changed to conduct this exemplary experiment.

In this exemplary experiment, the total power of the first high-frequency power supplied from the first high-frequency power supply 2116 and the second high-frequency power supplied from the second high-frequency power supply 2117 was 400 W, and the ratio of the second high-frequency power to the total power was 0.4. As for the frequencies, the frequency f1 of the first high-frequency power was changed to be in the range of 10 MHz to 300 MHz and the frequency f2 of the second high-frequency power was so changed as to be 0.6 times as high as f1. When changing the frequencies, the amplifier and the matching box 2115 were optimized.

The high-frequency power supplies 2116 and 2117 thus set were used to perform the film deposition on the conditions shown in Table 2 so as to deposit the hydrogenated amorphous silicon carbide film of which film thickness is 1 μm on the substrate 2113.

TABLE 2

| Gas type and flow rate | |
| --- | --- |
| SiH$_4$ (ml/min (normal)) | 25 |
| CH$_4$ (ml/min (normal)) | 75 |
| Substrate temperature (° C.) | 230 |
| Internal pressure (Pa) | 10 |
| 1st high-frequency power f1 (MHz) | 10 to 300 (*2) |
| 2nd high-frequency power f2 (MHz) | 0.6 times f1 |
| Total power (W) | 400 |
| Power ratio P2/(P1 + P2) | 0.4 |
| Film thickness (μm) | 1 |

Figure 5:
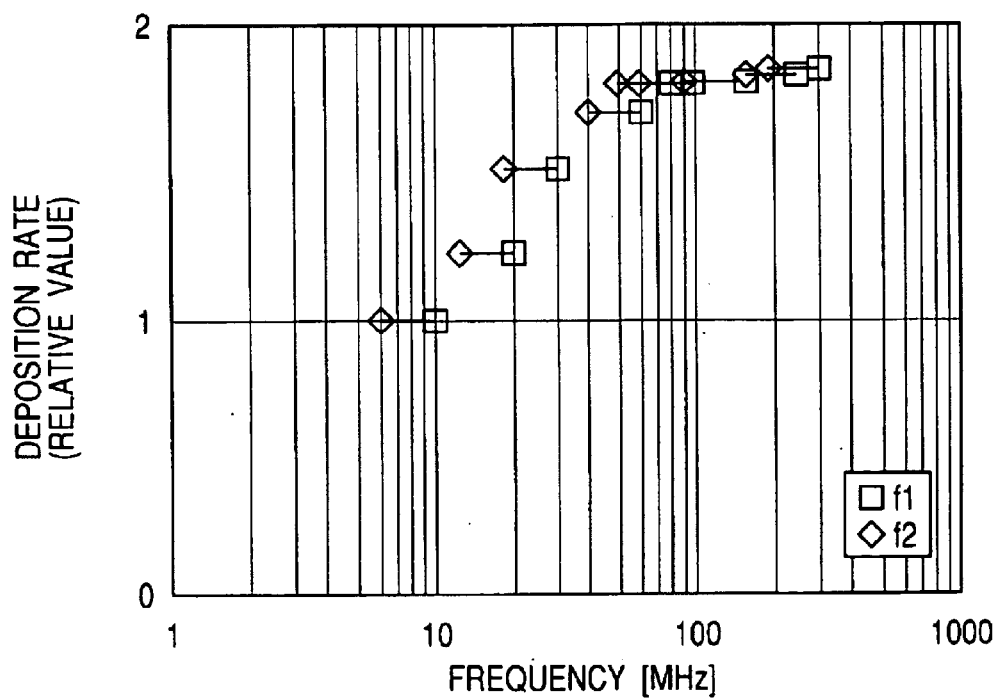
FIG. 5 is a graph showing relative values of deposition rate with reference to the deposition rate in the case where a frequency f1 of a first high-frequency power is 10 MHz (f2 is 6 MHz) in the exemplary experiment 2 of the present invention.
Figure 6:
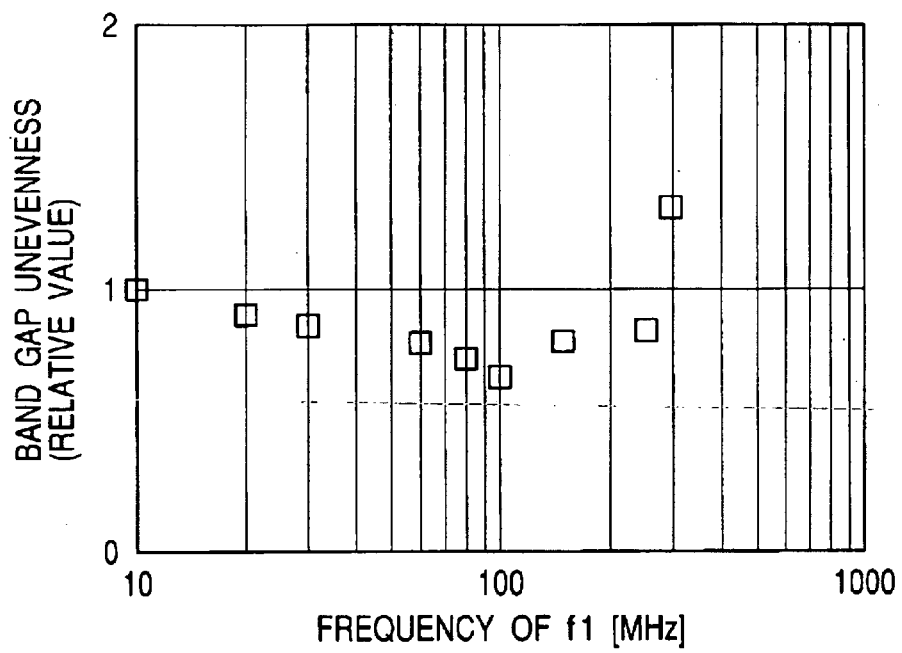
FIG. 6 is a graph showing the degree of unevenness of the deposited film in the long length direction according to the exemplary experiment 2 of the present invention.

(*2) See FIGS. 5 and 6.

First, for the substrate at the center, the deposition rate in the case of this exemplary experiment was estimated. The results thereof are shown in FIG. 5.

In FIG. 5, the abscissa axis measures frequencies f1 and f2, and the ordinate axis measures relative values of the deposition rate based on the deposition rate in the case where the frequency f1 is 10 MHz (f2 is 6 MHz). As seen from FIG. 5, the deposition rate increases as the frequency becomes higher. It was found that, in particular, the deposition rate remarkably increases in such a range that both the two high frequencies f1 and f2 exceed 30 MHz.

Next, an optical energy band gap (Egopt) of the deposited films formed by this exemplary experiment was evaluated. A spectrophotometer for the ultraviolet and visible region (V-570 manufactured by Nippon Bunko) was used for measurement, and the wavelength range was 250 to 2,500 nm. The Egopt was obtained by using the ordinary Tauc plot (the relation between hv and $(\alpha h v)^{1/2}$ is obtained, and the value of an intercept of an hv axis is defined as Egopt) based on an absorption coefficient α in each acquired wavelength.

It is possible to evaluate the uniformity of the deposited films in the longer direction by performing this measurement on the ten substrates 2113. Of the measured values of the ten substrates 2113, the difference between the portion in which the Egopt is the largest and the portion in which it is the smallest was considered as the unevenness of the Egopt in the longer direction. The evaluation was made as to the respective deposited films of different frequencies of the high-frequency powers used on formation.

The obtained evaluation results are shown in FIG. 6. FIG. 6 represents the degree of the "unevenness" in the case where the abscissa axis is of the frequency of the high-frequency power (FIG. 6 shows only f1) based on the value of the unevenness in the longer direction of the deposited films formed on the condition that the frequency f1 of the high-frequency power is 10 MHz (f2 is 6 MHz). It shows that the degree of the "unevenness" is good in the case where the value of the "unevenness" of the vertical axis is less than 1, and it is bad in the case where the value is higher than 1.

As seen from FIG. 6, the degree of the "unevenness" becomes good in the case where the frequencies f1 and f2 are 10 MHz to 250 MHz, and in particular, it becomes still better in the case where they are 30 MHz to 250 MHz.

As mentioned above, it was verified that using the present invention, it is possible to reduce the characteristic unevenness of the deposited films while improving the deposition rate, and it was found out that the desirable range of the frequencies of the high-frequency powers is 10 MHz to 250 MHz, and in particular, the effects of the present invention can be exhibited to the maximum in the range of 30 MHz to 250 MHz.

(Exemplary Experiment 3)

In this exemplary experiment, the apparatus shown in FIG. 2 was used to form the amorphous silicon deposited film. The placement of the substrates 2113, the high-frequency power electrode 2114 and so on was the same as the exemplary experiment 1.

In this exemplary experiment, the experiment was performed by fixing the oscillation frequency f1 of the first high-frequency power supply 2116 at 100 MHz and variously changing the oscillation frequency f2 of the second high-frequency power supply 2117. For the high-frequency power supplies 2116 and 2117, those comprised of the signal generator and the amplifier capable of changing the frequencies were used just as in the exemplary experiment 1, and adjustments were made to the amplifier and the matching box 2115 each time the oscillation frequency f2 of the second high-frequency power supply 2117 was changed.

In this exemplary experiment, the total power of the first high-frequency power supplied from the first high-frequency power supply 2116 and the second high-frequency power supplied from the second high-frequency power supply 2117 was 500 W, and the ratio of the second high-frequency power to the total power was 0.3. The oscillation frequency f2 of the second high-frequency power supply 2117 was changed to eight different frequencies from 10 MHz to 95 MHz, and the hydrogenated amorphous silicon deposited film was formed on the conditions shown in Table 3, and taken out just as in the exemplary experiment 1, then the comb-shaped electrode was formed on the deposited film thereafter.

TABLE 3

| Gas type and flow rate | |
| --- | --- |
| SiH$_4$ (ml/min (normal)) | 100 |
| H$_2$ (ml/min (normal)) | 100 |
| Substrate temperature (° C.) | 260 |
| Internal pressure (Pa) | 0.7 |
| 1st high-frequency power f1 (MHz) | 100 |
| 2nd high-frequency power f2 (MHz) | 10 to 95 (*3) |
| Total power (W) | 500 |
| Power ratio P2/(P1 + P2) | 0.3 |
| Film thickness (μm) | 1 |

Figure 7:
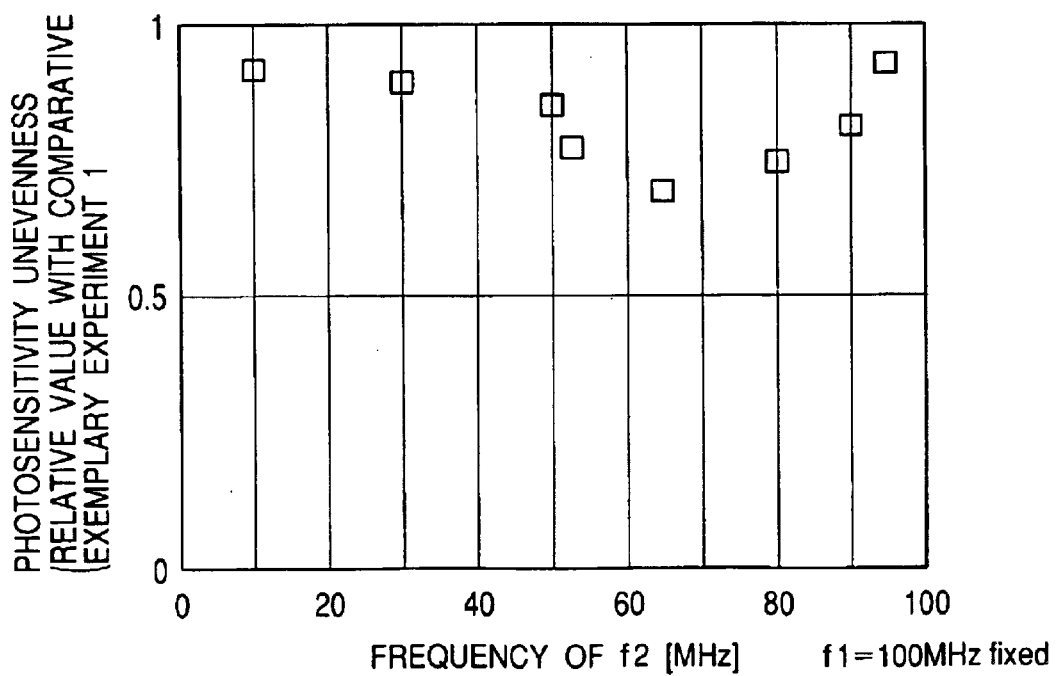
FIG. 7 is a graph showing the degree of unevenness of the deposited film in the long length direction according to the exemplary experiment 3 of the present invention.

(*3) See FIG. 7.

(Exemplary Experiment for Comparison 1)

The amorphous silicon deposited film was formed by using the apparatus shown in FIG. 2 as an example for comparison just as in this exemplary experiment.

In order to verify the effects of superimposing the second high-frequency power on the first high-frequency power, only the first high-frequency power supply 2116 of which oscillation frequency f1 is 100 MHz was used as the high-frequency power to be applied excluding the second high-frequency power supply 2117. The total power value, i.e., the power value P1, of the high-frequency power in this case was 500 W which is the same as in the exemplary experiments. The film deposition was carried out on the conditions shown in FIG. 3 to form the amorphous silicon film of which thickness was about 1 μm on the substrate 2113.

Next, evaluation was made on the unevenness of the photosensitivity of the deposited films formed in the exemplary experiments and this exemplary experiment for comparison. The evaluation method was the same as that of the exemplary experiment 1.

The obtained evaluation results are shown in FIG. 7. FIG. 7 represents the degree of the "unevenness" in the case where the abscissa axis is of the frequency of the second high-frequency power, based on the value of unevenness in the longer direction of the deposited film formed in this exemplary experiment for comparison. It shows that the degree of the "unevenness" is better than the exemplary experiment for comparison in the case where the value of the photosensitivity unevenness is lower than 1, and the degree of the "unevenness" is worse than that in the case where the value is higher than 1.

From the results shown in FIG. 7, it was found that the photosensitivity unevenness could be suppressed in the case where the frequency f2 is in the range of 10 to 95 MHz, and in particular, the photosensitivity unevenness could further be suppressed in the case where the frequency f2 is in the range of 53 to 90 MHz.

From the above results, it was verified that the effects of the present invention are obtained in the case where the frequency of the second high-frequency power is at least 10 MHz and less than the frequency of the first high-frequency power, and the frequencies f1 and f2 should preferably satisfy the following relation:

$$0.5 < f_2/f_1 \leq 0.9.$$

(Exemplary Experiment 4)

In this exemplary experiment, the apparatus shown in FIG. 2 was used to form the amorphous silicon deposited film. At this time, the third high-frequency power supply (not shown) was further connected to the matching box 2115. In addition, the placement of the substrates 2113 and the high-frequency power electrode 2114 and so on was the same as in the exemplary experiment 1.

In this exemplary experiment, the deposition conditions shown in Table 1 (deposition conditions of the exemplary experiment 1) were used. However, the power ratio of the second high-frequency power (30 MHz) to the total power was set at "0.6", which is the condition of the lowest degree of the "unevenness" in the exemplary experiment 1. To be more specific, the power of the first high-frequency power (50 MHz) was 200 W, and the power of the second high-frequency power (30 MHz) was 300 W.

In this exemplary experiment, the amorphous silicon film of which thickness is 1 μm was deposited on the substrate 2113 in a state that the third high-frequency power of which frequency is 70 MHz and power value is 70 W was further added.

The film obtained was evaluated in the same way as in the exemplary experiment 1 and compared with the evaluation results of the "unevenness" in the conditions equivalent to those in the exemplary experiment 1. As a result, the unevenness characteristic was improved by about 5 percent when compared with that in the equivalent conditions.

Thus, it was verified that the effects of the present invention could be obtained by superimposing at least two high-frequency powers of different frequencies, and also obtained by further adding a high-frequency power of a different frequency thereto.

(Exemplary Experiment 5)

In this exemplary experiment, the apparatus shown in FIG. 2 was used to form the hydrogenated amorphous silicon carbide film. At this time, the placement of the substrates 2113 and the high-frequency power electrode 2114 and so on was the same as the exemplary experiment 1.

In the high-frequency power supplies, the third high-frequency power (not shown) was used in addition to the first high-frequency power supply 2116 and the second high-frequency power supply 2117 as in FIG. 2. With the first high-frequency power, the frequency f1 was 120 MHz, and the output was 400 W. With the second high-frequency power, the frequency f2 was 80 MHz, and the output was 600 W. These two powers were supplied to the high-frequency power electrode 2114 in the reaction container 2111 via the matching box 2115 as shown in FIG. 2.

On the other hand, with the third high-frequency power supplied from the third high-frequency power supply, the frequency f3 was 400 kHz, and the output was 300 W. This third high-frequency power was directly supplied to the high-frequency power electrode 2114 via no matching box.

The deposited film was formed on the conditions shown in Table 4 by using the apparatus thus constituted, and the hydrogenated amorphous silicon carbide film of which thickness is 1 μm was deposited on the substrate 2113. In addition, the hydrogenated amorphous silicon carbide was deposited on the substrate 2113 in the same constitution except for the third high-frequency power supply and on the same deposition conditions as above.

As for the obtained deposited film, the unevenness in the longer direction was evaluated by the same method as that of the exemplary experiment 2. It was found out, however, that there was no change depending on whether or not the third high-frequency power is applied, and both of the deposited films were high in uniformity without "unevenness".

On the other hand, in order to simply examine the hardness of the obtained films, a scratch test was conducted to compare the scraping degree when scratched with a diamond pen by a certain force, and it was found out that the film formed by applying the third high-frequency power was harder.

From the above, it was verified that even if the high-frequency power exceeding the frequency range in the present invention is added to the constitution capable of obtaining the effects of the present invention, it will have no influence on the effects of the present invention. It was verified, for instance, that it is no problem to add a further high-frequency power when forming the films in expectation of effects (such as improving the hardness of the deposited films) other than those of the present invention.

TABLE 4

| Gas type and flow rate | |
|---|---|
| $SiH_4$ (ml/min (normal)) | 5 |
| $CH_4$ (ml/min (normal)) | 30 |
| Substrate temperature (° C.) | 230 |
| Internal pressure (Pa) | 0.8 |
| 1st high-frequency power f1 (MHz) | 120 |

TABLE 4-continued

| | |
|---|---|
| 2nd high-frequency power f2 (MHz) | 80 |
| Total power (W) | 1000 |
| Power ratio P2/(P1 + P2) | 0.4 |
| 3rd high-frequency power f3 (kHz) | 400 |
| 3rd high-frequency power (W) | 300 |
| Film thickness (μm) | 1 |

Embodiments in which the present invention is applied will be described below.

(Embodiment 1)

In this embodiment, using an apparatus shown in FIG. 3, an electrophotographic photosensitive member with multi-layer structure was produced on a cylindrical substrate 1113 that was made of aluminum and had a diameter of 80 mm and a length of 358 mm.

The high-frequency electrode 1114 was a cylinder made of SUS (stainless steel), having a diameter of 20 mm, and the exterior of which was covered with an alumina pipe whose inside diameter and outer diameter were 21 mm and 24 mm respectively. This pipe was made to have such a structure that film peeling was prevented as much as possible by making its surface rough through applying blast-processing to the surface of the pipe made of alumina. In addition, four cylindrical substrates 1113 were arranged in equal intervals on the same circumference with the high-frequency electrode 1114 as a center, and film deposition was performed while rotating each substrate 1113 around a rotation axis 1121.

As a material gas supply tube 1118 used was an alumina pipe with an inside diameter of 10 mm and an outer diameter of 13 mm, and had such a structure that an end was sealed and a material gas was supplied from ten gas ports with a diameter of 1.2 mm that were provided on a side wall of the pipe. The installed locations of the material gas supply tubes 1118 were inside a layout circle made by the cylindrical substrate 1113 and the four material gas supply tubes 1118 were equidistantly placed on the same circumference with the high-frequency electrode 1114 as a center. In addition, each material gas supply tube 1118 was so arranged as to be located near the intermediate position of two adjacent cylindrical substrates 1113 in the circumferential direction of their arrangement circle. Furthermore, the blast processing was applied to the surface of the material gas supply tubes 1118 as well as the pipe covering the high-frequency electrode 1114 to make the surface rough.

Using the apparatus thus constituted, an electrophotographic photosensitive member comprising a charge injection blocking layer, a photoconductive layer, and a surface layer was produced under the conditions shown in Table 5.

TABLE 5

| | Charge injection blocking layer | Photoconductive layer | Surface layer |
|---|---|---|---|
| Gas type and flow rate | | | |
| SiH₄ (ml/min (normal)) | 150 | 150 | 10 |
| H₂ (ml/min (normal)) | 100 | 200 | |
| B₂H₆ (Concentration to SiH₄: ppm) | 1000 | 1 | |
| CH₄ (ml/min (normal)) | | | 30 |
| NO (ml/min (normal)) | 7 | | |
| Substrate temperature (° C.) | 230 | 230 | 230 |
| Internal pressure (Pa) | 0.7 | 0.7 | 0.7 |
| 1st high-frequency power f1 (MHz) | 80 | 80 | 80 |
| 2nd high-frequency power f2 (MHz) | 50 | 50 | 50 |
| Total power (W) | 500 | 1000 | 500 |
| Power ratio P2/(P1 + P2) | 0.4 | 0.4 | 0.4 |
| Film thickness (μm) | 3 | 25 | 0.6 |

An amorphous silicon photosensitive member obtained was set on a copying machine (Image Runner 5000, made by Canon Inc.) having been remodeled for tests, and the image density unevenness, the presence or absence of photomemory and the axial position dependence thereof were investigated.

At the beginning, the image density unevenness was evaluated. First of all, after adjusting the current of a main electrifier so that a dark portion potential at a developing apparatus position became constant, image exposure was adjusted by using a predetermined white paper of 0.1 or less reflection density as an original so that a light portion potential at the developing apparatus position became a predetermined value. Next, a half tone chart (part number: FY9-9042, made by Canon Inc.) was put on a manuscript stand, and evaluation was made on the reflection density in the entire area on a copied image.

In consequence, it turned out that there was no deterioration in the characteristics of the photosensitive member even at the "node" of a standing wave which was considered to be generated when the high frequency power being applied was only 80 MHz, and the image density unevenness was very small.

Next, photomemory was evaluated. First, after adjusting the main electrifier so that the dark portion potential at a developing apparatus position became a predetermined value, image exposure strength was adjusted so that the light portion potential at the time of using a predetermined white paper as an original became a predetermined value. In this state, evaluation was made on the copied image when a ghost test chart (part number: FY9-9040, made by Canon Inc.) on which black circles with 1.1 reflection density and 5-mm diameter were bonded at 10-mm intervals in the generatrix direction of the photosensitive member was put on a manuscript stand, and the half tone chart (part number: FY9-9042, made by Canon Inc.) was put on the ghost test chart, by measuring the difference between the reflection density of the black circles with the 5-mm diameter on the ghost test chart that were seen on the half tone copy and the reflection density of the half tone portion.

In consequence, it turned out that similarly to the image density unevenness, the increase of the photomemory caused by deterioration in the characteristics of the photosensitive member was not observed even at the position considered as a "node" area, but the memory was reduced as a whole.

In addition, no image defects were observed in the image obtained. The reason is considered to be that film peeling was controlled over the whole reactor chamber 1111.

As described above, it was confirmed that the photosensitive member produced in this embodiment was a photosensitive member with excellent image characteristics.

(Embodiment 2)

In this embodiment, an electrophotographic photosensitive member with multilayer structure was produced by using the apparatus shown in FIG. 3 on the cylindrical substrate 1113 that was made of aluminum and had a diameter of 80 mm and a length of 358 mm. In this case, four cylindrical substrates 1113 were arranged in equal intervals on the same circumference with the high-frequency electrode 1114 as a center, and film deposition was performed while rotating each substrate 1113 around a rotation axis 1121 as a center.

In addition, the installed locations of the material gas supply tubes 1118 were inside a layout circle made by the cylindrical substrate 1113 and the four material gas supply tubes 1118 were equidistantly placed on the same circumference with the high-frequency electrode 1114 as a center. Furthermore, each material gas supply tube 1118 was so arranged as to be located near the intermediate position of two adjacent cylindrical substrates 1113 in the circumferential direction of their arrangement circle. Moreover, dimensions, materials, etc., of the material gas supply tube 1118 were made to be the same as those in Embodiment 1.

In addition, using an assembly constituted as shown in FIG. 1B, two types of high-frequency power, 100 MHz and 60 MHz, were synthesized so that a power ratio (P2/(P1+P2)) was 0.2, and amplified with a broad band amplifier. The high frequency power thus produced was used in this embodiment. Furthermore, a matching box 1115 was adjusted in accordance with this constitution of the power supply.

Using the apparatus thus constituted, an electrophotographic photosensitive member comprising a charge injection blocking layer, a photoconductive layer, and a surface layer was produced under the conditions shown in Table 6.

TABLE 6

|  | Charge injection blocking layer | Photoconductive layer | Surface layer |
|---|---|---|---|
| Gas type and flow rate |  |  |  |
| $SiH_4$ (ml/min (normal)) | 100 | 200 | 5 |
| $H_2$ (ml/min (normal)) | 50 | 200 |  |
| $B_2H_6$ (Concentration to $SiH_4$: ppm) | 800 | 0.5 |  |
| $CH_4$ (ml/min (normal)) |  |  | 20 |
| NO (ml/min (normal)) | 5 |  |  |
| Substrate temperature (° C.) | 230 | 230 | 230 |
| Internal pressure (Pa) | 0.8 | 0.8 | 0.8 |
| 1st high-frequency power f1 (MHz) | 100 | 100 | 100 |
| 2nd high-frequency power f2 (MHz) | 60 | 60 | 60 |
| Total power (W) | 800 | 1500 | 600 |
| Power ratio P2/(P1 + P2) | 0.2 | 0.2 | 0.2 |
| Film thickness (μm) | 3 | 25 | 0.6 |

The photosensitive member obtained was evaluated in the same way as in Embodiment 1.

In consequence, it was confirmed that, according to this embodiment, it was possible to produce a photosensitive member that had no image density unevenness and good photomemory characteristics without distribution in the generatrix direction over the whole surface, and had good electrophotographic characteristics without image defects due to film peeling.

(Embodiment 3)

In this embodiment, with using an apparatus shown in FIG. 3, an electrophotographic photosensitive member with multilayer structure was produced on a cylindrical substrate 1113 that was made of aluminum and had a diameter of 30 mm and a length of 358 mm. In this case, ten cylindrical substrates 1113 were arranged in equal intervals on the same circumference with the high-frequency electrode 1114 as a center, and film deposition was performed while rotating each substrate 1113 around a rotation axis 1121.

In addition, the installed locations of the material gas supply tubes 1118 were inside a layout circle made by the cylindrical substrate 1113 and the five material gas supply tubes 1118 were equidistantly placed on the same circumference with the high-frequency electrode 1114 as a center. Furthermore, each material gas supply tube 1118 was so arranged as to be located near the intermediate position of two adjacent cylindrical substrates 1113 in the circumferential direction of their arrangement circle. Moreover, dimensions, materials, etc., of the material gas supply tube 1118 were made to be the same as those in Embodiment 1.

Using the apparatus thus constituted, an electrophotographic photosensitive member was produced under the conditions shown in Table 7.

TABLE 7

|  | Charge injection blocking layer | Photoconductive layer | Surface layer |
|---|---|---|---|
| Gas type and flow rate |  |  |  |
| $SiH_4$ (ml/min (normal)) | 200 | 200 | 10 |
| $H_2$ (ml/min (normal)) | 100 | 100 |  |
| $B_2H_6$ (Concentration to $SiH_4$: ppm) | 1000 | 0.8 |  |
| $CH_4$ (ml/min (normal)) |  |  | 30 |
| NO (ml/min (normal)) | 7 |  |  |
| Substrate temperature (° C.) | 230 | 250 | 230 |
| Internal pressure (Pa) | 0.5 | 0.5 | 0.5 |
| 1st high-frequency power f1 (MHz) | 120 | 120 | 120 |
| 2nd high-frequency power f2 (MHz) | 70 | 70 | 70 |
| Total power (W) | 600 | 1300 | 500 |
| Power ratio P2/(P1 + P2) | 0.3 | 0.3 | 0.3 |
| Film thickness (μm) | 3 | 20 | 0.6 |

The amorphous silicon photosensitive member that was obtained was set on a copying machine GP-405 (made by Canon Inc.) having been remodeled, and the image density unevenness, the presence or absence of photomemory and the axial position dependence thereof were investigated in the same method as in Embodiment 1.

In consequence, it was confirmed that according to this embodiment, it was possible to produce a photosensitive member that had no image density unevenness and good photomemory characteristics without distribution in the generatrix direction over the whole surface, and had good electrophotographic characteristics without image defects due to film peeling.

(Embodiment 4)

In this embodiment, using an apparatus shown in FIG. 3, an electrophotographic photosensitive member with multilayer structure was produced on a cylindrical substrate 1113 that was made of aluminum and had a diameter of 30 mm and a length of 358 mm. In this case, ten cylindrical substrates 1113 were arranged in equal intervals on the same circumference with the high-frequency electrode 1114 as a center, and film deposition was performed while rotating each substrate 1113 around a rotation axis 1121.

The installed locations of the material gas supply tubes 1118 were inside a layout circle made by the cylindrical substrate 1113 and the five material gas supply tubes 1118 were equidistantly placed on the same circumference with the high-frequency electrode 1114 as a center. In addition, each material gas supply tube 1118 was so arranged as to be located near the intermediate position of two adjacent cylindrical substrates 1113 in the circumferential direction of their arrangement circle. Moreover, dimensions, materials, etc., of the material gas supply tubes 1118 were made to be the same as those in Embodiment 1.

Furthermore, in this embodiment, as high-frequency power to be applied, a frequency of first high-frequency power, f1 was 90 MHz, a frequency of second high-frequency power f2 was 60 MHz, and a power ratio (P2/(P1+P2)) was set to be 0.5. Moreover, a third high-frequency power whose frequency was 30 MHz was applied so that a power ratio of P3/P1 is set to be 0.2, and hence, three types of high-frequency power whose frequencies mutually differed were used. In addition, a matching box 1115 was adjusted in accordance with this constitution of the power supply.

Using the apparatus thus constituted, an electrophotographic photosensitive member comprising a charge injection blocking layer, a first photoconductive layer, a second photoconductive layer and a surface layer was produced under the conditions shown in Table 8.

TABLE 8

| Gas type and flow rate | Charge injection blocking layer | 1st photo-conductive layer | 2nd photo-conductive layer | Surface layer |
|---|---|---|---|---|
| $SiH_4$ (ml/min (normal)) | 150 | 150 | 100 | 5 |
| $H_2$ (ml/min (normal)) | 300 | 300 | 300 | |
| $B_2H_4$ (Concentration to $SiH_4$: ppm) | 1000 | 1 | 0.1 | |
| $CH_4$ (ml/min (normal)) | | | | 40 |
| NO (ml/min (normal)) | 10 | | | |
| Substrate temperature (° C.) | 230 | 230 | 250 | 250 |
| Internal pressure (pa) | 0.7 | 0.7 | 0.7 | 0.7 |
| 1st high-frequency power f1 (MHz) | 90 | 90 | 90 | 90 |
| 2nd high-frequency power f2 (MHz) | 60 | 60 | 60 | 60 |
| 3rd high-frequency power f3 (MHz) | 30 | 30 | 30 | 30 |
| 1st high-frequency power P1 (W) | 300 | 500 | 200 | 200 |
| 2nd high-frequency power P2 (W) | 300 | 500 | 200 | 200 |
| 3rd high-frequency power P3 (W) | 60 | 100 | 40 | 40 |
| Total power (W) | 660 | 1100 | 440 | 440 |
| Film thickness ($\mu$m) | 3 | 12 | 5 | 0.6 |

Then, the image density unevenness, the presence or absence of photomemory and the axial position dependence thereof in the amorphous silicon photosensitive member obtained were investigated. First, the amorphous silicon photosensitive member obtained was set on the copying machine GP-405 (made by Canon Inc.) remodeled for experiments. At the time of copying, a 655-nm laser unit was used for image exposure, a 660-nm LED array was used for electricity removal light, and the process speed (relative speed to other members associated with the rotation of the photosensitive member) was made to be 265 nm/sec. In such a copying process, the image density unevenness, the presence of photomemory and the axial position dependence thereof were investigated in the same way as in Embodiment 1.

In consequence, it was confirmed that according to this embodiment, it was possible to produce a photosensitive member that had no image density unevenness and good photomemory characteristics without distribution in the generatrix direction over the whole surface, and had good electrophotographic characteristics without image defects due to film peeling.

(Embodiment 5)

Using the apparatus with the structure shown in FIG. 3, an electrophotographic photosensitive member comprising a charge injection blocking layer, a photoconductive layer, and a surface layer was produced on an aluminum cylinder with a diameter of 80 mm and a length of 358 mm under the conditions shown in Table 9 by supplying high-frequency power with two kinds of frequencies, i.e., 105 MHz (f1) and 50 MHz (f2), to the high-frequency electrode. In this case, when a photoconductive layer was formed, the total of two types of high-frequency power was made constant and the power ratio was changed during the layer formation. Thus, the electrophotographic photosensitive member for positive electrification was produced, which is referred to as embodiment 5-1.

TABLE 9

| Gas type and flow rate | Charge injection blocking layer | Photoconductive layer | Surface layer |
|---|---|---|---|
| $SiH_4$ (ml/min (normal)) | 200 | 300 | 20 |
| $H_2$ (ml/min (normal)) | | | |
| $B_2H_6$ (ppm) (Concentration to $SiH_4$) | 1500 | 1.5→ 0 | |
| NO (ml/min (normal)) | 10 | | |
| $CH_4$ (ml/min (normal)) | | | 40 |
| Pressure (Pa) | 1.3 | 1.3 | 1.8 |
| Total power (W) | 1000 | 1500 | 800 |
| Power ratio (P2/P1 + P2) | 0.4 | 0.4→0.45 | 0.4 |
| Substrate temperature (° C.) | 230 | 230 | 230 |
| Film thickness ($\mu$m) | 3 | 30 | 0.5 |

For comparison to this member, an electrophotographic photosensitive member for positive electrification was produced in the same way as in the embodiment 5-1 except that the ratio of two types of high-frequency power was fixed at 0.4 when the photoconductive layer was formed, which is referred to as embodiment 5-2.

The photosensitive member produced in this manner was installed in a copying machine IR-5000 (made by Canon Inc.), and evaluation was made on the characteristics. Evaluation items were "chargeability", "sensitivity", and "photomemory", and further, the unevenness of each of them in the generatrix direction was measured.

In that time, under the conditions of the process speed of 265 nm/sec, the amount of light in pre-exposure (LED with a wavelength of 660 nm) of 4 lx·s, and the current value of 1000 µA in the electrifier, the surface potential of the photosensitive member in a non-exposure state was measured with a potential sensor of a surface electrometer (Model No. 344 made by TREK) set at an electrifier position in the electrophotographic apparatus, which was regarded as chargeability.

Then, after adjusting the current value of the electrifier so that the surface potential in the non-exposure state was set to be 450 V (dark potential), image exposure (laser with a wavelength of 655 nm) was performed. Subsequently, the exposure quantity of an image exposure light source was adjusted so that the surface potential became 50 V (light potential), which was regarded as sensitivity.

In addition, the photosensitive member was so charged as to be the dark potential in the non-exposure state, and was exposed with such an exposure quantity that the photosensitive member once became the light potential, then brought into the non-exposure state again. In such procedures, the difference between the surface potential at the time the photosensitive member was made to be in the non-exposure state again, and the surface potential just before exposure, was regarded as photomemory.

The photosensitive member was measured for these items over the whole generatrix direction thereof, and the rate of the difference between the maximum and minimum values to an average was evaluated as "unevenness in the generatrix direction".

The evaluation result is shown in Table 10. In Table 10, on the basis of the result of the embodiment 5-2, "AA" denotes the improvement of 15% or more, "A" denotes the improvement of 5% to less than 15%, and "B" denotes the improvement of less than 5%.

the electrophotographic photosensitive member for positive electrification, which is referred to as embodiment 6-1.

TABLE 11

| Gas type and flow rate | Charge injection blocking layer | Photoconductive layer | Surface layer |
|---|---|---|---|
| $SiH_4$ (ml/min (normal)) | 200 | 200 | 20 |
| $H_2$ (ml/min (normal)) | 200 | 1000 | |
| $B_2H_6$ (ppm) (Concentration to $SiH_4$) | 1500 | 1 | |
| NO (ml/min (normal)) | 10 | | |
| $CH_4$ (ml/min (normal)) | | | 40 |
| Pressure (Pa) | 1.3 | 1.3 | 1.8 |
| Total power (W) | 800 | 1200 | 800 |
| Power ratio (P2/P1 + P2) | 0.4 | 0.3 | 0.5 |
| Substrate temperature (° C.) | 200 | 230 | 220 |
| Film thickness (µm) | 3 | 30 | 0.5 |

On the other hand, for comparison, an electrophotographic photosensitive member for positive electrification was produced under the same conditions as in the embodiment 6-1 except that the high-frequency power ratio was fixed at 0.3 in all the layers, which is referred to as an embodiment 6-2.

Evaluation was made in the same way as in Embodiment 5 for the photosensitive member produced in the above manner. The result obtained is shown in Table 10. In Table 10, on the basis of the result of the embodiment 6-2, "AA"

TABLE 10

| | | | Photo- | Unevenness in generatrix direction | | |
|---|---|---|---|---|---|---|
| | Chargeability | Sensitivity | memory | Chargeability | Sensitivity | Photomemory |
| Embodiment 5-1 | A | A | AA | AA | A | AA |
| Embodiment 6-1 | AA | A | A | AA | AA | A |
| Embodiment 8-1 | A | A | AA | AA | AA | A |
| Embodiment 9-1 | AA | AA | AA | AA | AA | AA |
| Embodiment 11-1 | AA | A | A | AA | AA | A |

As apparent from Table 10, the embodiment 5-1 is superior in all the items.

In addition, images formed in Embodiment 5 using the electrophotographic photosensitive member produced were excellent ones without photomemory, image density unevenness, image defects image smearing, etc.

(Embodiment 6)

Using the apparatus with the structure shown in FIG. 3, an electrophotographic photosensitive member comprising a charge injection blocking layer, a photoconductive layer, and a surface layer was produced on an aluminum cylinder with a diameter of 8 mm and a length of 358 mm under the conditions shown in Table 11 by supplying high-frequency power with two kinds of frequencies, i.e., 105 MHz (f1) and 60 MHz (f2), to the high-frequency electrode. In this case, layer formation was performed by changing the power ratio of two high frequencies for every layer, thereby producing denotes the improvement of 15% or more, "A" denotes the improvement of 5% to less than 15%, and "B" denotes the improvement of less than 5%.

As is apparent from Table 10, the difference between the embodiments 6-1 and 6-2 was seen in all the items. In addition, images formed using the electrophotographic photosensitive member produced in Embodiment 6 were excellent ones without photomemory, image density unevenness, image defect, image smearing, etc.

(Embodiment 7)

Using the apparatus with the structure shown in FIG. 3, an electrophotographic photosensitive member comprising a charge injection blocking layer, a photoconductive layer, and a surface layer was produced on an aluminum cylinder with a diameter of 80 mm and a length of 358 mm under the conditions shown in Table 12 by directly supplying third high-frequency power of 300 KHz (f3) from a power supply, not shown, without passing a matching box in addition to high-frequency power with two kinds of frequencies, i.e., 80 MHz (f1) and 50 MHz (f2), to the high-frequency electrode. In this case, layer formation was performed by changing the power ratio (P2/(P1+P2)) of the high-frequency power with the frequency of f1 to the high-frequency power with the frequency of f2 for every layer, and the electrophotographic photosensitive member for positive electrification was produced.

TABLE 12

|  | Charge injection blocking layer | Photoconductive layer | Surface layer |
|---|---|---|---|
| Gas type and flow rate |  |  |  |
| $SiH_4$ (ml/min (normal)) | 200 | 200 | 20 |
| $H_2$ (ml/min (normal)) | 200 | 1000 |  |
| $B_2H_6$ (ppm) (Concentration to $SiH_4$) | 1500 | 1 |  |
| NO (ml/min (normal)) | 10 |  |  |
| $CH_4$ (ml/min (normal)) |  |  | 40 |
| Pressure (Pa) | 1.3 | 1.3 | 1.8 |
| Power (P1 + P2) (W) | 800 | 1200 | 800 |
| Power ratio (P2/P1 + P2) | 0.4 | 0.3 | 0.5 |
| Power (P3) (W) | 200 | 200 | 200 |
| Substrate temperature (° C.) | 200 | 230 | 220 |
| Film thickness (μm) | 3 | 30 | 0.5 |

The same evaluation as in Embodiment 5 was performed for the photosensitive member produced in the above manner, and a good result, similar to that of Embodiment 1, was obtained. Images formed using the electrophotographic photosensitive member produced in this embodiment were excellent ones without photomemory, image density unevenness, image defect, image smearing, etc.

(Embodiment 8)

Using the apparatus with the structure shown in FIG. 3, an electrophotographic photosensitive member comprising a charge injection blocking layer, a photoconductive layer, and a surface layer was produced on an aluminum cylinder with a diameter of 10 mm and a length of 358 mm under the conditions shown in Table 13 by supplying high-frequency power with two kinds of frequencies, i.e., 200 MHz (f1) and 105 MHz (f2), to the high-frequency electrode. In this case, when a photoconductive layer was formed, the total power was made constant and the power ratio of the two types of high-frequency power was changed during layer formation, and further, the power ratio was changed for every layer. The layer formation thus performed produced the electrophotographic photosensitive member for positive electrification. This is referred to as embodiment 8-1.

TABLE 13

|  | Charge injection blocking layer | Photoconductive layer | | Surface layer |
|---|---|---|---|---|
|  |  | Layer region 1 | Layer region 2 |  |
| Gas type and flow rate |  |  |  |  |
| $SiH_4$ (ml/min (normal)) | 150 | 300 | 300 | 20 |
| $H_2$ (ml/min (normal)) | 300 | 1000 | 1000 |  |

TABLE 13-continued

|  | Charge injection blocking layer | Photoconductive layer | | Surface layer |
|---|---|---|---|---|
|  |  | Layer region 1 | Layer region 2 |  |
| $B_2H_6$ (Concentration to $SiH_4$) | 1500 | 1 | 0.3 |  |
| NO (ml/min (normal)) | 5 |  |  |  |
| $CH_4$ (ml/min (normal)) |  |  |  | 45 |
| Pressure (Pa) | 1.3 | 1.3 | 1.3 | 1.3 |
| Total power (W) | 800 | 1200 | 1200 | 1000 |
| Power ratio (P2/P1 + P2) | 0.45 | 0.3 | 0.4 | 0.6 |
| Substrate temperature (° C.) | 200 | 230 | 230 | 200 |
| Film thickness (μm) | 3 | 20 | 5 | 0.5 |

On the other hand, for comparison, an electrophotographic photosensitive member for positive electrification was produced under the same conditions as in the embodiment 8-1 except that the ratio of high-frequency power was fixed at 0.3 in all the layers, which is referred to as embodiment 8-2.

The photosensitive member produced in this manner was installed in a Canon copying machine GP-605 made by Canon Inc., and evaluation was made on the characteristics. In that time, under the conditions of the process speed of 300 mm/sec, the amount of light in pre-exposure (LED with a wavelength of 700 nm) of 4 lx·s, and the current value of 1000 μA in the electrifier, the surface potential of the photosensitive member in a non-exposure state was measured with a potential sensor of a surface electrometer (Model No. 344 made by TREK) set in an electrifier position in the electrophotographic apparatus, which was regarded as chargeability.

Then, after adjusting the current value of an electrifier so that the surface potential in a non-exposure state was set to 400 V (dark potential), image exposure (laser with a wavelength of 680 nm) was performed. Subsequently, the exposure quantity of an image exposure light source was adjusted so that the surface potential became 50 V (light potential), which was regarded as sensitivity.

In addition, the photosensitive member was so charged as to be the dark potential in the non-exposure state, and was exposed with such an exposure quantity that the photosensitive member once became the light potential, then brought into the non-exposure state again. In such procedures, the difference between the surface potential at the time when the photosensitive member was made to be in the non-exposure state again, and the surface potential just before exposure was regarded as photomemory.

The photosensitive member was measured for these items over the whole generatrix direction thereof, and the rate of the difference between the maximum and minimum values to an average was evaluated as "unevenness in the generatrix direction".

The evaluation result is shown in Table 10. In Table 10, on the basis of the result of the embodiment 5-2, "AA" denotes the improvement of 15% or more, "A" denotes the improvement of 5% to less than 15%, and "B" denotes the improvement of less than 5%.

As is apparent from Table 10, the difference between the embodiments 8-1 and 8-2 was seen in all the items.

In addition, images formed using the electrophotographic photosensitive member produced in Embodiment 8 were excellent ones without photomemory, image density unevenness, image defect, image smearing, etc.

(Embodiment 9)

Using the apparatus with the structure shown in FIG. 3, an electrophotographic photosensitive member comprising a charge injection blocking layer, a photoconductive layer, and a surface layer was produced on an aluminum cylinder with a diameter of 108 mm and a length of 358 mm under the conditions shown in Table 14 by supplying high-frequency power with two kind of frequencies, i.e., 105 MHz (f1) and 60 MHz (f2), to the high-frequency electrode. In this case, when a photoconductive layer was formed, the total power was made constant and the power ratio of the two types of high-frequency power during layer formation, and further, the power ratio was changed for every layer. The layer formation thus performed produced the electrophotographic photosensitive member for positive electrification. This is referred to as embodiment 9-1.

TABLE 14

| | Charge injection blocking layer | Photoconductive layer | | Surface layer |
|---|---|---|---|---|
| | | Layer region 1 | Layer region 2 | |
| Gas type and flow rate | | | | |
| SiH$_4$ (ml/min (normal)) | 150 | 300 | 100 | 100 → 20 → 20 |
| H$_2$ (ml/min (normal)) | 300 | 1000 | | |
| He (ml/min (normal)) | | | 1000 | |
| B$_2$H$_6$ (ppm) (Concentration to SiH$_4$) | 1500 | 1 | | |
| NO (ml/min (normal)) | 5 | | | |
| CH$_4$ (ml/min (normal)) | | | | 0 → 40 → 45 |
| Pressure (Pa) | 1.3 | 1.3 | 1.3 | 1.3 |
| Total power (W) | 800 | 1500 | 600 | 1000 |
| Power ratio (P2/P1 + P2) | 0.45 | 0.3 → 0.35 | 0.2 | 0.5 → 0.6 |
| Substrate temperature (° C.) | 210 | 220 | 200 | 200 |
| Film thickness (μm) | 3 | 25 | 3 | 0.5 |

On the other hand, for comparison, an electrophotographic photosensitive member for positive electrification was produced under the same conditions as in Embodiment 9-1 except that the ratio of high-frequency power was fixed at 0.3 in all the layers, which is referred to as embodiment 9-2.

The photosensitive member produced in this manner was installed in a copying machine GP-605 made by Canon Inc., and evaluation was made on the characteristics in the same way as in Embodiment 8.

The evaluation result is shown in Table 10. As apparent from Table 10, the difference between the embodiments 9-1 and 9-2 was seen in all the items.

In addition, images formed using the electrophotographic photosensitive member produced in Embodiment 9 were excellent ones without photomemory, image density unevenness, image defect, image smearing, etc.

(Embodiment 10)

Using the apparatus with the structure shown in FIG. 3, an electrophotographic photosensitive member comprising a charge injection blocking layer, a photoconductive layer, and a surface layer was produced on an aluminum cylinder with a diameter of 108 mm and a length of 358 mm under the conditions shown in Table 15 by supplying third high-frequency power of 500 KHz (f3) from a power supply, not shown, without passing a matching box in addition to high-frequency power with two kinds of frequencies, i.e., 80 MHz (f1) and 50 MHz (f2), to the high-frequency electrode. In this case, layer formation was performed by changing the power ratio (P2/(P1+P2)) of the high-frequency power with the frequency of 1 to the high-frequency power with the frequency of f2 for every layer region, and the electrophotographic photosensitive member for positive electrification was produced.

TABLE 15

| | Charge injection blocking layer | Photoconductive layer | | Surface layer |
|---|---|---|---|---|
| | | Layer region 1 | Layer region 2 | |
| Gas type and flow rate | | | | |
| SiH$_4$ (ml/min (normal)) | 150 | 300 | 300 | 20 |
| H$_2$ (ml/min (normal)) | 300 | 1000 | 1000 | |
| B$_2$H$_6$ (ppm) (Concentration to SiH$_4$) | 1500 | 1 | 0.3 | |
| NO (ml/min (normal)) | 5 | | | |
| CH$_4$ (ml/min (normal)) | | | | 45 |
| Pressure (Pa) | 1.3 | 1.3 | 1.3 | 1.3 |
| Power (P1 + P2) (W) | 800 | 1200 | 1200 | 1000 |
| Power ratio (P2/P1 + P2) | 0.45 | 0.3 | 0.4 | 0.6 |
| Power (P3) (W) | 200 | 300 | 200 | 150 |
| Substrate temperature (° C.) | 200 | 230 | 230 | 200 |
| Film thickness (μm) | 3 | 20 | 5 | 0.5 |

The same evaluation as in Embodiment 8 was performed for the photosensitive member produced in the above manner, and a good result similar to that of Embodiment 8 was obtained. In addition, images formed using the electrophotographic photosensitive member produced in this embodiment were excellent ones without photomemory, image density unevenness, image defect, image smearing, etc.

(Embodiment 11)

Using the apparatus with the structure shown in FIG. 3, an electrophotographic photosensitive member comprising a charge injection blocking layer, a photoconductive layer, and a surface layer was produced on an aluminum cylinder with a diameter of 30 mm and a length of 358 mm under the conditions shown in Table 16 by supplying high-frequency power with two kinds of frequencies, that is, 150 MHz (f1) and 60 MHz (f2) to the high-frequency electrode. In this case, layer formation was performed by changing the power ratio of the two types of high-frequency power every layer, and the electrophotographic photosensitive member for negative electrification was produced. This is referred to as embodiment 11-1.

TABLE 16

| | Charge injection blocking layer | Photo-conductive layer | Inter-mediate layer | Surface layer |
|---|---|---|---|---|
| Gas type and flow rate | | | | |
| SiH$_4$ (ml/min (normal)) | 200 | 300 | 100 | 100 → 20 → 20 |
| H$_2$ (ml/min (normal)) | 200 | 1000 | | |

TABLE 16-continued

| | Charge injection blocking layer | Photo- conductive layer | Inter- mediate layer | Surface layer |
|---|---|---|---|---|
| $B_2H_6$ (ppm) (Concentration to $SiH_4$) | | | 500 | |
| NO (ml/min (normal)) | 20 | | | |
| $CH_4$ (ml/min (normal)) | | | 100 | 0 → 40 → 45 |
| Pressure (Pa) | 1.3 | 1.3 | 1.5 | 1.5 |
| Total power (W) | 800 | 1200 | 800 | 600 |
| Power ratio (P2/P1 + P2) | 0.35 | 0.25 | 0.5 | 0.6 → 0.7 |
| Substrate temperature (° C.) | 230 | 230 | 200 | 200 |
| Film thickness (µm) | 3 | 20 | 0.2 | 0.5 |

On the other hand, for comparison, an electrophotographic photosensitive member for negative electrification was produced under the same conditions as those in the embodiment 11-1 except that the ratio of high-frequency power was fixed at 0.25 in all the layers. This is referred to as embodiment 11-2.

The photosensitive member produced in this manner was installed in a copying machine GP-215 made by Canon Inc., and evaluation was made on the characteristics.

In that time, under the conditions of the process speed of 200 mm/sec, the amount of light in pre-exposure (LED with a wavelength of 680 nm) of 4 lx·s, and the current value of 1000 µA in the electrifier, the surface potential of the photosensitive member in a non-exposure state was measured with a potential sensor of a surface electrometer (Model No. 344 made by TREK) set at an electrifier position in the electrophotographic apparatus, which was regarded as chargeability.

Then, after adjusting the current value of an electrifier so that the surface potential in a non-exposure state was set to be 400 V (dark potential), image exposure (laser with a wavelength of 660 nm) was performed. Subsequently, the exposure quantity of an image exposure light source was adjusted so that the surface potential might become 50 V (light potential), which was regarded as sensitivity.

In addition, the photosensitive member was so charged as to be the dark potential in the non-exposure state, and was exposed with such an exposure quantity that the photosensitive member once became the light potential, then brought into the non-exposure state again. In such procedures, the difference between the surface potential at the time when the photosensitive member was made to be in the non-exposure state again, and the surface potential just before exposure was regarded as photomemory.

The photosensitive member was measured for these items over the whole generatrix direction thereof, and the rate of the difference between the maximum and minimum values to an average was evaluated as "unevenness in the generatrix direction".

The evaluation result is shown in Table 10. In Table 10, on the basis of the result of the embodiment 11-2, "AA" denotes the improvement of 15% or more, "A" denotes the improvement of 5% to less than 15%, and "B" denotes the improvement of less than 5%.

As is apparent from Table 10, the difference between the embodiments 11-1 and 11-2 was seen in all the items.

In addition, images formed using the electrophotographic photosensitive member produced in the embodiment 11 were excellent ones without photomemory, image density unevenness, image defect, image smearing, etc.

(Embodiment 12)

A solar battery cell having the structure shown in FIG. 9 was produced by using the apparatus constituted as shown in FIG. 2.

First, a stainless steel plate of 300 L×300 W×0.5 D mm was soaked in the mixed liquid of acetone and isopropyl alcohol, was subjected to ultrasonic cleaning, and thereafter, was dried with hot air. Then, Ag of 0.8 µm thick having a texturing structure was deposited at the formation temperature of 300° C. by using a DC magnetron sputter method. Then a transparent conductive film of ZnO with a thickness of 4.0 µm, having the texturing structure, was deposited at the formation temperature of 300° C.

Next, using the apparatus with the structure shown in FIG. 2, a pin layer was produced in the ZnO transparent film under the condition shown in Table 17 by supplying high-frequency power with two kinds of frequencies, i.e., 105 MHz (f1) and 60 MHz (f2), to the high-frequency electrode 2114. In this case, layer formation was performed by changing the pow ratio of the above two kinds of high-frequency power every layer.

Next, ITO with a thickness of about 600 Å was deposited as a transparent electrode by a vacuum deposition method using resistance heating. Furthermore, Au with a thickness of about 8000 Å was deposited as a current collection electrode by a vacuum deposition method using an electron beam, producing a photovoltaic device. This is referred to as embodiment 12-1.

TABLE 17

| | n type layer | i type layer | p type layer |
|---|---|---|---|
| Gas type and flow rate | | | |
| $SiH_4$ (ml/min (normal)) | 30 | 100 | 10 |
| $H_2$ (ml/min (normal)) | 800 | 1600 | 200 |
| $PH_3/H_2$ (2%) (ml/min (normal)) | 10 | | |
| $B_2H_6/H_2$ (2%) (ml/min (normal)) | | | 2 |
| Pressure (Pa) | 5 | 3 | 5 |
| Total power (W) | 200 | 400 | 300 |
| Power ratio (P2/P1 + P2) | 0.4 | 0.3 | 0.45 |
| Substrate temperature (° C.) | 230 | 250 | 180 |
| Film thickness (µm) | 0.02 | 1 | 0.01 |

In addition, for comparison, a photovoltaic device was produced under the same conditions as those in the embodiment 12-1 except that the ratio of high-frequency power was fixed at 0.3 for every layer. This is referred to as embodiment 12-2.

A distribution state of the release voltage in the above-described substrate when radiating the light of AM1.5 was investigated for the photovoltaic device obtain Then, it was verified that in comparison with the embodiment 12-2 where the power ratio was fixed, the difference between the maximum and minimum values of the release voltage in the substrate surface was reduced by 10% by changing the power ratio for every layer according to the present invention.

(Embodiment 13)

Using the apparatus with the structure shown in FIG. 2, etching of a $SiO_2$ film formed on a Si wafer having a diameter of 200 mm placed on a substrate stage was conducted under the conditions shown in Table 18 by supplying high-frequency power with two kinds of frequencies, i.e., 105 MHz (f1) and 70 MHz (f2), to the high-frequency electrode 2114. The distribution state of etching rate was investigated over the whole substrate surface. Etching was performed while changing the power ratio of high-frequency power. This is referred to as embodiment 13-1.

TABLE 18

| Gas type and flow rate | |
|---|---|
| $C_4F_8$ (ml/min (normal)) | 100 |
| $O_2$ (ml/min (normal)) | 20 |
| Pressure (Pa) | 2 |
| Total power (W) | 800 |
| Power ratio (P2/P1 + P2) | 0.5 → 0.6 |

In addition, for comparison, similar etching was performed on the same conditions with the power ratio fixed at 0.5. This is referred to as embodiment 13-2.

In consequence, it was verified that in comparison with the case that the power ratio was fixed, etching was performed more uniformly in the substrate since the difference between the maximum and minimum etching rates within the substrate surface was reduced by 15% by changing the power ratio of high-frequency power during the etching.

(Embodiment 14-1)

An oscillation frequency f1 of a first high-frequency power supply 110A was made to be 105 MHz, an oscillation frequency f2 of a second high-frequency power supply 110B was made to be 50 MHz, and the two types of high-frequency power that were supplied therefrom were once synthesized after passing first and second matching circuits 112A and 112B, using the vacuum processing apparatus shown in FIGS. 10A and 10B. After that, by branching the high-frequency power in the six directions and applying them to six high-frequency electrodes 103 for plasma generation, a sample for the evaluation of film deposition rate was produced on the substrate 101 with a diameter of 80 mm and a length of 358 mm, which was made of an aluminum cylinder, using only the photoconductive layer formation conditions from among the conditions shown in Table 19.

In addition, similarly, an oscillation frequency f1 of a first high-frequency power supply 110A was made to be 105 MHz, an oscillation frequency f2 of a second high-frequency power supply 110B was made to be 50 MHz, and the two types of high-frequency power that were supplied therefrom were once synthesized after passing first and second matching circuits 112A and 112B, using the vacuum processing apparatus shown in FIGS. 10A and 10B. After that, by branching the high-frequency power in the six directions and applying them to six high-frequency electrodes 103 for plasma generation, an electrophotographic photosensitive member comprising a charge injection blocking layer, a photoconductive layer and a surface layer was produced on the substrate 101 with a diameter of 80 mm and a length of 358 mm, which was made of an aluminum cylinder, under the conditions shown in Table 19.

TABLE 19

| | Charge injection blocking layer | Photoconductive layer | Surface layer |
|---|---|---|---|
| Gas type and flow rate | | | |
| $SiH_4$ (ml/min (normal)) | 200 | 500 | 20 |
| $B_2H_6$ (ppm)* | 1000 | 1.5 | |

TABLE 19-continued

| | Charge injection blocking layer | Photoconductive layer | Surface layer |
|---|---|---|---|
| NO (ml/min (normal)) | 10 | | |
| $CH_4$ (ml/min (normal)) | | | 50 |
| Substrate temperature (° C.) | 240 | 240 | 240 |
| Pressure (Pa) | 1 | 1 | 1 |
| High-frequency power A (P1) (W) | 600 | 2400 | 420 |
| High-frequency power B (P2) (W) | 400 | 1600 | 280 |
| P2/(P1 + P2) | 0.4 | 0.4 | 0.4 |
| Layer thickness (μm) | 2 | 27 | 0.6 |

*To $SiH_4$ (Embodiment 14-2)

Figure 15A:
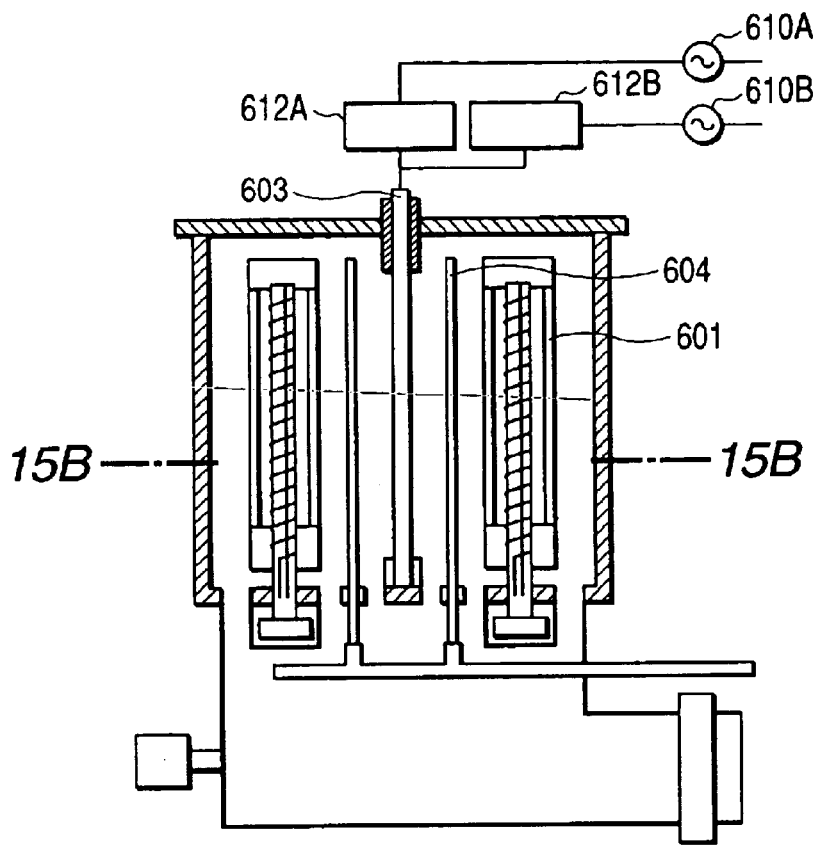
FIGS. 15A and 15B are schematic diagrams describing an apparatus of manufacturing the electrophotographic light-receiving members using the plasma CVD method that is the vacuum processing apparatus of the present invention. Moreover.
Figure 15B:
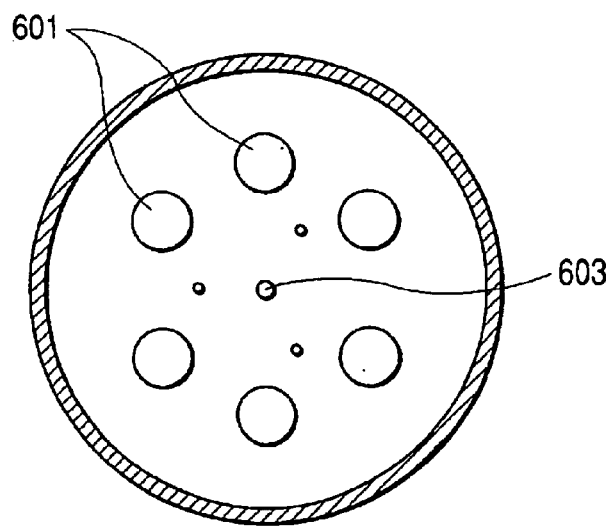

In this embodiment, instead of the vacuum processing apparatus that in shown in FIGS. 10A and 10B used in the embodiment 14-1, a vacuum processing apparatus where one high-frequency electrode 603 for plasma generation was arranged in the center of the reactor chamber 602 as shown in FIGS. 15A and 15B was used. An oscillation frequency of a first high-frequency power supply 610A was made to be 105 MHz, an oscillation frequency of a second high-frequency power supply 610B was made to be 50 MHz, and the two types of high-frequency power that were supplied were once synthesized after passing first and second matching circuits 612A and 612B. After that, by applying the high-frequency power to the high-frequency electrodes 603 for plasma generation, a sample for the evaluation of film deposition rate was produced on the substrate 601 with a diameter of 80 mm and a length of 358 mm which was made of an aluminum cylinder, using only the photoconductive layer formation conditions from among the conditions shown in Table 20.

In addition, similarly, an oscillation frequency of a first high-frequency power supply 610A was made to be 105 MHz, an oscillation frequency of a second high-frequency power supply 610B was made to be 50 MHz, and the two types of high-frequency power that were supplied were once synthesized after passing first and second matching circuits 612A and 612B, using the vacuum processing apparatus shown in FIGS. 15A and 15B. After that, by applying the high-frequency power to the high-frequency electrodes 603 for plasma generation, an electrophotographic photosensitive member comprising a charge injection blocking layer, a photoconductive layer and a surface layer was produced on the substrate 601 with a diameter of 80 mm and a length of 358 mm, which was made of an aluminum cylinder, under the conditions shown in Table 20.

TABLE 20

| | Charge injection blocking layer | Photoconductive layer | Surface layer |
|---|---|---|---|
| Gas type and flow rate | | | |
| $SiH_4$ (ml/min (normal)) | 200 | 300 | 20 |
| $B_2H_6$ (ppm)* | 1000 | 1.5 | |
| NO (ml/min (normal)) | 10 | | |
| $CH_4$ (ml/min (normal)) | | | 50 |
| Substrate temperature (° C.) | 240 | 240 | 240 |

TABLE 20-continued

|  | Charge injection blocking layer | Photoconductive layer | Surface layer |
|---|---|---|---|
| Pressure (Pa) | 1 | 1 | 1 |
| High-frequency power A (P1) (W) | 600 | 1080 | 420 |
| High-frequency power B (P2) (W) | 400 | 720 | 280 |
| P2/(P1 + P2) | 0.4 | 0.4 | 0.4 |
| Layer thickness (μm) | 2 | 27 | 0.6 |

*To $SiH_4$

The sample produced in the embodiment 14-1 and the sample produced by 14-2 were compared by evaluating the deposited film formation speed and electrophotographic characteristics at the time of photoconductive layer formation from two kinds of samples produced in the embodiments 14-1 and 14-2 with methods described below. The result is shown in Table 21.

TABLE 21

|  | Embodiment 14-1 |
|---|---|
| Deposited film formation speed | A |
| Chargeability | B |
| Sensitivity | B |
| Photomemory | B |

(Method of Evaluating Deposited Film Formation Speed)

In a center position of the sample for deposited film formation speed evaluation, which was produced, in a radial direction, eight points of film thickness were measured in equal intervals in the circumferential direction with an eddy current type thickness measuring instrument, type E111 of HELMUT FICHER. Then, an average of them was calculated, and the deposited film formation speed was obtained from deposited film formation time.

The result was classified into the following ranks by the comparison on the basis of the embodiment 14-2:

A: Improvement of 50% or more:

B: Improvement of 25% or more; and

C: Equal or less.

(Method for Evaluating Electrophotographic Characteristics)

Each electrophotographic photosensitive member produced was set in a copying machine NP-6750 (made by Canon Inc.) modified for this evaluation, and evaluation items were three items, that is, "chargeability", "sensitivity", and "photomemory", and each item was evaluated with the following specific evaluation method.

(Chargeability)

Dark portion potential in a developing apparatus position at the time of passing a predetermined current in the main charging device of a copying machine is defined as "chargeability" (however, it is defined as an average in a circle of a circumferential direction). Therefore, the larger the numeric value is, the better it is. The "chargeability" of the electrophotographic photosensitive member was measured over the whole region in the generatrix direction, and measurements were classified into the following ranks for the largest value by the comparing with reference to the embodiment 14-2.

A: Improvement of 10% or more;

B: Improvement of less than 10%; and

C: Equal or less.

(Sensitivity)

After adjusting a current value of a main charging device so that dark portion potential in a developing apparatus position may become a predetermined value, image exposure is performed. Subsequently, the exposure of an image exposure light source is adjusted so that the surface potential (light, portion potential) may become a predetermined value, and the exposure amount is made to be the "sensitivity" (here, the value is an average in a circle of circumferential direction). Therefore, the larger the numeric value is, the better it is. The "sensitivity" of the electrophotographic photosensitive member was measured over the whole region in the generatrix direction, and measurements were classified into the following ranks for the smallest value by the comparison on the basis of the embodiment 14-2.

A: Improvement of 10% or more;

B: Improvement of less than 10%; and

C: Equivalent or deterioration.

(Photomemory)

After adjusting a current value of a main charging device so that dark portion potential in a developing apparatus position may become a predetermined value, image exposure of light quantity being adjusted so that surface potential (light portion potential) in a developing apparatus position may become a predetermined value is performed. After that, the potential difference between the surface potential in the development position at the time of being charged in the same current value again and the surface potential in a previous non-exposure state (dark portion potential) is measured, and is made to be "photomemory" (here, the value is an average in a circle of circumferential direction). Therefore, the smaller the numeric value is, the better it is. The "photomemory" of the electrophotographic photosensitive member was measured over the whole region in the generatrix direction, and measurements were classified into the following ranks for the smallest value by the comparison on the basis of the embodiment 14-2.

A: Improvement of 10% or more;

B: Improvement of less than 10%; and

C: Equivalent or deterioration.

(Embodiment 14-3)

An oscillation frequency of a first high-frequency power supply 610A was made to be 105 MHz, an oscillation frequency of a second high-frequency power supply 610B was made to be 50 MHz, and the two types of high-frequency power that were supplied were synthesized after passing first and second matching circuits 612A and 612B, similarly to the embodiment 14-2, using the vacuum processing apparatus shown in FIGS. 15A and 15B. After that, by applying the high-frequency power to one high-frequency electrode 603 for plasma generation, an electrophotographic photosensitive member comprising a charge injection blocking layer, a photoconductive layer, and a surface layer was produced on the substrate 601 with a diameter of 80 mm and a length of 358 mm, which was made of an aluminum cylinder, under the conditions shown in Table 19 used in the embodiment 14-1.

The electrophotographic characteristics unevenness of the electrophotographic photosensitive members produced in the embodiments of 14-1 and 14-3 was evaluated with the following method, and the comparison of the sample produced in the embodiment 14-1 with the sample produced in the embodiment 14-3 was performed. The result is shown in Table 22.

TABLE 22

|  | Embodiment 14-1 |
| --- | --- |
| Chargeability unevenness in generatrix direction | A |
| Sensitivity unevenness in generatrix direction | A |
| Photomemory unevenness in generatrix direction | A |
| Image density unevenness in generatrix direction | A |

(Method of Evaluating Electrophotographic Characteristics Unevenness)

Each electrophotographic photosensitive member produced was set in a copying machine NP-6750 (made by Canon Inc.) modified for this evaluation, and evaluation items were four items, that is, "chargeability unevenness in generatrix direction", "sensitivity unevenness in generatrix direction", "photomemory unevenness in generatrix direction", and "image density unevenness in generatrix direction", and respective items were evaluated with the following specific evaluation methods.

(Chargeability Unevenness in Generatrix Direction)

The electrophotographic photosensitive member was measured for "chargeability" over the whole generatrix direction thereof, and the difference between the maximum and minimum values to an average was evaluated as "chargeability unevenness in the generatrix direction". Therefore, the smaller the numeric value is, the better it is. Measurements were classified into the following ranks respectively by the comparison on the basis of the embodiment 14-3.

A: Improvement of less than 50%;
B: Improvement between 50% or more and less than 75%;
C: Improvement of 75% or more; and
D: Deterioration.

(Sensitivity Unevenness in Generatrix Direction)

The electrophotographic photosensitive member was measured for "sensitivity" over the whole generatrix direction thereof, and the difference between the maximum and minimum values to an average was evaluated as "sensitivity unevenness in the generatrix direction". Therefore, the smaller the numeric value is, the better it is. Measurements were classified into the following ranks respectively by the comparison on the basis of the embodiment 14-3.

A: Improvement of less than 50%;
B: Improvement between 50% or more and less than 75%;
C: Improvement of 75% or more; and
D: Deterioration.

(Photomemory Unevenness in Generatrix Direction)

The electrophotographic photosensitive member was measured for "photomemory" over the whole generatrix direction thereof, and the difference between the maximum and minimum values to an average was evaluated as "photomemory unevenness in the generatrix direction". Therefore, the smaller the numeric value is, the better it is. Measurements were classified into the following ranks respectively by the comparison on the basis of the embodiment 14-3.

A: Improvement of less than 50%;
B: Improvement between 50% or more and less than 75%;
C: Improvement of 75% or more; and
D: Deterioration.

(Image Density Unevenness in Generatrix Direction)

After adjusting a current value of a main charging device so that a dark portion potential in a developing apparatus position might become a fixed value, using white paper with a reflection density of 0.1 or less as a manuscript, the image exposure quantity was adjusted so that the light portion potential in a developing apparatus position might become a predetermined value. Next, a half tone chart (part number: FY9-9042 made by Canon Inc.) was put on a manuscript stand, and an evaluation was performed using a difference between the maximum value and the minimum value for reflection density in the entire area on a copy image acquired at the time of copying. Therefore, the smaller the numerical value is, the better it is. Measurements were classified into the following ranks, respectively, by the comparison on the basis of the embodiment 14-3.

A: Improvement of less than 50%;
B: Improvement between 50% or more and less than 75%;
C: Improvement of 75% or more; and
D: Deterioration.

As is apparent from Tables 21 and 22, it becomes clear that it was possible to obtain a sufficient standing wave suppressing effect and to form an excellent deposited film uniformly at a high speed even if the high-frequency power to be applied was enlarged, by branching a plurality of high-frequency powers whose frequencies were different from each other after one synthesis thereof and applying them to a plurality of high-frequency electrodes for plasma generation, respectively. In addition, in this embodiment, the comparison of electrophotographic characteristics unevenness between the electrophotographic photosensitive members produced in the embodiments 14-1 and 14-2 was also performed at the same time. However, the results are not mentioned in Table 21 since they were almost equivalent, owing to a sufficient standing wave suppression effect.

(Embodiment 15)

In this embodiment, instead of the vacuum processing apparatus that is shown in FIGS. 10A and 10B and was used in the embodiment 14-1, as shown in FIGS. 11A and 11B, a vacuum processing apparatus where a variable impedance LC circuit was arranged as an auxiliary matching circuit 401 on a feeding point side of each high-frequency electrode for plasma generation was used. In addition, an oscillation frequency f1 of a first high-frequency power supply 110A was made to be 105 MHz, an oscillation frequency f2 of a second high-frequency power supply 110B was made to be 50 MHz, and the two types of high-frequency power that were supplied therefrom were synthesized once after passing first and second matching circuits 112A and 112B. After that, by branching the high-frequency power in the six directions and applying them to six high-frequency electrodes 103 for plasma generation through the auxiliary matching circuits 401, an electrophotographic photosensitive member comprising a charge injection blocking layer, a photoconductive layer, and a surface layer was produced on the substrate 101 with a diameter of 80 mm and a length of 358 mm, which was made of an aluminum cylinder, under the conditions shown in Table 19. Furthermore, the impedance of the LC circuit was suitably changed during deposited film formation.

(Embodiment 16)

An apparatus that was used in this embodiment was a vacuum processing apparatus where a 30-pF capacitor was arranged on a feeding point side of each high-frequency electrode for plasma generation in the vacuum processing apparatus of FIGS. 11A and 11B used in the embodiment 15 as an auxiliary matching circuit 401. In addition, an oscillation frequency f1 of a first high-frequency power supply 110A was made to be 105 MHz, an oscillation frequency f2 of a second high-frequency power supply 110B was made to be 105 MHz, and the two types of high-frequency power that were supplied therefrom were once synthesized after passing first and second matching circuits 112A and 112B. After that, by branching the high-frequency power in the six directions and applying them to six high-frequency electrodes 103 for plasma generation through the capacitor, an electrophotographic photosensitive member comprising a charge injection blocking layer, a photoconductive layer, and a surface layer was produced on the substrate 101 with a diameter of 80 mm and a length of 358 mm, which was made of an aluminum cylinder, under the conditions shown in Table 19.

The evaluation of electrophotographic characteristics unevenness of the electrophotographic photosensitive members produced in the embodiments of 15 and 16 was performed, and the comparison with them with the electrophotographic photosensitive member produced in the embodiment of 14-2 was performed. The result is shown in Table 23. As is apparent from Table 23, it became clear that it was possible to further enhance the uniformity of film quality since it was possible to obtain a more remarkable standing wave suppressing effect by arranging an auxiliary matching circuit on a feeding point side of each high-frequency electrode for plasma generation, branching high-frequency power that was once synthesized from a plurality of high-frequency powers, whose frequencies were different from each other, beforehand, and applying the high-frequency power to a high-frequency electrode after further passing each auxiliary matching circuit.

In addition, the deposited film formation speed and electrophotographic characteristics of the electrophotographic photosensitive members that were produced in embodiments 15 and 16 were equivalent to those of the electrophotographic photosensitive member produced in embodiment 14-1. Moreover, in the case of using a capacitor in embodiment 16, workability in assembling of an apparatus, and the like, was improved.

TABLE 23

|  | Embodiment 15 | Embodiment 16 |
| --- | --- | --- |
| Chargeability unevenness in generatrix direction | B | B |
| Sensitivity unevenness in generatrix direction | C | C |
| Photomemory unevenness in generatrix direction | C | C |
| Image density unevenness in generatrix direction | B | B |

In addition, using the above-described evaluation methods, ranks in comparison with embodiment 14-2 were as follows.

(Chargeability Unevenness in Generatrix Direction)
    A: Improvement of less than 50%;
    B: Improvement between 50% or more and less than 75%;
    C: Improvement of 75% or more; and
    D: Deterioration.
(Sensitivity Unevenness in Generatrix Direction)
    A: Improvement of less than 50%;
    B: Improvement between 50% or more and less than 75%;
    C: Improvement of 75% or more; and
    D: Deterioration.
(Photomemory Unevenness in Generatrix Direction)
    A: Improvement of less than 50%;
    B: Improvement between 50% or more and less than 75%;
    C: Improvement of 75% or more; and
    D: Deterioration.
(Image Density Unevenness in Generatrix Direction)
    A: Improvement of less than 50%;
    B: Improvement between 50% or more and less than 75%;
    C: Improvement of 75% or more; and
    D: Deterioration.

(Embodiment 17)

An apparatus that was used in this embodiment instead of the vacuum processing apparatus, which is shown in FIGS. 11A and 11B and was used in embodiment 16, was a vacuum processing apparatus where each high-frequency electrode for plasma generation was arranged outside an alumina ceramic dielectric member 501 and further, a 20-pF capacitor was arranged on a feeding point side of each high-frequency electrode for plasma generation as an auxiliary matching circuit 401, as shown in FIGS. 12A and 12B. In addition, an oscillation frequency f1 of a first high-frequency power supply 110A was made to be 105 MHz, an oscillation frequency f2 of a second high-frequency power supply 110B was made to be 50 MHz, and the two types of high-frequency power that were supplied therefrom were synthesized once after passing first and second matching circuits 112A and 112B. After that, by branching the high-frequency power in the six directions and applying them to six high-frequency electrodes 103 for plasma generation through the capacitor, an electrophotographic photosensitive member comprising a charge injection blocking layer, a photoconductive layer, and a surface layer was produced on the substrate 101 with a diameter of 80 mm and a length of 358 mm, which was made of an aluminum cylinder, under the conditions shown in Table 19.

The evaluation of the electrophotographic characteristic unevenness of the electrophotographic photosensitive member produced in embodiment 17 was performed, and the comparison of it with the electrophotographic photosensitive member produced in embodiment 14-2 was performed. The results are shown in Table 24. As is apparent from Table 24, it became clear that it was possible to further enhance the uniformity of film quality since it was possible to obtain a more remarkable standing wave suppressing effect by disposing the high-frequency electrodes for plasma generation outside the dielectric member. In addition, the deposited film formation speed and electrophotographic characteristics of the electrophotographic photosensitive member that were produced in embodiment 17 were equivalent to those of the electrophotographic photosensitive member produced in embodiment 14-1.

TABLE 24

|  | Embodiment 17 |
| --- | --- |
| Chargeability unevenness in generatrix direction | B |
| Sensitivity unevenness in generatrix direction | B |
| Photomemory generatrix direction unevenness | B |
| Image density unevenness in generatrix direction | B |

In addition, using the above-described evaluation methods, the comparison ranks were the same as those of embodiment 15.

(Embodiment 18)

An apparatus that was used in this embodiment instead of the vacuum processing apparatus, which is shown in FIGS.

12A and 12B and was used in embodiment 17, was a vacuum processing apparatus where each high-frequency electrode for plasma generation was disposed outside an alumina ceramic dielectric member 501, one material gas supply means 104 was disposed in the center of the dielectric member 501, and further, a 20-pF capacitor was disposed on a feeding point side of each high-frequency electrode for plasma generation as an auxiliary matching circuit 401, as shown in FIGS. 13A and 13B. In addition, an oscillation frequency f1 of a first high-frequency power supply 110A was made to be 105 MHz, an oscillation frequency f2 of a second high-frequency power supply 110B was made to be 70 MHz, and the two types of high-frequency power that were supplied therefrom were synthesized once after passing first and second matching circuits 112A and 112B After that, by branching the high-frequency power in the six directions and applying them to six high-frequency electrodes 103 for plasma generation through the capacitor, an electrophotographic photosensitive member comprising a charge injection blocking layer, a photoconductive layer, and a surface layer was produced on the substrate 101 with a diameter of 108 and a length of 358 mm, which was made of an aluminum cylinder, under the conditions shown in Table 25.

The electrophotographic photosensitive member produced was set in a Canon copying machine GP-605 modified for this evaluation, and evaluation of electrophotographic characteristics and electrophotographic characteristic unevenness was performed, and the evaluation result of all the electrophotographic photosensitive members was good.

Furthermore, a character manuscript was copied so that a clear image whose black density was thick was obtained. In addition, it was possible to obtain an image that was clear and faithful to a manuscript also in the copying of a photograph manuscript.

TABLE 25

|  | Charge injection blocking layer | Photoconductive layer | | | Surface layer |
|---|---|---|---|---|---|
|  |  | 1st layer region | Continuously changing region | 2nd layer region |  |
| Gas type and flow rate |  |  |  |  |  |
| SiH$_4$ (ml/min (normal)) | 250 | 550 | 550 → 200 | 200 | 200 → 30 → 20 |
| H$_2$ (ml/min (normal)) | 100 | 100 | 100 → 0 |  |  |
| B$_2$H$_6$ (ppm)* | 1000 | 1 | 1 → 0.3 | 0.3 |  |
| NO (ml/min (normal)) | 10 |  |  |  |  |
| CH$_4$ (ml/min (normal)) |  |  |  |  | 0 → 20 → 60 |
| Substrate temperature (° C.) | 240 | 250 | 250 | 250 | 250 |
| Pressure (pa) | 1 | 1 | 1 | 1 | 1 |
| High-frequency power A (P1) (W) | 600 | 2450 | 2450 → 840 | 840 | 840 → 350 |
| High-frequency power B (P2) (W) | 400 | 1050 | 1050 → 360 | 360 | 360 → 350 |
| P2/(P1 + P2) | 0.4 | 0.7 | 0.7 | 0.7 | 0.7 → 0.5 |
| Layer thickness (μm) | 2 | 23 | ** | 7 | 0.6 |

*To SiH$_4$
**Gas flow rates and high-frequency powers were continuously changed for 5 min.

(Embodiment 19)

Figure 14A:
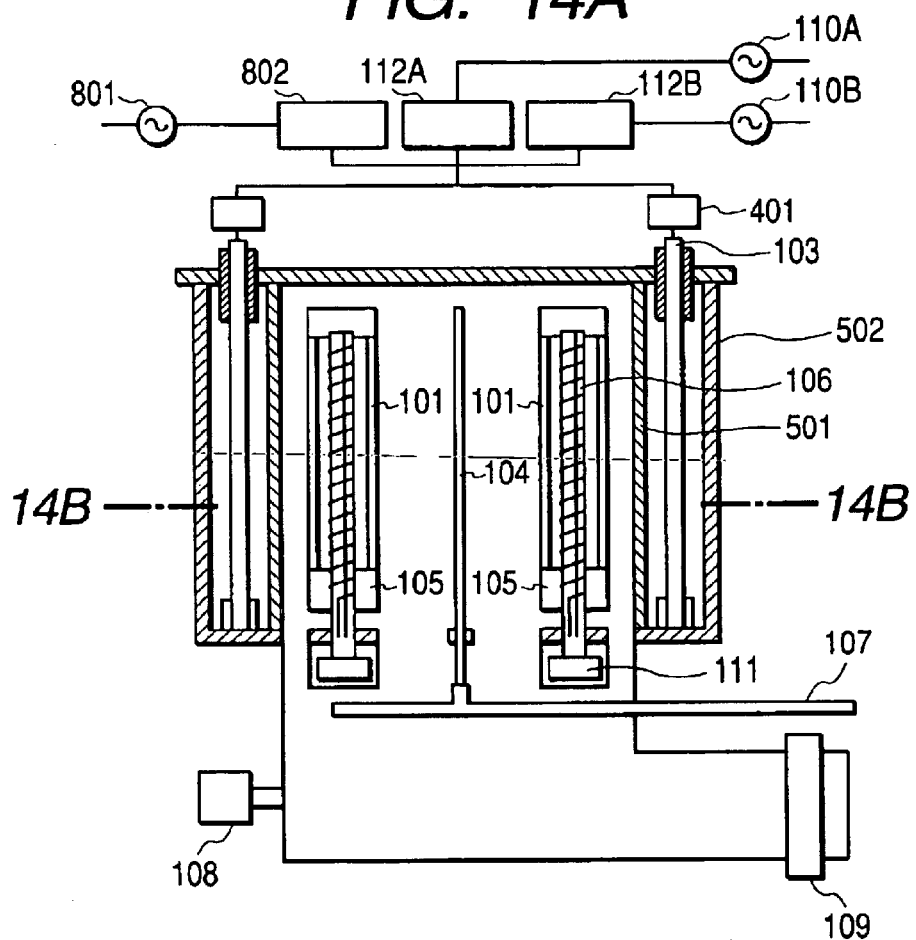
FIGS. 14A and 14B are schematic diagrams describing an apparatus for manufacturing the electrophotographic photosensitive members using the plasma CVD method that is a still further example of the vacuum processing apparatus of the present invention. Moreover.
Figure 14B:
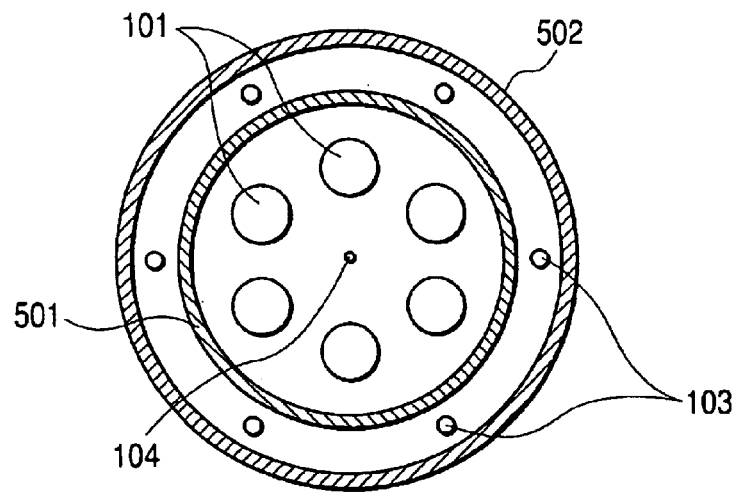

In this embodiment, instead of the vacuum processing apparatus that is shown in FIGS. 13A and 13B and was used in embodiment 18, as shown in FIGS. 14A and 14B, a vacuum processing apparatus where three of the high-frequency power supplies where disposed was used. In addition, an oscillation frequency f1 of a first high-frequency power supply 110A was made to be 105 MHz, an oscillation frequency f2 of a second high-frequency power supply 110B was made to be 105 MHz, an oscillation frequency f3 of a third high-frequency power supply 801 was made to be 400 kHz, and the three high-frequency powers that were supplied therefrom were synthesized once after passing first, second, and third matching circuits 112A, 112B, and 802. After that, by branching the high-frequency power in six directions and applying them to six high-frequency electrodes 103 for plasma generation, an electrophotographic photosensitive member comprising a charge injection blocking layer, a photoconductive layer, and a surface layer was produced on the substrate 101 with a diameter of 108 mm and a length of 358 mm, which was made of an aluminum cylinder, under the conditions shown in Table 26, instead of the conditions that are shown in Table 25 used in embodiment 18. In addition, in the conditions shown in Table 26, the frequencies of the top two high-frequency power values that become references are 105 MHz and 50 MHz.

The electrophotographic photosensitive member that was produced was set in a Canon copying machine GP-605 modified for this test, the evaluation of electrophotographic characteristics and electrophotographic characteristic unevenness was performed, and the evaluation result of all the electrophotographic photosensitive members was good.

Furthermore, a character manuscript was copied so that a clear image whose black density was thick was obtained. In addition, it was possible to obtain an image that was clear and faithful to a manuscript also in the copying of a photograph manuscript.

TABLE 26

|  | Charge injection blocking layer | Photoconductive layer | | | Surface layer |
|---|---|---|---|---|---|
|  |  | 1st layer region | Continuously changing region | 2nd layer region |  |
| Gas type and flow rate |  |  |  |  |  |
| SiH$_4$ (ml/min (normal)) | 250 | 550 | 550 → 200 | 200 | 200 → 30 → 20 |
| H$_2$ (ml/min (normal)) | 100 | 100 | 100 → 0 |  |  |
| B$_2$H$_6$ (ppm)* | 1000 | 1 | 1 → 0.3 | 0.3 |  |
| NO (ml/min (normal)) | 10 |  |  |  |  |
| CH$_4$ (ml/min (normal)) |  |  |  |  | 0 → 20 → 60 |
| Substrate temperature (° C.) | 240 | 250 | 250 | 250 | 250 |
| Pressure (pa) | 1 | 1 | 1 | 1 | 1 |
| High-frequency power A (P1) (W) | 600 | 2450 | 2450 → 840 | 840 | 840 → 350 |
| High-frequency power B (P2) (W) | 400 | 1050 | 1050 → 360 | 360 | 360 → 350 |
| High-frequency power C (W) | 100 | 100 | 100 | 100 | 100 |

TABLE 26-continued

|  | Photoconductive layer | | | | |
| --- | --- | --- | --- | --- | --- |
|  | Charge injection blocking layer | 1st layer region | Continuously changing region | 2nd layer region | Surface layer |
| P2/(P1 + P2) | 0.4 | 0.7 | 0.7 | 0.7 | 0.7 → 0.5 |
| Layer thickness (μm) | 2 | 23 | ** | 7 | 0.6 |

*To SiH$_4$
**Gas flow rates and high-frequency powers were continuously changed for 5 min.

What is claimed is:

1. A vacuum processing method comprising:
   placing an article to be processed in a reaction container and simultaneously supplying at least two high-frequency powers having mutually different frequencies to the same high-frequency electrode to generate plasma in the reaction container by the high-frequency powers introduced into the reaction container from the high-frequency electrode, thereby processing the article,
   wherein, when the frequency of one of the at least two high-frequency powers to be supplied to the high-frequency electrode is f1 and its power value is P1, and the frequency of the other high-frequency power is f2 and its power value is P2, the frequencies f1, f2 and the power values P1, P2 satisfy all the following three conditions (a) to (c):
   (a) 250 MHz≧f1>f2≧10 MHz;
   (b) the power values P1 and P2 are the highest and next highest power values of the power values held by the high-frequency powers within the above frequency range (a), of the high-frequency powers supplied to the high-frequency electrode; and
   (c) 0.9≧P2/(P1+P2)≧0.1.

2. The vacuum processing method according to claim 1, wherein the frequencies f1 and f2 satisfy the condition of:

250 MHz≧f1>f2≧30 MHz.

3. The vacuum processing method according to claim 1, wherein the power values P1 and P2 satisfy the condition of:

0.7≧P2/(P1+P2)≧0.2.

4. The vacuum processing method according to claim 1, wherein the frequencies f1, f2 and the power values P1, P2 satisfy the condition of:

f2/f1≧P2/(P1+P2).

5. The vacuum processing method according to claim 1, wherein the frequencies f1 and f2 satisfy the condition of:

0.9≧f2/f1>0.5.

6. The vacuum processing method according to claim 1, wherein the high-frequency electrode is formed in a rod-like shape.

7. The vacuum processing method according to claim 1, wherein the article to be processed is formed in a cylindrical or columnar shape.

8. The vacuum processing method according to claim 1, wherein a deposited film is formed on a surface of the article to be processed.

9. The vacuum processing method according to claim 1, wherein a deposited film for electrophotographic photosensitive members is formed on a surface of the article to be processed.

10. The vacuum processing method according to claim 1, further comprising changing a power ratio of the high-frequency powers while processing the article to be processed.

11. A method for manufacturing a semiconductor device comprising:
    placing a substrate in a reaction container, and simultaneously supplying at least two high-frequency powers having mutually different frequencies to the same high-frequency electrode to have plasma generated in the reaction container by the high-frequency powers introduced into the reaction container from the high-frequency electrode, thereby forming a plurality of layers on the substrate,
    wherein, when a frequency of one of the at least two high-frequency powers to be supplied to the high-frequency electrode is f1 and its power value is P1, and the frequency of the other high-frequency power is f2 and its power value is P2, the frequencies f1, f2 and the power values P1, P2 satisfy all the following three conditions (a) to (c):
    (a) 250 MHz≧f1>f2≧10 MHz;
    (b) the power values P1 and P2 are the highest and next highest power values of the power values held by the high-frequency powers within the above frequency range (a), of the high-frequency powers supplied to the high-frequency electrode; and
    (c) 0.9≧P2/(P1+P2)≧0.1.

12. The method for manufacturing a semiconductor device according to claim 11, wherein, while forming at least one of the plurality of layers, a power ratio of the plurality of high-frequency powers supplied to the high-frequency electrode is changed.

13. The method for manufacturing a semiconductor device according to claim 11, wherein, in forming at least two of the plurality of layers, a power ratio of the high-frequency powers supplied to the high-frequency electrode is changed between the case of forming one of the layers and the case of forming the other of the layers.

14. A vacuum processing method comprising:
    placing an article to be processed in a reaction container and simultaneously supplying at least two high-frequency powers having mutually different frequencies to each of a plurality of high-frequency electrodes to generate plasma in the reaction container by the high-frequency powers introduced into the reaction container from the high-frequency electrodes, thereby processing the article;
    a step of synthesizing the high-frequency powers to be supplied to the electrodes; and
    a step of branching the synthesized high-frequency powers to apply them to the electrodes, respectively.

15. The vacuum processing method according to claim 14, further comprising a step of supplying the high-frequency powers to be supplied to the electrodes from each high-frequency power supply and a step of synthesizing the high-frequency powers after going through a matching circuit.

16. The vacuum processing method according to claim 14, wherein, when a frequency of one of the at least two high-frequency powers to be supplied to the electrodes is f1 and its power value is P1, and the frequency of the other high-frequency power is f2 and its power value is P2, the frequencies f1, f2 and the power values P1, P2 satisfy all the following three conditions (a) to (c):

(a) $250 \text{ MHz} \geqq f1 > f2 \geqq 10 \text{ MHz}$;

(b) the power values P1 and P2 are the highest and next highest power values of the power values held by the high-frequency powers within the above frequency range (a), of the high-frequency powers supplied to the electrodes; and (c) $0.9 \geqq P2/(P1+P2) \geqq 0.1$.

17. The vacuum processing method according to claim 16, further comprising a step of changing a ratio of the power values of the high-frequency powers while processing the article to be processed.

18. The vacuum processing method according to claim 14, further comprising a step of disposing an auxiliary matching circuit on each feeding point side of the high-frequency electrodes to adjust an impedance by using the respective circuit.

19. The vacuum processing method according to claim 18, further comprising a step of providing a capacitor of an unchangeable capacity as the respective auxiliary matching circuit and a step of fixing the impedance by the capacitor.

20. The vacuum processing method according claim 14, further comprising a step of introducing material gases into the reaction container and decomposing the gases by the plasma so as to form a deposited film on the article to be processed.

21. The vacuum processing method according to claim 14, further comprising a step of introducing material gases into the reaction container and decomposing the gases by the plasma so as to form a deposited film on the article to be processed, thereby forming an electrophotographic photosensitive member.

* * * * *

UNITED STATES PATENT AND TRADEMARK OFFICE
CERTIFICATE OF CORRECTION

PATENT NO. : 6,861,373 B2
DATED : March 1, 2005
INVENTOR(S) : Makoto Aoki et al.

It is certified that error appears in the above-identified patent and that said Letters Patent is hereby corrected as shown below:

Title page,
Item [56], References Cited, FOREIGN PATENT DOCUMENTS,
"JP      2000223480 A  *        8/2000  ….. H01L/21/3065" should read
-- JP      2000-223480 A  *        8/2000  ….…H01L/21/3065 --.
OTHER PUBLICATIONS,
"H. Curtins, et al.," reference "α—Si:H" should read -- a-Si:H --.

Column 1,
Line 32, "an" should read -- can --.

Column 2,
Lines 10 and 41, "Pat." should read -- Patent --.

Column 4,
Line 6, "thinkable" should read -- sought --.
Line 17, "thinkable" should read -- possible --.

Column 8,
Line 62, "above described" should read -- above-described --.

Column 9,
Lines 18 and 48, "above described" should read -- above-described --.

Column 20,
Line 16, "$0.5 < f2/f1 \leq 0.9$" should read -- $0.5 < f2/f1 \leq 0.9$. --.

Column 24,
Line 3, "PF5," should read -- $PF_5$, --.
Line 6, "AsF5," should read -- $AsF_5$, --.
Line 57, "not" should read -- not be --.

Column 25,
Line 26, "changing,the" should read -- changing, the --.

Column 28,
Line 38, "pressures," should read -- pressure, --.

UNITED STATES PATENT AND TRADEMARK OFFICE
CERTIFICATE OF CORRECTION

PATENT NO. : 6,861,373 B2
DATED : March 1, 2005
INVENTOR(S) : Makoto Aoki et al.

It is certified that error appears in the above-identified patent and that said Letters Patent is hereby corrected as shown below:

Column 43,
Line 43, "$0.5 < fs/\mathbf{f1} \leq 0.9$" should read -- $0.5 < f\mathbf{2}/f\mathbf{1} \leq 0.9$. --.

Column 53,
Line 45, "10 mm" should read -- 108 mm --.

Signed and Sealed this

Ninth Day of August, 2005

JON W. DUDAS
*Director of the United States Patent and Trademark Office*